United States Patent  (10) Patent No.: US 7,692,963 B2
Shino et al.  (45) Date of Patent: Apr. 6, 2010

(54) SEMICONDUCTOR MEMORY DEVICE

(75) Inventors: Tomoaki Shino, Kawasaki (JP); Akihiro Nitayama, Yokohama (JP); Takeshi Hamamoto, Yokohama (JP); Hideaki Aochi, Kawasaki (JP); Takashi Ohsawa, Yokohama (JP); Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 348 days.

(21) Appl. No.: 11/934,337

(22) Filed: Nov. 2, 2007

(65) Prior Publication Data

US 2008/0239789 A1  Oct. 2, 2008

(30) Foreign Application Priority Data

Nov. 10, 2006  (JP) ............................. 2006-305672

(51) Int. Cl.
G11C 11/34 (2006.01)
(52) U.S. Cl. ............................. 365/185.05; 365/185.18; 365/185.24
(58) Field of Classification Search ............ 365/185.05, 365/185.18, 185.24
See application file for complete search history.

(56) References Cited

U.S. PATENT DOCUMENTS 6,538,916 B2  3/2003  Ohsawa
6,700,155 B1 *  3/2004  King et al. .................. 257/321
6,985,397 B2 *  1/2006  Tokui et al. ................. 365/226
7,129,539 B2 * 10/2006  Iwata et al. ................. 257/324

FOREIGN PATENT DOCUMENTS

JP  2002-246571  8/2002

OTHER PUBLICATIONS

Tomoaki Shino, et al., "Operation Voltage Dependence of Memory Cell Characteristics in Fully Depleted Floating-Body Cell", IEEE Transactions On Electron Devices, vol. 52, No. 10, Oct. 2005, pp. 2220-2226 and cover page.

* cited by examiner

Primary Examiner—Son Dinh
(74) Attorney, Agent, or Firm—Oblon, Spivak, McClelland, Maier & Neustadt, L.L.P.

(57) ABSTRACT

The disclosure concerns a semiconductor memory device comprising a semiconductor layer; a charge trap film in contact with a first surface of the semiconductor layer; a gate insulating film in contact with a second surface of the semiconductor layer, the second surface being opposite to the first surface; a back gate electrode in contact with the charge trap film; a gate electrode in contact with the gate insulating film; a source and a drain formed in the semiconductor layer; and a body region provided between the drain and the source, the body region being in an electrically floating state, wherein a threshold voltage or a drain current of a memory cell including the source, the drain, and the gate electrode is adjusted by changing number of majority carriers accumulated in the body region and a quantity of charges trapped into the charge trap film.

20 Claims, 36 Drawing Sheets

FIRST EMBODIMENT

100

FIRST EMBODIMENT

FIG. 20 SECOND EMBODIMENT

FIG. 35 THIRD EMBODIMENT

FIFTH EMBODIMENT

SEMICONDUCTOR MEMORY DEVICE

CROSS-REFERENCE TO RELATED APPLICATION

This application is based upon and claims the benefit of priority from the prior Japanese Patent Applications No. 2006-305672, filed on Nov. 10, 2006, the entire contents of which are incorporated herein by reference.

BACKGROUND OF THE INVENTION

1. Field of the Invention

The present invention relates to a semiconductor memory device.

2. Related Art

In recent years, there is known an FBC (Floating Body Cell) memory device as a semiconductor memory device expected to replace a conventional 1-Transistor 1-Capacitor DRAM. The FBC memory device is configured so that FET's (Field Effect Transistors) are formed each including a floating body (hereinafter, also "body region") provided on an SOI (Silicon On Insulator) substrate, and so that data "1" or "0" is stored according to the number of majority carriers accumulated in the body region.

If each FBC is an n-channel MISFET, for example, the FBC can store data according to the number of holes accumulated in its body region. If a state in which the number of holes accumulated in the body region is small corresponds to data "0" and a state in which the number of holes accumulated in the body region is large corresponds to data "1", then a body potential of each memory cell storing therein data "0" (hereinafter, also "0" cell) is relatively low, and that of each memory cell storing therein data "1" (hereinafter, also "1" cell) is relatively high. Due to this, a threshold voltage of the "0" cell is relatively high and a drain current thereof is relatively small. Further, a threshold voltage of the "1" cell is relatively low and a drain current thereof is relatively large. It is possible to discriminate whether a memory cell stores therein data "0" or "1" according to the drain current of the memory cell.

However, FBCs have a fluctuation in drain current. The fluctuation in the drain current among the FBCs mainly results from a fluctuation in threshold voltage among the FBCs. If the fluctuation in the drain current is large, defective (or fail) bit counts of the FBC memory device disadvantageously increase. This phenomenon is described in "Operation Voltage Dependence of Memory Cell Characteristics in Fully Depleted Floating Body Cell", by T. Shino, et al., IEEE Transaction On Electron Devices, Vol. 52, No. 10, October 2005, pp. 2220-2226. For example, a memory cell the threshold voltage of which is low when the memory cell store therein data "0" and a memory cell the threshold voltage of which is high when the memory cell stores therein data "1" are defective bits.

SUMMARY OF THE INVENTION

A semiconductor memory device according to an embodiment of the present invention comprises a semiconductor layer; a charge trap film in contact with a first surface of the semiconductor layer; a gate insulating film in contact with a second surface of the semiconductor layer, the second surface being opposite to the first surface; a back gate electrode in contact with the charge trap film; a gate electrode in contact with the gate insulating film; a source and a drain formed in the semiconductor layer; and a body region provided between the drain and the source, the body region being in an electrically floating state, wherein a threshold voltage or a drain current of a memory cell including the source, the drain, and the gate electrode is adjusted by changing number of majority carriers accumulated in the body region and a quantity of charges trapped into the charge trap film.

A method of driving a semiconductor memory device according to an embodiment of the present invention, the semiconductor memory device comprising a plurality of memory cells, each memory cell including a semiconductor layer; a charge trap film in contact with a first surface of the semiconductor layer; a gate insulating film in contact with a second surface of the semiconductor layer, the second surface being opposite to the first surface; a back gate electrode in contact with the charge trap film; a gate electrode in contact with the gate insulating film; a source and a drain formed in the semiconductor layer; and a body region provided between the drain and the source, the body region being in an electrically floating state, the method comprises trapping charges into the charge trap film of a memory cell by applying a voltage to the back gate electrode so that a signal of data depending on the number of majority carriers in the body is adjusted.

DETAILED DESCRIPTION OF THE INVENTION

Embodiments of the present invention will be explained below with reference to the accompanying drawings. The present invention is not limited to the embodiments.

First Embodiment

Memory cells of an FBC memory device according to a first embodiment of the present invention are MISFETs. The FBC memory device is a RAM storing dynamic data according to the number of majority carries accumulated in its body region of each memory cell. The FBC memory device according to the first embodiment includes a trimming function to adjust a threshold voltage of each memory cell to a desired value by trapping electric charges into a charge trap film provided under the body region of the memory cell.

Figure 1:
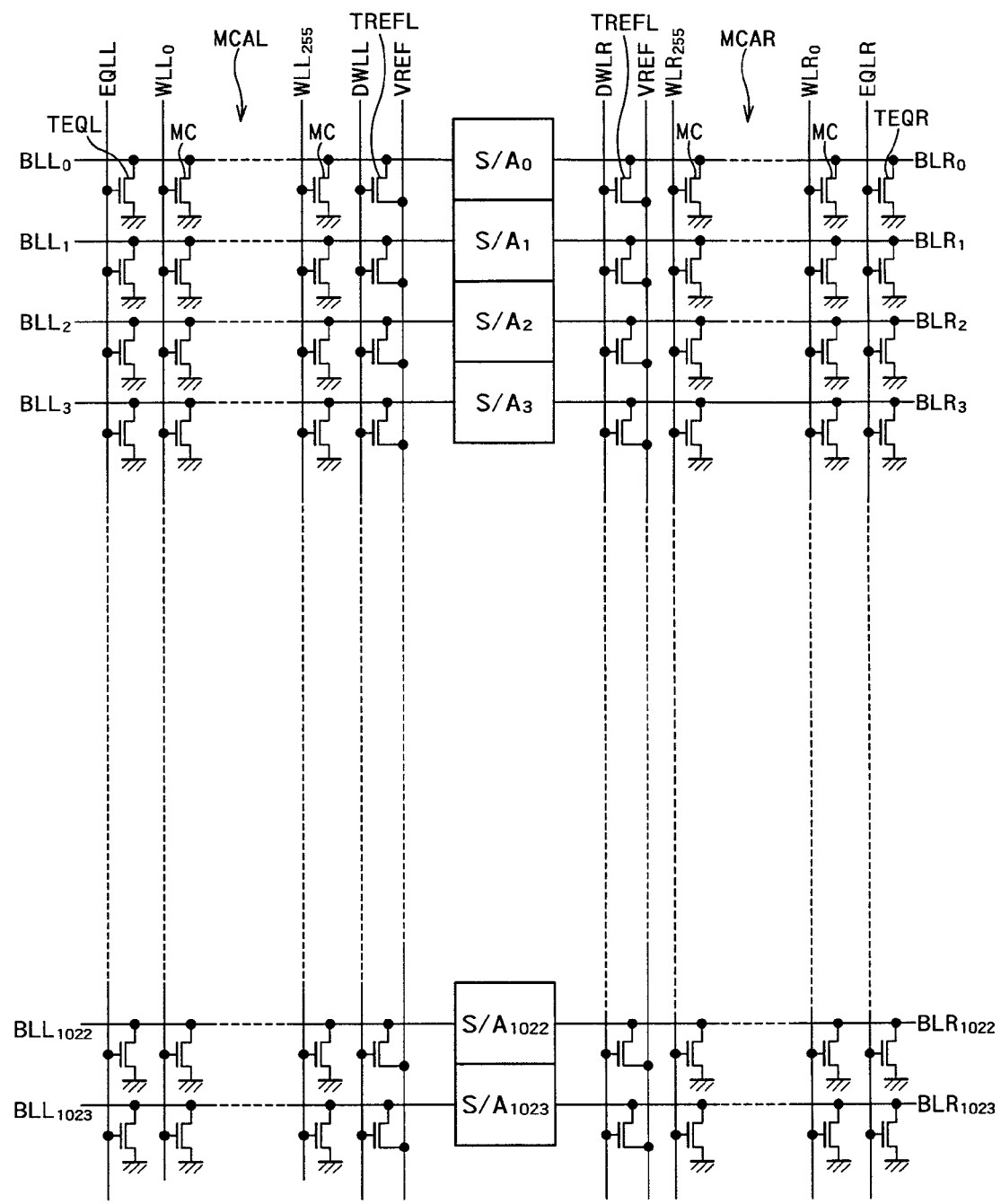
FIG. 1 is a circuit diagram showing a configuration of the FBC memory device according to the first embodiment of the present invention.

FIG. 1 is a circuit diagram showing a configuration of the FBC memory device according to the first embodiment of the present invention. The FBC memory device includes memory cells MCs, sense amplifiers S/Ai (where i is an integer) (hereinafter, also "S/As"), word lines WLLi and WLRi (hereinafter, also "WLs"), bit lines BLLi an BLRi (hereinafter, also "BLs"), equalizing lines EQLL and EQLR (hereinafter, also "EQLs"), equalizing transistors TEQLs and TEQRs (hereinafter, also "TEQs"), a reference potential line VREF, reference transistors TREFLs and TREFRs (hereinafter, also "TREFs"), and dummy word lines DWLL and DWLR (hereinafter, also "DWLs"). A reference potential is a voltage based on which data "1" or "0" is detected.

The memory cells MCs are arranged in a matrix and constitute memory cell arrays MCAL and MCAR (hereinafter, also "MCAs"). The word lines WLs extend in a row direction and are connected to gates of the memory cells MCs. In the first embodiment, 256 word lines WLs are provided on each of the left and right of the sense amplifiers S/As. In FIG. 1, the 256 word lines WLs on the left of the sense amplifiers S/As are denoted by WLL0 to WLL255, and those on the right of the sense amplifiers S/As are denoted by WLR0 to WLR255, respectively. The bit lines BLs extend in a column direction and are connected to drains of the memory cells MCs. In the first embodiment, 1024 bit lines BLs are provided on each of the left and right of the sense amplifiers S/As. In FIG. 1, the 1024 bit lines BLs on the left of the sense amplifiers S/As are denoted by BLL0 to BLL1023, and those on the right of the sense amplifiers S/As are denoted by BLR0 to BLR1023, respectively. The word lines WLs and the bit lines BLs are orthogonal to one another, and the memory cells MCs are provided at crosspoints between the word lines WLs and the bit lines BLs. Note that the row direction and the column direction can be changed with respect to each other.

The reference transistors TREFLs and TREFRs connect the reference potential line VREF to the bit lines BLs under control of the dummy word lines DWLL and DWLR, respectively. In the read operation, one of the left bit line and the right bit line connected to the same sense amplifier transmits a signal of data state of a memory cell, and the other one transmits the reference signal. The reference signal can be generated by averaging signals of a plurality of dummy cells. The equalizing transistors TEQLs and TEQRs equalize potentials of the respective bit lines BLs to a ground potential by connecting the bit lines BLs to a ground before a read or write operation.

Each of the sense amplifiers S/As includes, for example, a cross-coupled dynamic latch circuit, and can store therein data read from each memory cell MC or data received from a DQ buffer (not shown).

Figure 2:
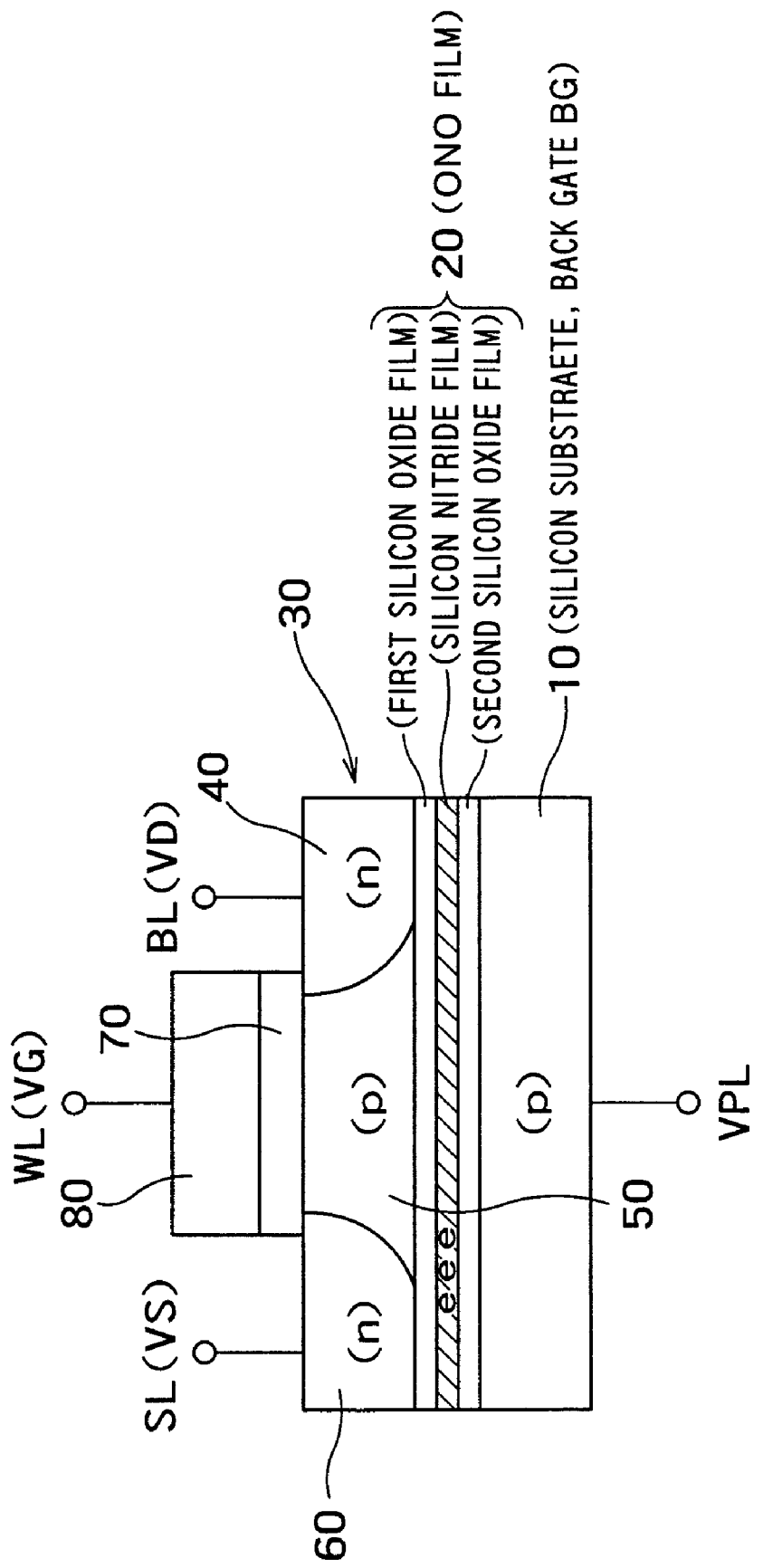
FIG. 2 is a cross-sectional view of each of the memory cells MCs according to the first embodiment.

FIG. 2 is a cross-sectional view of each of the memory cells MCs according to the first embodiment. Each memory cell MC is provided on an SOI substrate that includes a silicon substrate 10, an ONO film 20 serving as a charge trap film, and a silicon layer 30. The ONO film 20 is provided on the silicon substrate 10. A back surface of the silicon layer 30 forms a first surface, and the first surface is in contact with the ONO film 20. The ONO film 20 is in contact with a back gate BG formed on the silicon substrate 10. A source 60 and a drain 40 are provided in the silicon layer 30. A floating body (hereinafter, "body") 50 is provided between the source 60 and the drain 40 in the silicon layer 30. The body 50 is a semiconductor opposite in conductivity type to the source 60 and the drain 40. The drain 40 is connected to one bit line BL, a gate electrode 80 is connected to one word line WL, and the source 60 is connected to one source line SL. A gate insulating film 70 is provided on the body 50. The gate electrode 80 is provided on the gate insulating film 70. Namely, an upper surface of the silicon layer 30 forms a second surface, and the second surface is in contact with the gate insulating film 70. The gate insulating film 70 is in contact with the gate electrode 80.

In the first embodiment, the FBC memory device is consists of n-type FETs. The body 50 is in an electrically floating state by being surrounded by the gate insulating film 70, the source 60, the drain 40, the ONO film 20, the gate insulating film 70, and an STI (Shallow Trench Isolation) (not shown). The FBC memory cell can dynamically store therein data according to the number of majority carriers accumulated in the body 50.

It is assumed, for example, that each memory cell MC is an n-type MISFET. It is defined that a state in which the number of holes accumulated in the body 50 is large corresponds to data "1" and that a state in which the number of holes accumulated in the body 50 is small corresponds to data "0". In this case, to write data "1" to the memory cell MC, the memory cell MC is operated in a saturation region. For example, the word line WL is biased to 1.5 V, and the bit line BL is biased to 1.5 V. A voltage of the source 60 is set to a ground voltage GND (0 V). As a result, impact ionization occurs near the drain 40, thereby generating many pairs of electrons and holes. The electrons generated by the impact ionization flow into the drain 40 whereas the holes are accumulated in the low potential body 50. When a hole current generated by the impact ionization becomes equal to a forward current at a PN junction between the body 50 and the source 60, the voltage of the body 50 ("body voltage") turns its steady state value. The body voltage in the steady state is about 0.7 V.

On the other hand, to write data "0" to the memory cell MC, the voltage of the bit line BL connected to the memory cell MC is reduced to −1.5 V. This operation causes the PN junction between the body 50 and the drain 40 to be largely biased in a forward direction. The holes accumulated in the body 50 are discharged to the drain 40, and the data "0" is stored in the memory cell MC.

During the read operation for reading data from each memory cell MC, the word lines WL connected to each memory cell MC is activated. However, the voltage of the bit line BL connected to the memory cell MC is set low, as compared with the write operation for writing data "1" to the memory cell MC. For example, the potential of word line WL is set to 1.5 V and that of the bit line is set to 0.2 V. The memory cell MC is operated in a linear region. The memory cells MCs storing therein data "0" differ from the memory cells MCs storing therein data "1" in threshold voltage due to the difference in the number of holes accumulated in the body 50. By detecting the threshold voltage difference, it is discriminated whether the data is "1" or "0". The reason for setting the voltage of the bit line BL low during the read operation is as follows. If the voltage of the bit line BL is set high and the memory cell MC is biased to a saturation region, data "0" is changed to data "1" by the impact ionization when the data "0" is read from the memory cell MC.

The ONO film 20 functions to trap charges thereinto and to change a threshold voltage or a drain current of the memory cell MC. The trimming function is thereby realized. The trimming function is such that charges are trapped into the ONO film 20 of a memory cell MC storing therein certain data if the threshold voltage of the memory cell MC does not satisfy a specification. By doing so, the threshold voltage of the memory cell MC is adjusted to satisfy the specification.

Figure 3:
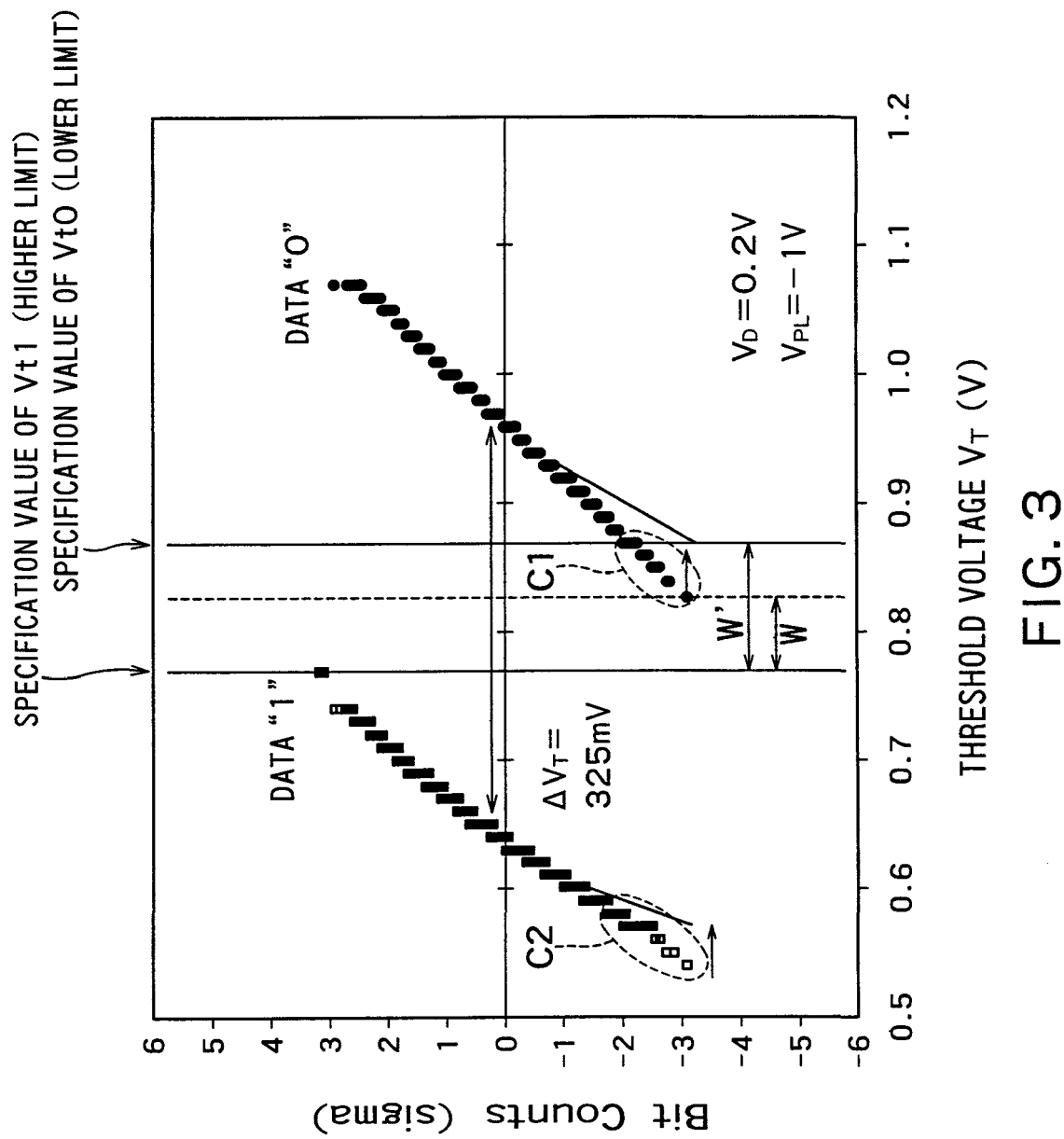
FIG. 3 is a graph conceptually showing the trimming function with respect to threshold voltages of "0" cells.

FIG. 3 is a graph conceptually showing the trimming function with respect to threshold voltages of "0" cells. A thickness of the body 50 of each of the memory cells MCs used herein is about 55 nm, a length of a front gate thereof is about 0.15 μm, a thickness of the (front) gate insulating film 70 thereof is about 6 nm, and a thickness of the ONO film 20 thereof is about 25 nm.

If a threshold voltage $Vt0$ of a "0" cell is lower than a specification value, electrons are trapped into the ONO film 20 of the "0" cell. The memory cells MCs within a broken-line circle C1 shown in FIG. 3 are trimming target "0" cells. By executing the trimming function, the threshold voltage $Vt0$ of each of the trimming target "0" cells is raised and adjusted to fall within the specification. To raise the threshold voltage $Vt0$ of each of the "0" cells, it is preferable to trap electrons into the ONO film 20 proximate to the junction between the source 60 and the body 50 (see FIGS. 33 and 34).

A threshold width W indicates a width between a maximum value of the threshold voltage $Vt1$ and a minimum value of the threshold voltage $Vt0$ before trimming. A threshold width W' indicates a width between the maximum value of the threshold voltage $Vt1$ and the minimum value of the threshold voltage $Vt0$ after trimming. As evident from FIG. 3, the width W' is larger than the width W. As a result, defective bit counts of the FBC memory device decrease.

Generally, the threshold voltages $Vt0$ and $Vt1$ correlate to each other. If data "1" is stored in a memory cell MC the threshold voltage $Vt0$ of which is low, the threshold voltage $Vt1$ of the memory cell MC is low. If data "1" is stored in a memory cell MC the threshold voltage $Vt0$ of which is high, the threshold voltage $Vt1$ of the memory cell MC is high. Accordingly, even if the memory cells MCs the threshold voltage $Vt0$ of each of which are lower than the specification value (lower limit) are trimmed, the threshold voltage $Vt1$ of each of these memory cells MCs hardly exceeds the specification value (upper limit). Namely, as indicated by a broken-line circle C2 shown in FIG. 3, if the memory cells MCs the threshold voltage $Vt0$ of each of which is lower than the specification value are trimmed, the part of the threshold voltage $Vt1$ away from the standard value rises. Due to this, there is a low probability that the threshold voltage $Vt1$ exceeds the specification value by the trimming.

Figure 4:
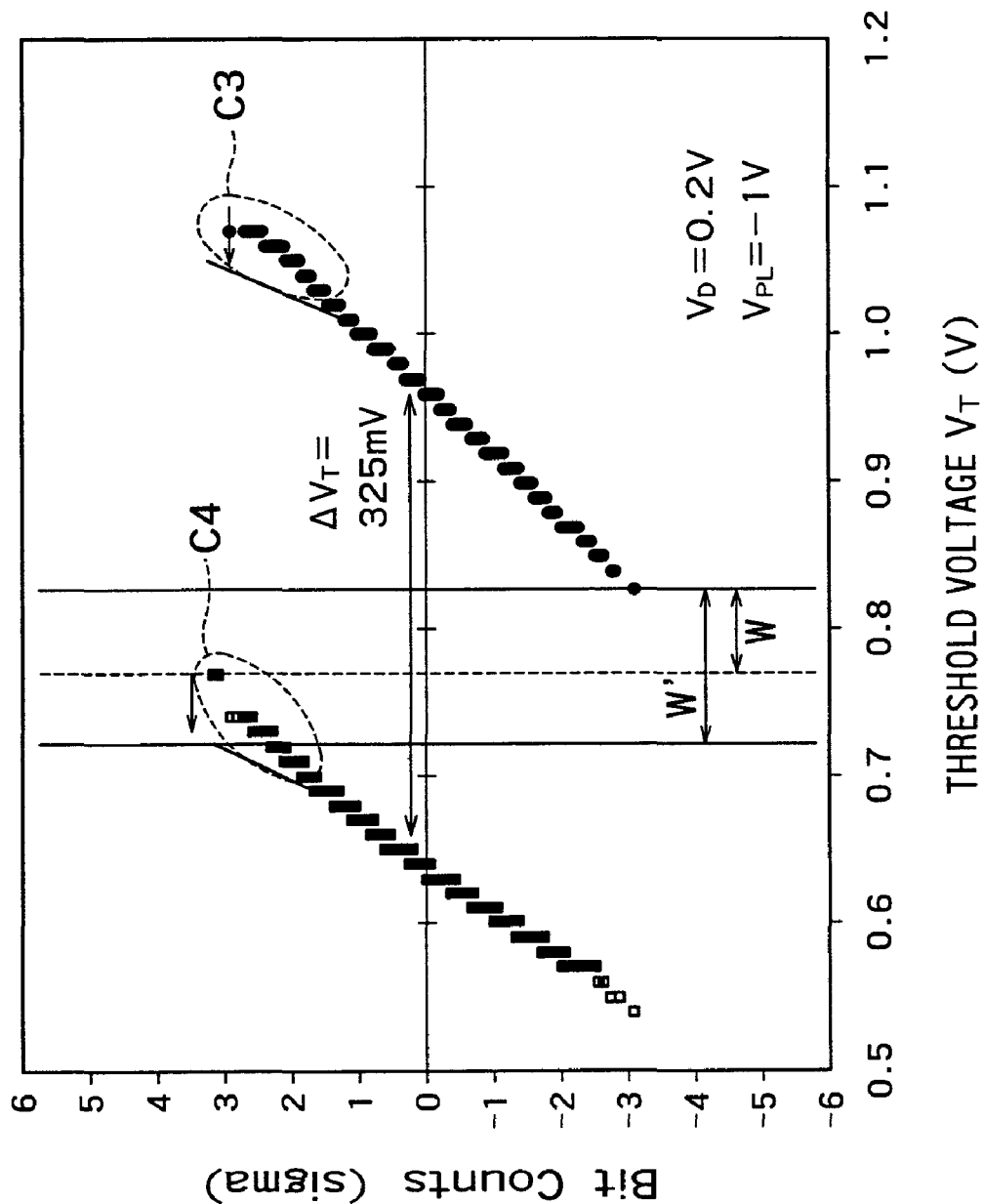
FIG. 4 is a graph conceptually showing the trimming function with respect to the threshold voltages of the "1" cells.

FIG. 4 is a graph conceptually showing the trimming function with respect to the threshold voltages of the "1" cells. The memory cells MCs used herein can be similar in configuration to those described with reference to FIG. 3. If the threshold voltage $Vt1$ of a "1" cell is higher than the specification, holes are trapped into the ONO film 20 of the "1" cell. The memory cells MCs within a broken-line circle C4 shown in FIG. 4 are trimming target "1" cells. By executing the trimming function, the threshold voltage $Vt1$ of each of the trimming target "1" cells is reduced and adjusted to fall within the specification. To reduce the threshold voltage $Vt1$ of each of the "1" cells, it is preferable to trap holes into the ONO film 20 proximate to the junction between the drain 40 and the body 50 (see FIGS. 33 and 34).

A threshold width W shown in FIG. 4 indicates a width between a maximum value of the threshold voltage $Vt1$ and a minimum value of the threshold voltage $Vt0$ before trimming. A threshold width W' shown in FIG. 4 indicates a width between the maximum value of the threshold voltage $Vt1$ and the minimum value of the threshold voltage $Vt0$ after trimming. As evident from FIG. 4, the width W' is larger than the width W. As a result, defective bit counts of the FBC memory device decrease.

As indicated by a broken-line circle C3 shown in FIG. 4, if data "0" is stored in each of the trimmed memory cells MCs, the threshold voltage $Vt0$ of the memory cell MC corresponds to a part away from the specification value. Due to this, there is a low probability that the threshold voltage $Vt0$ exceeds the specification value by the trimming.

Figure 5:
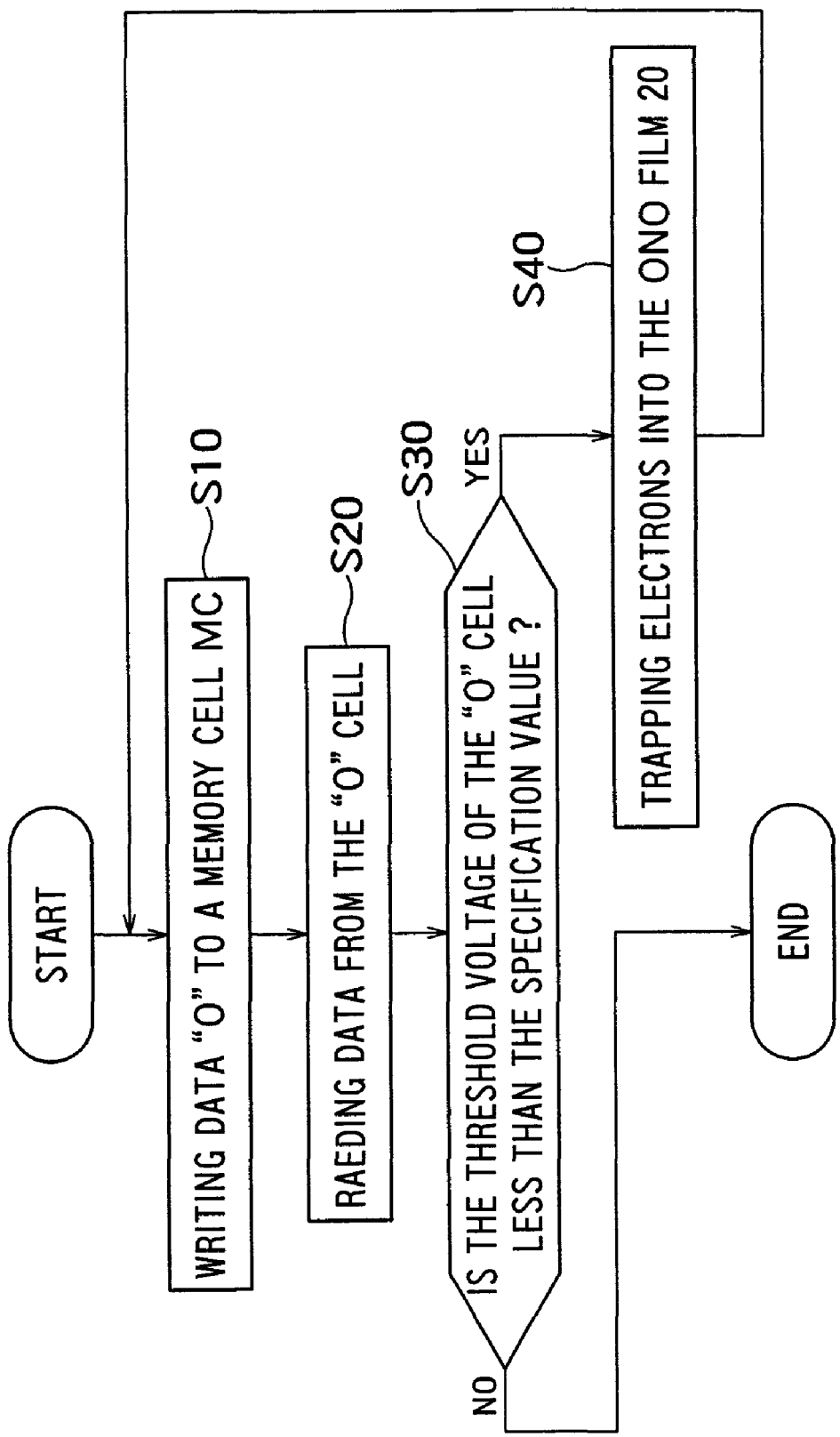
FIG. 5 is a flowchart showing the trimming function according to the first embodiment.

FIG. 5 is a flowchart showing the trimming function according to the first embodiment. Each of the sense amplifiers S/As writes data "0" to an inspection target memory cell MC (S10). The sense amplifier S/A reads a signal of data from the "0" cell (S20). The sense amplifier S/A detects the threshold voltage of the "0" cell as a signal and compares the threshold voltage with the specification value (S30). The specification value is transmitted to the sense amplifier S/A via the reference potential line VREF shown in FIG. 1. If the comparison indicates that the threshold voltage of the "0" cell is higher than the specification value, the inspection target memory cell MC is regarded as a non-defective memory cell MC and the next memory cell MC is then inspected and verified. If the comparison shows that the threshold voltage of the "0" cell is lower than the specification value, the inspection target memory cell MC is regarded as a defective memory cell MC. Therefore, the sense amplifier S/A traps electrons into the ONO film 20 of the defective memory cell MC (S40). After trapping, the sense amplifier S/A repeats the steps S10 to S30 and confirms that the threshold voltage of the "0" cell is higher than the specification value. If the quantity of charges to be trapped is insufficient, the threshold voltage of the "0" cell is lower than the specification value at the step S30. In this case, the sense amplifier S/A traps electrons into the ONO film 20 of the "0" cell again at the step S40. A series of these steps is executed for all the memory cells MCs in the respective memory cell arrays MCAs. The trimming can be performed to the threshold voltage of dummy cells so that a reference voltage generated by the dummy cells is appropriately adjusted. Thus, the number of dummy cells can be reduced and the number of intrinsic memory cells can be increased.

While the trimming function with respect to the "0" cells has been described with reference to FIG. 5, the trimming function can be similarly executed with respect to the "1" cells. If a "1" cell is to be trimmed, the sense amplifier S/A writes data "1" to an inspection target memory cell MC (S10). If the threshold voltage of the "1" cell is higher than the specification value, the sense amplifier S/A traps holes into the ONO film 20 of the "1" cell (S40). Needless to say, the trimming function can be sequentially executed with respect to defective memory cells including both the "0" cells and the "1" cells.

Each of the sense amplifiers S/A can detect either the threshold voltage or the drain current of each memory cell MC as a signal. However, a cause of a fluctuation in drain current among the memory cells MCs is a combination of a fluctuation in threshold voltage and a fluctuation in parasitic resistance among the memory cells MCs. It is, therefore, preferable to detect the drain current of each memory cell MC rather than to detect the threshold voltage of each memory cell MC when the trimming function is executed. In the first embodiment, the threshold voltage is compared with the specification value. Alternatively, the drain current can be compared with the specification value. In this alternative, the lower specification limit of the threshold voltage corresponds to the upper specification limit of the drain current, and the upper specification limit of the threshold voltage corresponds to the lower specification limit of the drain current.

If charges are trapped into the ONO film 20 of each memory cell MC without inspection processes, the fluctuation in threshold voltage among the memory cells MCs may possibly increase depending on the density and distribution of trapped charges. It is not preferable, therefore, to inject charges into all the memory cells MCs without performing an inspection operation because the fluctuation in threshold voltage increases. The inspection operation is an operation for determining whether the threshold voltage satisfies the specification by comparing the threshold voltage with the specification value. Generally, the number of the memory cells MCs that do not satisfy the specification is quite small among all the memory cells MCs. Therefore, in the first embodiment, charge injection is executed while performing the inspection operation. It is thereby possible to decrease the defective bit counts.

In the first embodiment, an appropriate amount of charges can be injected into the ONO film 20 of each memory cell MC based on the inspection result. For example, if a "1" cell is to be trimmed, a specification value is set lower than the minimum or lowest value of the threshold voltage of the "1" cell. If the difference between the threshold voltage of the "1" cell and the specification value is large, many holes are injected into the ONO film 20 of the "1" cell. If the difference is small, small quantities of holes are injected into the ONO film 20 of the "1" cell. In other words, holes are injected into the ONO film 20 by the quantity according to the difference between the threshold voltage of the "1" cell and the specification value. Since the threshold voltages of all the "1" cells are higher than the specification value, holes are injected into the ONO films 20 of all the memory cells. The holes are injected based on the inspection result. As a result, the fluctuation in threshold voltage among the memory cells MCs is reduced. Furthermore, with this method, an average value of the threshold voltages of all the memory cells MCs can be shifted and set to an arbitrary value. For example, by injecting holes into the ONO films 20 as stated above, it is possible to reduce the average threshold voltage of the "1" cells and that of the "0" cells simultaneously. As a result, larger drain current flows in the memory cells MCs during the write operation, so that a speed of writing data "1" to the memory cells MCs is accelerated due to increased impact ionization. Further, the drain current difference increases between the "0" cells and the "1" cells during the data read operation due to increased threshold voltage difference (as will be explained referring to FIG. 31-34). Alternatively, voltage swings of the word lines WLs and the bit lines BLs can be reduced while keeping the speed of writing the data "1" or the drain current difference during the data read operation constant. If the voltage swings of the word lines WLs and the bit lines BLs are reduced, power consumption can be reduced.

Figure 6:
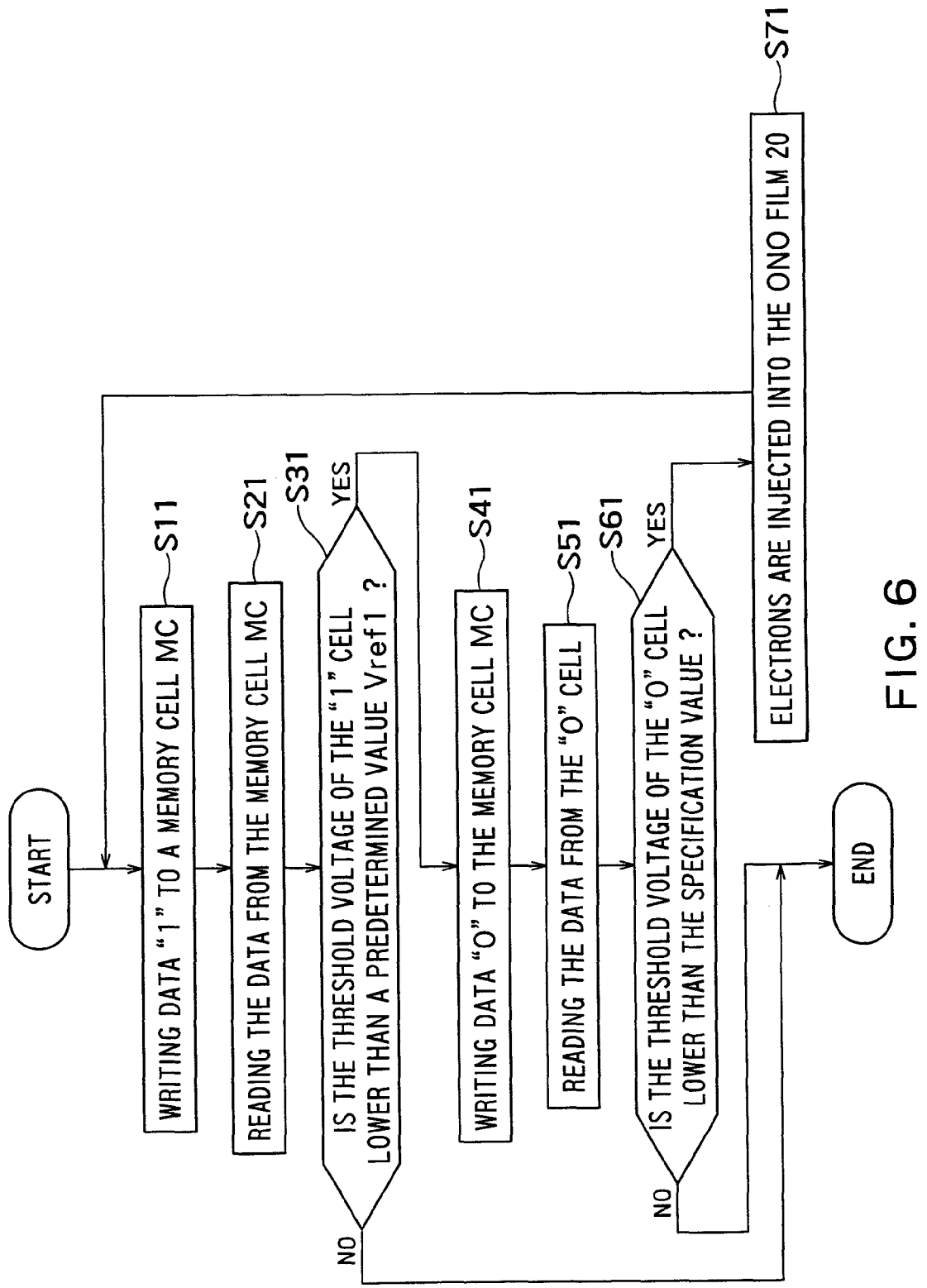
FIG. 6 is a flowchart showing another trimming function of the FBC memory device.

FIG. 6 is a flowchart showing another trimming function of the FBC memory device. In the trimming shown in FIG. 6, the threshold voltage of each of the "0" cells is inspected and verified with respect to only the memory cells MCs for which the threshold voltages of "1" cells are equal to or higher than a predetermined value. Each of the sense amplifiers S/As writes data "1" to a memory cell MC (S11). The sense amplifier S/A reads a signal of the data from the memory cell MC (S21). The sense amplifier S/A determines whether the threshold voltage of the memory cell MC is lower than a predetermined value Vref1 (S31). The predetermined value Vref1 is, for example, an average value or mean value of the threshold voltages of a plurality of "1" cells. When the threshold voltage is higher than the predetermined value Vref1, the trimming of the memory cell MC is finished. This is so because if electrons are injected into the ONO film 20 of the "1" cell whose threshold voltage is higher than the predetermined value Vref1, the threshold voltage of the "1" cell is further raised. In addition, even if the sense amplifier S/A writes data "0" to the memory cell MC, the threshold voltage of the "0" cell is relatively high to fall in a scope of specification for "0" cell in most cases. Therefore, if the threshold voltage is higher than the predetermined value Vref1, the inspection target memory cell MC is regarded as a non-defective memory cell MC and the next memory cell MC is then inspected and verified.

On the other hand, if the threshold voltage is lower than the predetermined value Vref1, the sense amplifier S/A writes data "0" to the memory cell MC (S41). The sense amplifier S/A reads a signal of the data from the "0" cell (S51). The sense amplifier S/A determines whether the threshold voltage of the "0" cell is lower than the specification value (S61). If the threshold voltage is lower than the specification value, electrons are injected into the ONO film 20 of the memory cell MC (S71). As a result, the threshold voltage of the memory cell MC is raised. Thereafter, the steps S11 to S61 are repeated. If the threshold voltage is still lower than the standard value, electrons are further injected into the ONO film 20 of the memory cell MC at the step S71. If the threshold voltage is higher than the specification value, the trimming of the memory cell MC is finished. A series of these steps is executed for all the memory cells MC in the respective memory cell arrays.

While the trimming function with respect to the "0" cells has been described with reference to FIG. 6, the trimming function can be similarly executed with respect to the "1" cells. If "1" cells are to be trimmed, each of the sense amplifiers S/As writes data "0" to a memory cell MC. The sense amplifier S/A compares the threshold voltage of the "0" cell with a predetermined value Vref0. The predetermined value Vref0 is, for example, an average value or a mean value of the threshold voltages of a plurality of "0" cells. Only if the threshold voltage is higher than the predetermined value Vref0, the threshold voltages of the "1" cells are inspected. The reason is as follows. If the threshold voltage of the "0" cell is lower than the predetermined value Vref0 and holes are injected into the ONO film 20 of the "0" cell, the threshold voltage of the "0" cell is further reduced. Moreover, in this case, even if the sense amplifier S/A writes data "1" to the memory cell MC, the threshold voltage of the "1" cell can be estimated to be relatively low to fall in a scope of specification for "1" cell. Therefore, if the threshold voltage is higher than the predetermined value Vref0, the sense amplifier S/A writes data "1" to the memory cell MC and reads a signal of the data from the memory cell MC. If the threshold voltage of the "1" cell is higher than the specification value, the sense amplifier S/A injects holes into the ONO film 20 of the memory cell MC.

Needless to say, the trimming function can be sequentially executed with respect to defective memory cells including both the "0" cells and the "1" cells. By doing so, the difference between the maximum value of the "1" cell threshold voltage Vt1 and the minimum value of the "0" cell threshold voltage Vt0 further increases, and defective bit counts further decrease. In the above explanation for FIG. 6, the threshold voltage is compared with the specification value. Alternatively, the drain current can be compared with the specification value.

Note that the threshold voltage is a front gate voltage when a channel is formed on a front surface of the body 50. If a memory cell MC is operated in an FD (fully depleted) mode in which the body 50 is entirely depleted and no neutral region is present, the threshold voltage of the memory cell MC is modulated according to charges in the ONO film 20. In the FD mode, if the body 50 is thinner, the influence of the charges in the ONO film 20 on the threshold voltage is greater. Namely, if the body 50 is thinner, not only a threshold voltage difference ΔVt between the data "0" and "1" is greater but also the effect of trapped charges in the ONO film 20 on the threshold voltage is greater. In the first embodiment, therefore, it is preferable to make the thickness of the body 50 of each memory cell MC smaller.

On the other hand, if a memory cell MC is operated in a PD (Partially Depleted) mode in which a neutral region is present in a part of the body 50, the quantity of charges in the ONO film 20 and the back gate voltage have a smaller influence on formation of a channel on a front surface of the body 50.

The FBC memory device according to the first embodiment dynamically holds data according to the number of majority carriers accumulated in the bodies 50 of the memory cells MCs. It is, therefore, possible to quickly rewrite data and use the FBC memory device as a RAM. Moreover, the FBC memory device according to the first embodiment includes the trimming function because each of the memory cells MCs includes the ONO film 20 serving as a charge trap film. This trimming function enables reduction in the fluctuation in threshold voltage among the memory cells MCs and reduction in the fail bit counts.

As a method of writing data "1", GIDL (Gate Inducted Drain Leakage) can be used in place of the impact ionization. To write data "1" to each memory cell MC using the GIDL, the word line WL connected to the memory cell MC is biased to −3 V, and the bit line BL connected to the memory cell MC is biased to 1.5 V. A voltage of the source 60 is set to the ground voltage GND (0 V). As a result, an electric field is increased near the drain 40, band-to-band tunneling occurs, and many pairs of electrons and holes are generated. The electrons generated at this time flow into the drain 40 whereas the holes are accumulated in the low potential body 50. Each of the FBCs can be a p-channel MISFET. If the FBC is a p-channel MISFET, the polarity of the threshold voltages is opposite to that described above.

Figure 7:
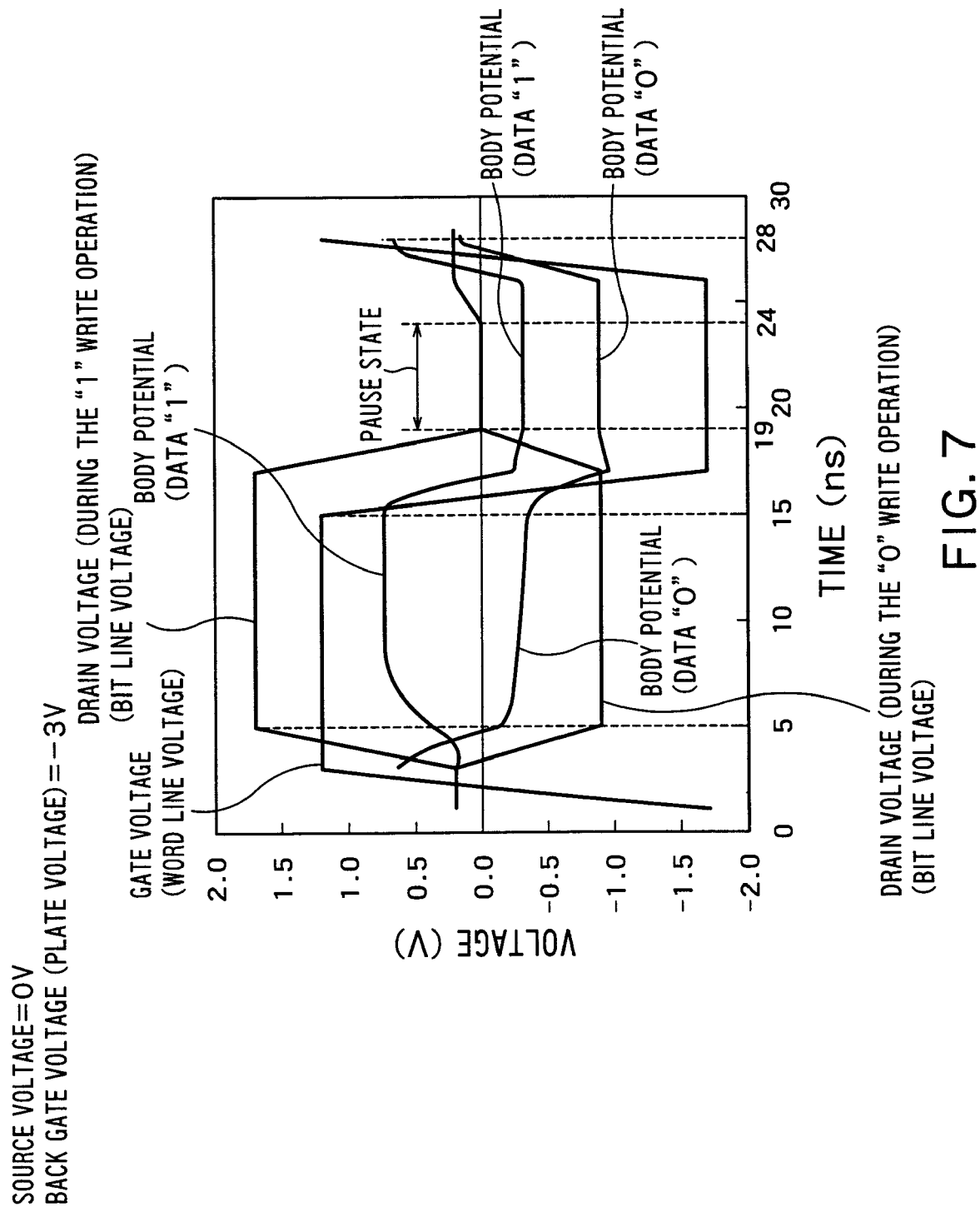
FIG. 7 is a timing diagram of signals for driving the FBC memory device.

FIG. 7 is a timing diagram of signals for driving the FBC memory device. A gate length of each of the memory cells MC used for this simulation is 75 nm. A thickness of a front gate oxide film thereof is 5.2 nm. A thickness of an SOI layer thereof is 21 nm. A thickness of a first silicon oxide film within the ONO film 20 is 3 nm. A silicon nitride film within the ONO film 20 is 6 nm. A thickness of a second silicon oxide film in the ONO film 20 is 6 nm.

A voltage VS of the source 60 is kept to 0 V, and a voltage VPL of the back gate BG is kept to −3 V. The back gate contains n-type impurities at a concentration of $3 \times 10^{17}$ cm$^{-3}$. The body 50 contains p-type impurities at a concentration of $1 \times 10^{17}$ cm$^{-3}$.

An operation from 5 to 15 nanoseconds (ns) is the write operation. To write data "0" to the memory cell MC, a voltage VG of the gate electrode 80 (the word line WL) is set to 1.2 V and a voltage VD of the drain 40 (the bit line BL) is set to −0.9 V. By so setting, holes are extracted from the body 50. To write data "1", the gate voltage VG is set to 1.2 V and the drain voltage VD is set to 1.7 V. By so setting, the memory cell MC is operated in a saturation region and holes are accumulated in the body 50 by the impact ionization.

An operation from 19 to 24 ns is the hold operation. To hold data, the gate voltage VG is set to −1.7 V and the drain voltage VD is set to 0 V. A state in which the drain voltage VD is 0 V and in which data is held will be referred to as "pause state". A body potential of the memory cell MC storing therein data "0" ("0" cell) is lower than that of the memory cell MC storing therein data "1" ("1" cell). The difference in body potential between the "0" cell and the "1" cell is due to the difference in the number of majority carries accumulated in the body 50 therebetween. In the pause states of the "0" cells and "1" cells, a reverse bias is applied to the PN junction between the body 50 and the source 60 and to the PN junction between the body 50 and the drain 40.

An operation from 28 ns and the following is the read operation. To read data from each of the memory cells MCs, the drain voltage VD is set to 0.2 V and the gate voltage VG is set to 1.2 V. At this time, the difference is generated between the threshold voltage of "0" cells and that of "1" cells based on the difference in body potential between the "0" cells and the "1" cells. The threshold voltage difference ΔVth during the read operation is about 0.45 V. Each of the sense amplifiers S/As discriminates whether data is "0" or "1" based on the threshold voltage difference ΔVth.

The FBC memory device including the trimming function according to the first embodiment differs from a nonvolatile memory device including memory cells each formed on a silicon layer on an ONO film and each storing data according to charges trapped in the ONO film in the following respects. The purpose of trapping charges into the ONO film 20 according to the first embodiment is not to store data but to modulate the threshold voltages of defective bits. Each of the memory cells MCs included in the FBC memory device according to the first embodiment holds data according to the number of majority carriers accumulated in the body 50. A sense amplifier in the FBC memory device identifies data of the memory cell by reading a signal (threshold voltage or drain current) of the data based on difference in the number of majority carriers in the body 50. The number of trapped charges in the ONO film 20 of the "1" cell is equal to that of the "0" cell.

The FBC memory device according to the first embodiment adjusts the threshold voltage of each of the memory cells MCs by trapping charges into the ONO film 20 of the memory cell MC. As a result, it is possible to reduce the fluctuation in threshold voltage among the memory cells MCs during the read operation and to decrease the defective bit counts, as compared with the conventional FBC memory device.

Modification of First Embodiment

According to a modification of the first embodiment, each of the sense amplifiers S/As reads a signal of a certain data state after holding the data state for a predetermined time in the inspection operation. In the trimming function shown in FIG. 5, for example, data holding (pause) time between the steps S10 and S20 is set to 100 milliseconds. If the read threshold voltage or drain current does not satisfy the specification, the sense amplifier S/A traps charges into the ONO film 20 of the memory cell MC. If the data state is read after holding the data state for the predetermined time as stated above, the fluctuation in the threshold voltage or the drain current among the memory cells MCs can be adjusted while considering the fluctuation in leakage current, local electric field, or the like. The leakage current and the local electric field of a memory cell are modulated by trapping charges into the ONO film of the memory cell. According to the modification of the first embodiment, by executing such a trimming function, it is possible to decrease the defective bit counts more effectively. Note that a state discriminated according to a logical value (0 or 1) of information stored in each memory cell MC is referred to as "data state" or simply "data".

A method of injecting charges into the ONO film 20 so as to realize the trimming function according to the first embodiment will be described.

Figure 8:
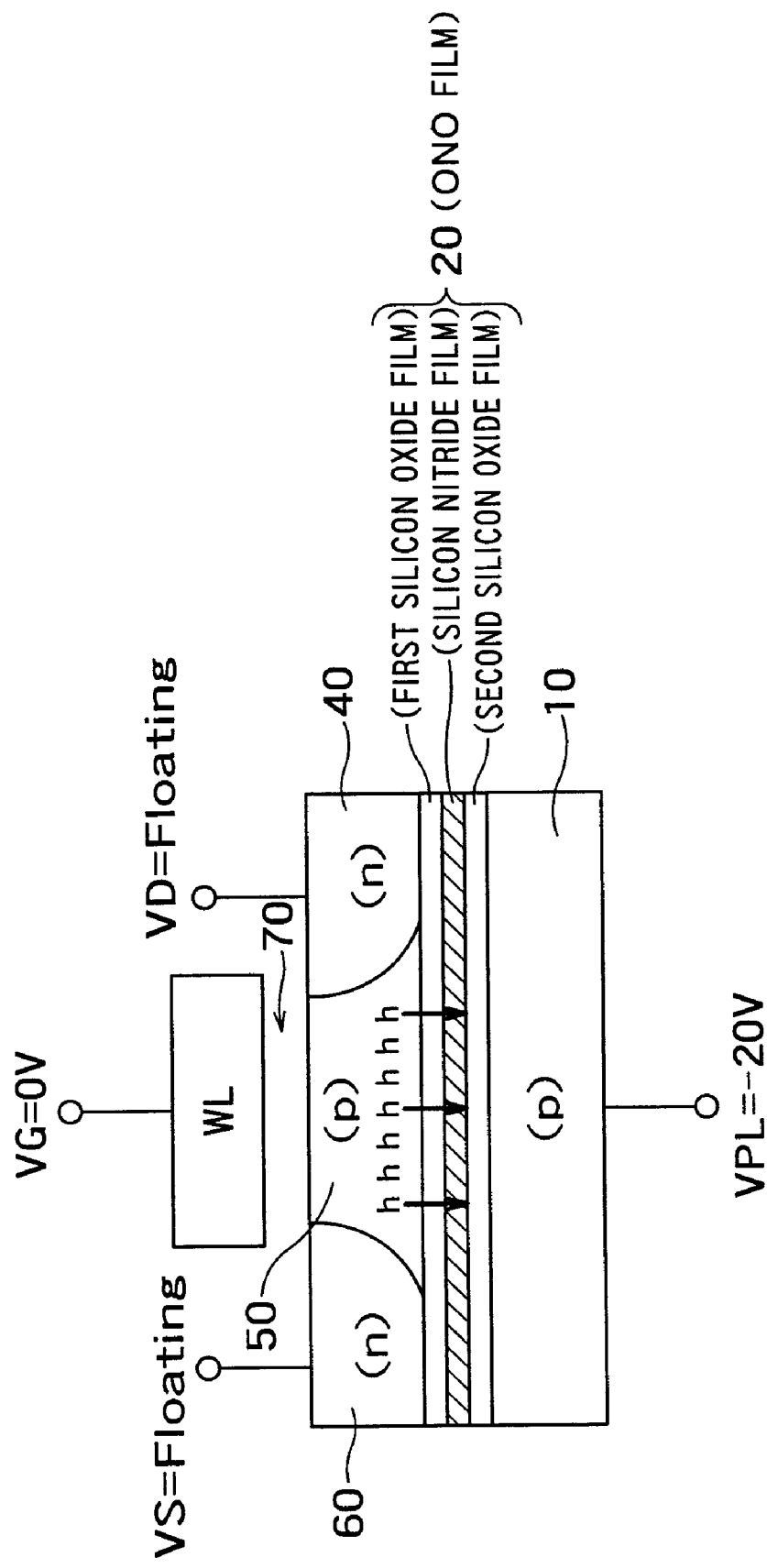
FIG. 8 is a conceptual cross-sectional view showing a method of injecting holes into the ONO film 20.

FIG. 8 is a conceptual cross-sectional view showing a method of injecting holes into the ONO film 20. In the method shown in FIG. 8, holes accumulated in the body 50 are injected into the ONO film 20. In this case, a source potential VS and a drain potential VD are set into floating states, thereby giving a potential difference between the front gate (WL) and the back gate 10. As a result, FN (Flower-Nordheim) tunneling occurs and the holes are injected into the ONO film 20 from the body 50.

The potential difference given between the front gate (WL) and the back gate 10 depends on the thickness of the gate insulating film 70 and that of the ONO film 20. It is assumed that an EOT (Equivalent Oxide Thickness) of the ONO film 20 is Tono and that an EOT of the gate insulating film 70 is Tox. A potential Vbody of the body 50 is almost equal to VPL×Tox/(Tono+Tox). If Tono=Tox=10 nm, Vg=0 V is applied to the front gate (WL), and VPL=−20 V is applied to the back gate 10, Vbody is about −10 V. If Vbody=−10 V, the holes present on the bottom portion (back surface) of the body 50 are passed through the first silicon oxide film in the ONO film 20 by the FN tunneling and trapped into the silicon nitride film in the ONO film 20.

At this moment, if a potential of −20 V is applied to the source 60 and the drain 40, the PN junctions between the body 50 and the source 60 and between the body 50 and the drain 40 are forwardly biased. As a result, the potential of the body 50 is reduced to about −20 V. Accordingly, if an equal potential to the back gate potential VPL is applied to the source 60 and the drain 40, the holes are not injected into the ONO film 20.

Moreover, if the back gate is a P-type semiconductor having an impurity concentration equal to or lower than $1 \times 10^{18}$ $cm^{-3}$, an inversion layer is formed on a surface of the back gate. If the inversion layer is formed on the surface of the back gate, then electrons are injected from the back gate into the ONO film 20, and the electrons are recombined with the holes in the silicon nitride film or the electrons cancel positive charges by the holes in the silicon nitride film. This disadvantageously elongates the time for injecting net charges into the ONO film 20 or makes it impossible to inject net charges into the ONO film 20. Therefore, it is preferable that the P-type impurity concentration of the back gate is equal to or higher than $1 \times 10^{20}$ $cm^{-3}$ so as not to form the inversion layer on the surface of the back gate.

To accumulate holes in the body 50, impact ionization is produced by the data "1" write operation from 5 to 15 ns shown in FIG. 7. To extract holes from the body 50, the PN junction between the body 50 and the drain 40 is forwardly biased by the data "0" write operation from 5 to 15 ns shown in FIG. 7.

If the number of holes accumulated in the body 50 is large (data "1" is stored in the memory cell MC), the body potential is high. Due to this, the potential difference is greater between the body 50 and the back gate, and an FN tunneling current is high, accordingly. On the other hand, if the number of holes accumulated in the body 50 is small (data "0" is stored in the memory cell MC), the body potential is low. Due to this, the potential difference is smaller between the body 50 and the back gate, and the FN tunneling current is low, accordingly. In this manner, the method of injecting holes shown in FIG. 8 is applicable to trimming of "1" cells.

Note that the number of holes accumulated in the body 50 of each of "0" cells increases with the passage of time and the difference in the number of holes accumulated in the body 50 is decreased between the "0" cells and the "1" cells. Therefore, by repeating the step of either accumulating holes in the body 50 or extracting holes from the body 50 and the step of injecting holes accumulated in the body 50 into the ONO film 20, the holes of a desired quantity can be injected into the ONO film 20 of a desired memory cell MC while maintaining unselected memory cells intact.

Figure 9:
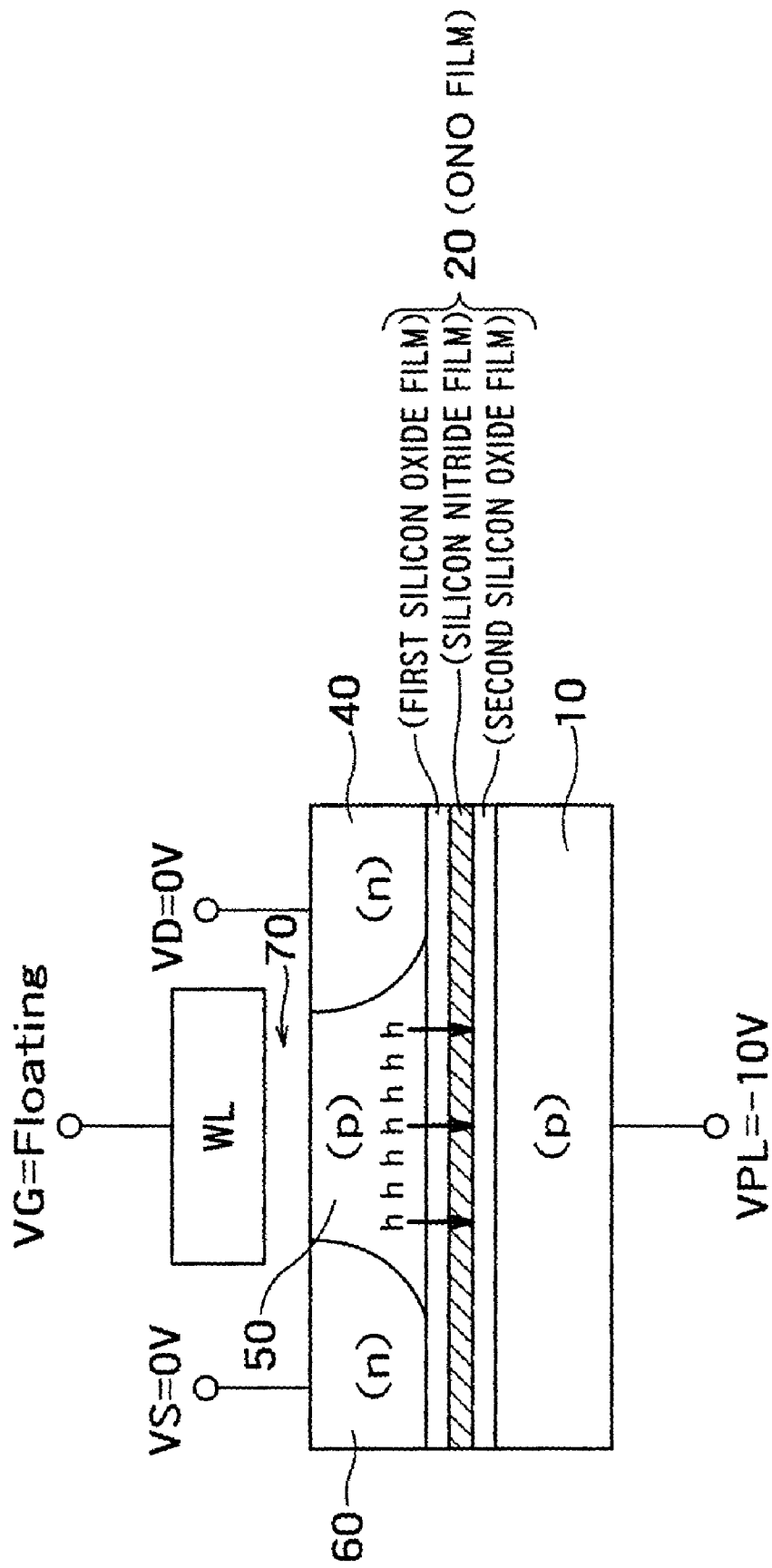
FIG. 9 is a conceptual cross-sectional view showing another method of injecting holes into the ONO film 20.

FIG. 9 is a conceptual cross-sectional view showing another method of injecting holes into the ONO film 20. With the method shown in FIG. 9, voltages are applied between the source 60 and the back gate 10 and between the drain 40 and the back gate 10, thereby generating FN tunneling. The potential VG of the front gate is set into a floating state. In case of the memory cell MC structured as shown in FIG. 9, for example, the source voltage VS and the drain voltage VD are set to 0 V, and the back gate potential VPL is set to −10 V. In this case, band-to-band tunneling occurs near the source 60 and the drain 40 on the bottom portion (back surface) of the body 50. Accordingly, holes are generated in a valance band of the body 50. The generated holes are trapped into the silicon nitride film in the ONO film 20 by the FN tunneling.

The method of injecting charges shown in FIG. 9 has the following merits over that shown in FIG. 8. First, since there is no need to carry a current into the gate insulating film 70, it is possible to prevent deterioration in the reliability of the gate insulating film 70. Second, the back gate potential VPL can be reduced as compared with the method shown in FIG. 8. The power consumption for the method shown in FIG. 9 is relatively low.

In the charge injection using the FN tunneling, the electric field in the ONO film 20 changes with the passage of time by trapped charges and a charge injection rate is gradually decelerated. As shown in FIGS. 8 and 9, after voltages are applied to the respective terminals, the quantity of charges in the ONO film 20 nears a constant value without excessive injection of charges.

With the methods shown in FIGS. 8 and 9, holes can be uniformly injected into the body 50 in a self aligned fashion. Furthermore, with these methods, the quantity of charges in the ONO film 20 can be made constant. According to the first embodiment, therefore, the influence of the back gate potential on the channel formed on the front surface of the body 50 can be modulated over the entire channel.

Figure 10:
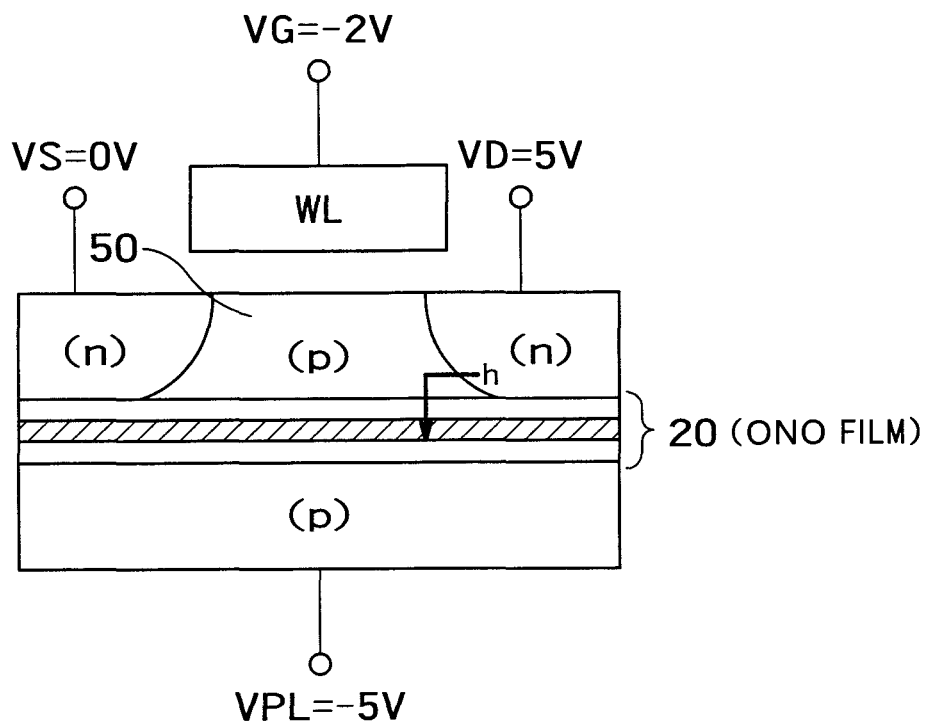
FIG. 10 is a conceptual cross-sectional view showing yet another method of injecting holes into the ONO film 20.

FIG. 10 is a conceptual cross-sectional view showing yet another method of injecting holes into the ONO film 20. With the method shown in FIG. 10, a first voltage (e.g., 5 V) is applied between the drain 40 and the source 60, and a second voltage (e.g., −5 V) is applied between the back gate and the source 60. By doing so, band-to-band-tunneling hot hole injection occurs to inject holes into the ONO film 20.

For example, the front gate potential VG of a selected memory cell MC is set to −2 V, the source potential VS thereof is set to 0 V, the drain potential VD thereof is set to 5 V, and the back gate potential VPL thereof is set to −5 V. By so setting, band-to-band tunneling occurs near the drain 40 on the bottom portion (back surface) of the body 50. Accordingly, holes generated in the valance band of the body 50 are accelerated in a source direction by a lateral electric field between the body 50 and the drain 40. The holes are thereby given energy and can exceed a barrier of the first silicon oxide film. As a result, the holes are injected into the silicon nitride film in the ONO film 20. With the method shown in FIG. 10, the energy sufficient for the holes to exceed the barrier of the first silicon oxide film in the ONO film 20 is applied to the holes using the voltage between the drain 40 and the source 60 as well as the voltage between the drain 40 and the back gate or that between the front gate and the back gate. Due to this, the holes can be injected into the ONO film 20 at the voltage (5 V) lower in absolute value than the back gate voltage (−20 V or −10 V) by the FN tunneling as shown in FIGS. 8 and 9. Namely, the method shown in FIG. 10 is higher in hole injection efficiency and shorter in trimming time than the methods shown in FIGS. 8 and 9. Moreover, since the holes can be written into the ONO film 20 at the voltage having the smaller absolute value, power consumption can be reduced as compared with the methods shown in FIGS. 8 and 9. With the method shown in FIG. 10, the region into which the holes are injected is limited to that near the PN junction between the body 50 and the drain 40. Preferably, the holes are trapped into the ONO film 20 near the junction between the drain 40 and the body 50 so as to reduce the threshold voltage of each "1" cell (see FIGS. 33 and 34).

The front gate voltage VG may be set so as not to form the channel on the front surface of the body 50. By so setting, the power consumption can be reduced. The method shown in FIG. 10 can reduce power consumption, improve the injection efficiency, and complete the trimming function in a short time, as compared with the methods shown in FIGS. 8 and 9.

Figure 11:
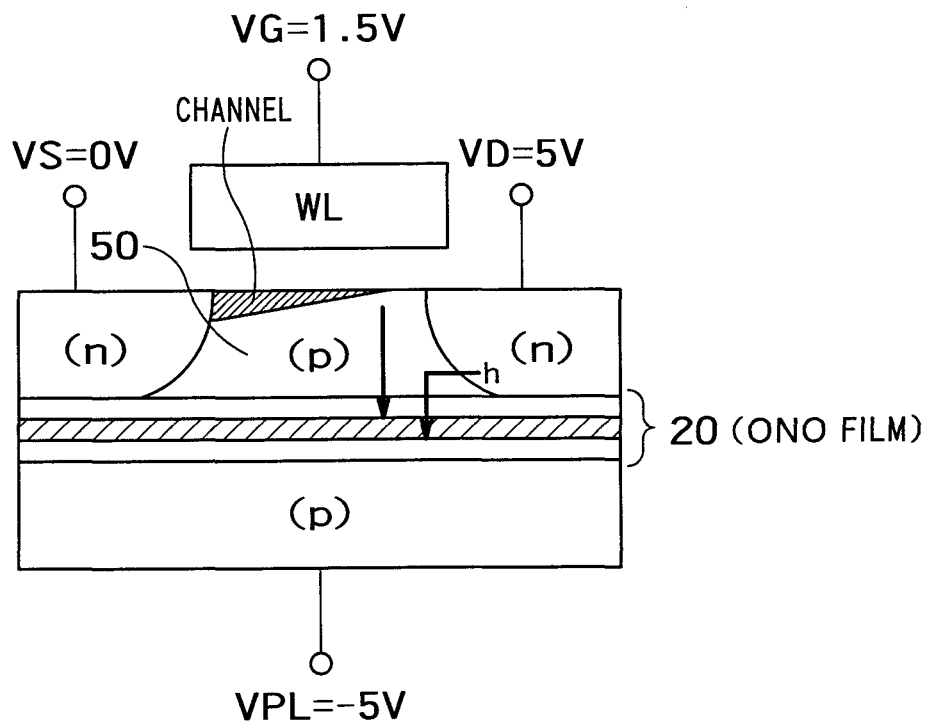
FIG. 11 is a conceptual cross-sectional view showing still another method of injecting holes into the ONO film 20.

FIG. 11 is a conceptual cross-sectional view showing still another method of injecting holes into the ONO film 20. The method shown in FIG. 11 differs from that shown in FIG. 10 in that a positive potential is applied as the front gate potential VG. With the method shown in FIG. 11, a channel is formed on the front surface of the body 50 and holes are generated by impact ionization. The holes are accelerated by a longitudinal electric field within the body 50 and injected into the ONO film 20. In this case, the thickness of the body 50, i.e., the thickness of the SOI film is preferably small. Accepter impurity concentration can be set low so as to fully deplete the body 50. By doing so, a high longitudinal electric field can be generated in the body 50. With the method shown in FIG. 11, holes are generated by the impact ionization. Due to this, the method shown in FIG. 11 can improve the hole injection efficiency as compared with the method shown in FIG. 10. Namely, the method shown in FIG. 11 can ensure high injection efficiency and short trimming time although power consumption is higher than that of the method shown in FIG. 10.

As a modification of the method shown in FIG. 11, the front gate voltage VG can be set to a negative value. By so setting, band-to-band tunneling occurs near the front surface of the body 50 and near the junction between the body 50 and the drain 40 so that holes are generated. In this case, the longitudinal electric field in the body 50 needs to be high. The modification of the method shown in FIG. 11 can improve the hole injection efficiency without increasing the power consumption.

Figure 12:
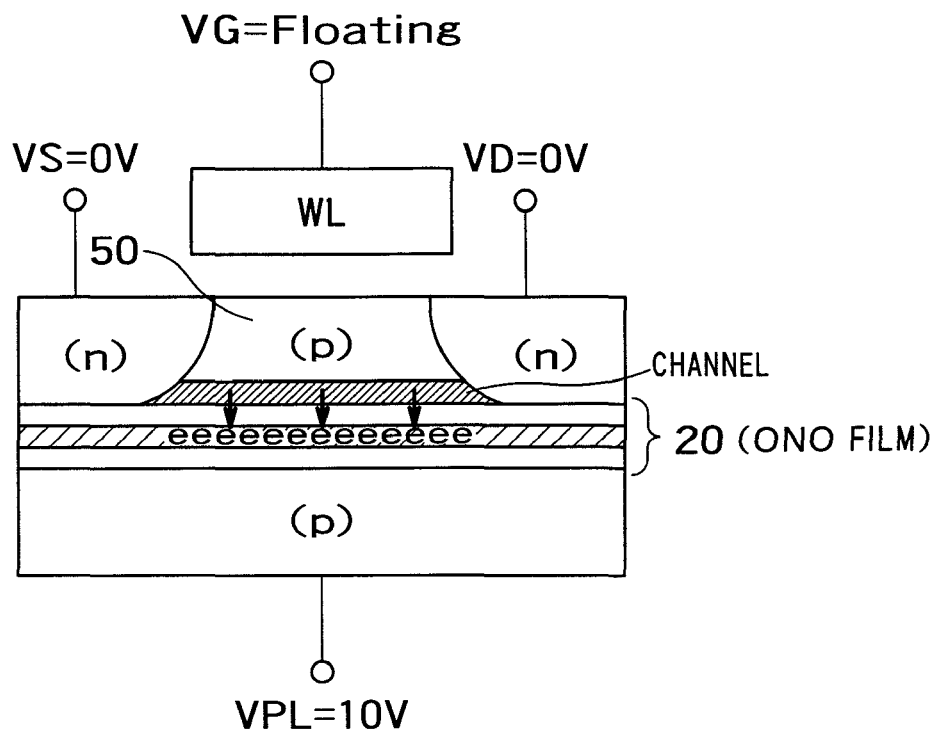
FIG. 12 is a conceptual cross-sectional view showing a method of injecting electrons into the ONO film 20.

FIG. 12 is a conceptual cross-sectional view showing a method of injecting electrons into the ONO film 20. With the method shown in FIG. 12, a voltage is applied between the front gate and the back gate, whereby electrons are injected into the ONO film 20 using the FN tunneling. For example, the front gate potential VG is set into a floating state, the back gate potential VPL is set to 10 V, and either or both of the source potential VS and the drain potential VD are set to 0 V. By so setting, a back channel is formed on the bottom portion (back surface) of the body 50 and electrons "e" are injected from this back channel into the ONO film 20.

In the charge injection using the FN tunneling, a height of the barrier of the first silicon oxide film is smaller for electrons than for holes. Due to this, if the voltage between the body 50 and the back gate is equal in absolute value between the injection of electrons and that of holes, electron injection efficiency is higher than the hole injection efficiency. Accordingly, if charges are injected into the ONO film 20 by the FN tunneling, a write speed is higher for the injection of electrons than that of holes.

Figure 13:
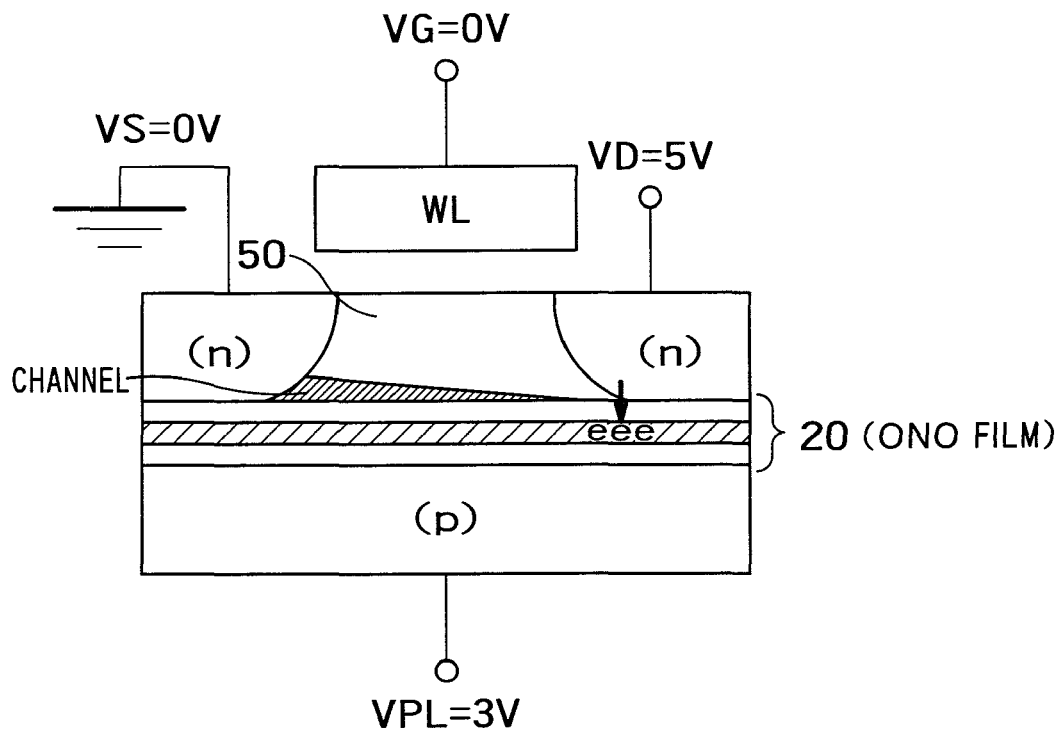
FIG. 13 is a conceptual cross-sectional view showing another method of injecting electrons into the ONO film 20.

FIG. 13 is a conceptual cross-sectional view showing another method of injecting electrons into the ONO film 20. With the method shown in FIG. 13, a first voltage is applied between the drain 40 and the source 60 and a second voltage is applied between the back gate and the source 60. By doing so, a back channel is formed on the bottom portion (back surface) of the body 50 and hot electrons are generated near the junction between the drain 40 and the body 50. The generated hot electrons are injected into the ONO film 20. For example, the front gate potential VG is set to 0 V, the back gate potential VPL is set to 3 V, the source potential VS is set to 0 V, and the drain potential VD is set to 5 V. By so setting, the selected memory cell MC is operated in the saturation region and a high electric field region is formed near the junction between the body 50 and the drain 40. The electrons are given enough energy to exceed the barrier of the first silicon oxide film in the ONO film 20 by the high electric field and injected into the ONO film 20. As stated above, the injection of the channel hot electrons enables high-speed writing at low voltage, as compared with the injection of electrons by the FN tunneling.

With the method shown in FIG. 13, electrons are locally injected into the ONO film 20 proximate to the PN junction between the body 50 and the drain 40. To inject holes into the ONO film 20 proximate to the PN junction between the body 50 and the source 60, it suffices to reverse the relationship between the source potential VS and the drain potential VD. To raise the threshold voltage of each "0" cell, electrons are preferably trapped into the ONO film 20 near the junction between the source 60 and the body 50 (see FIGS. 33 and 34).

Figure 14:
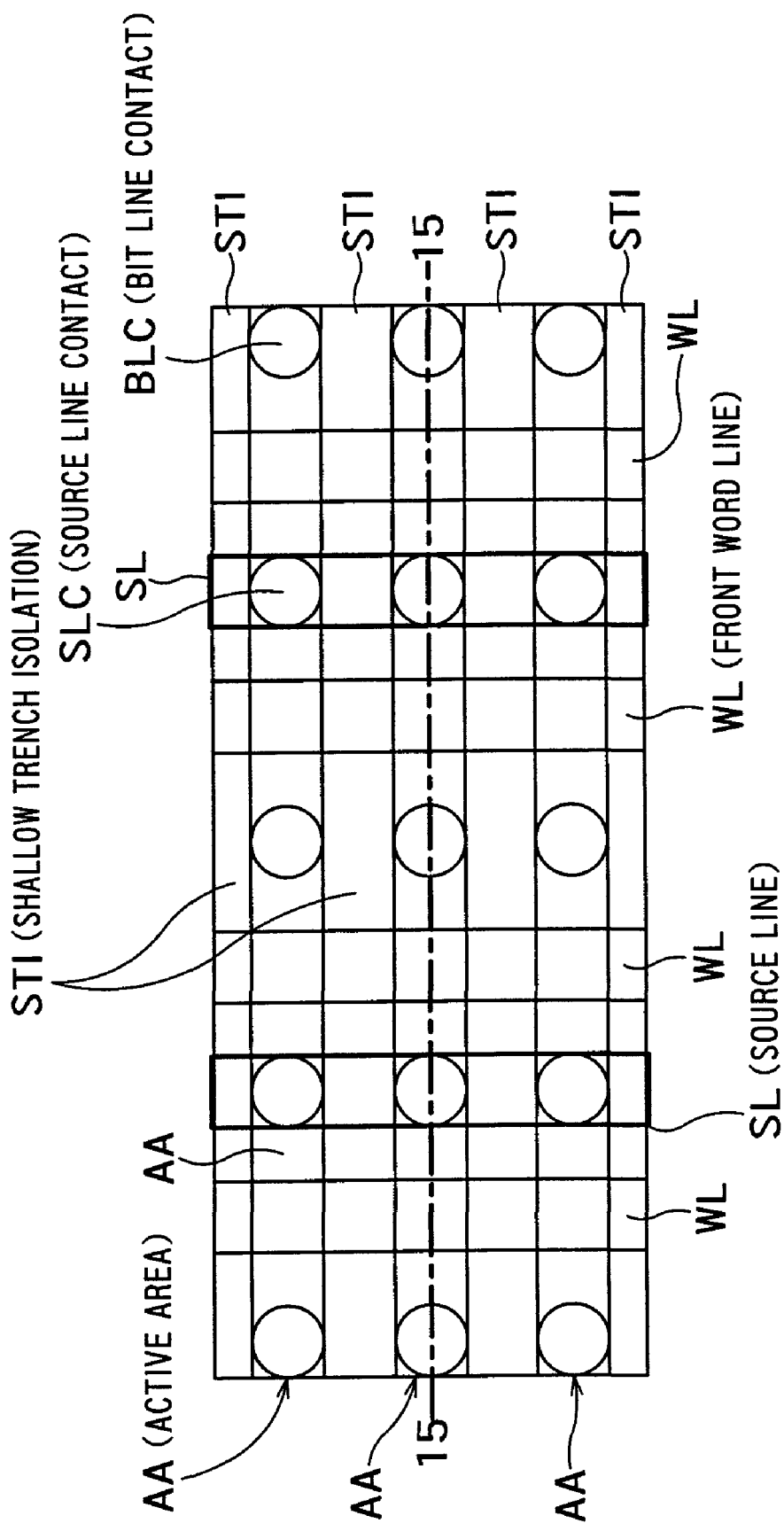
FIG. 14 is a plan view of the FBC memory device according to the first embodiment.

FIG. 14 is a plan view of the FBC memory device according to the first embodiment. Element isolation STIs and active regions AAs are alternately arranged into stripes. The front word lines WLs extend in a direction perpendicular to the active regions AAs. Each of source line contacts SLCs is shared between two adjacent memory cells MCs. The source lines SLs extend in parallel to the front word lines WLs on the source line contacts SLCs. Each of bit line contacts BLCs is shared between two adjacent memory cells MCs. The bit lines BLs extend in parallel to the active regions AAs on the bit line contacts BLCs.

The memory cells MCs are arranged at crosspoints between the front word lines WLs and the bit lines BLs, and form a matrix. This memory cell array is a so-called crosspoint array in which the memory cells MCs can be arranged in large scale with high density. In the crosspoint array, an area of each memory cell MC can be reduced down to 4 $F^2$, where F is a feature size that indicates a minimum size decided by a lithography technique.

Figure 15:
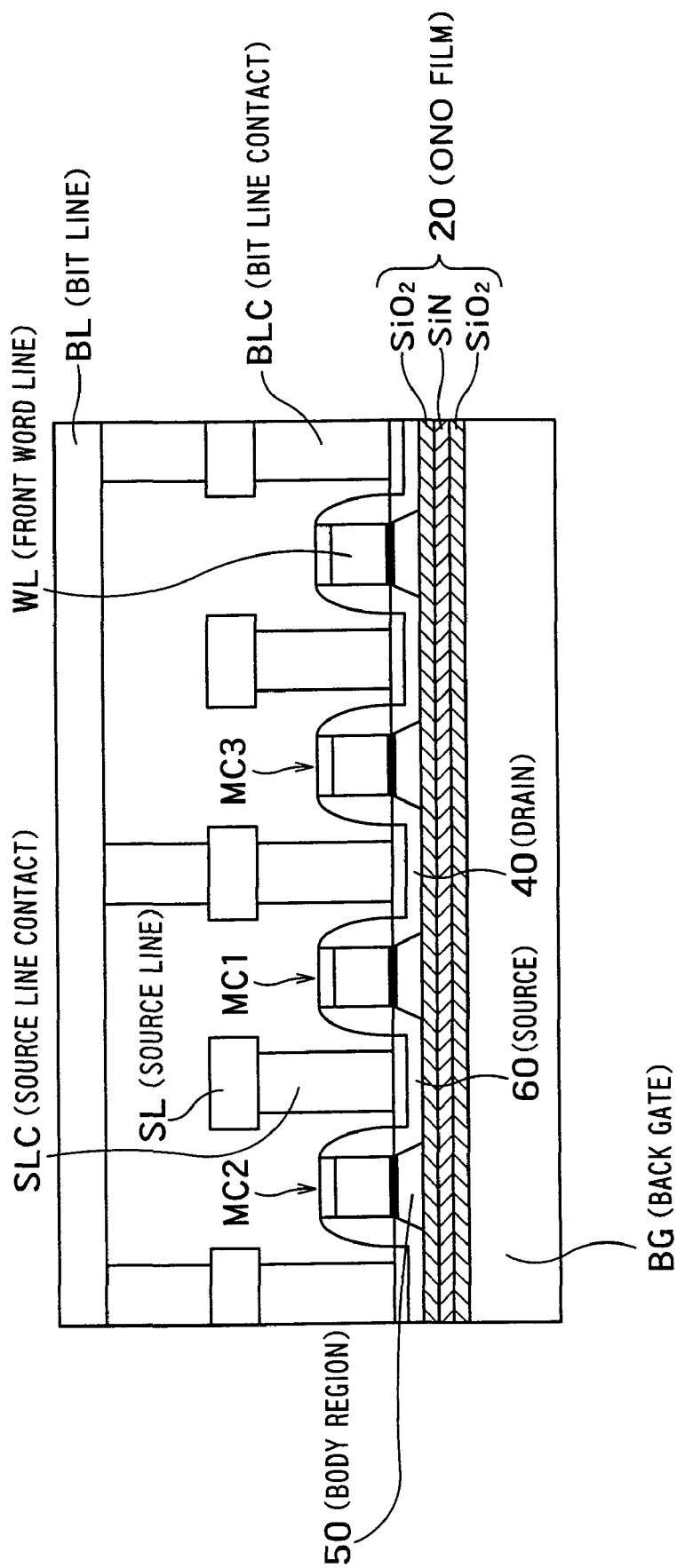
FIG. 15 is a cross-sectional view taken along a line 15-15 of FIG. 14.

FIG. 15 is a cross-sectional view taken along a line 15-15 of FIG. 14. In FIG. 15, a plurality of memory cells MCs shown in FIG. 2 is arranged. In the memory cell array shown in FIG. 15, the back gate BG (the silicon substrate 10) is common to the memory cells MCs. Substrate contacts (not shown) are formed in periphery of a cell array, and a voltage is applied to the silicon substrate 10 through the contacts. The silicon substrate 10 supplies a common back gate voltage to a plurality of the memory cells MCs. The ONO film 20 of each of the memory cells MCs serving as a charge trap film is provided on the back gate BG. Each memory cell MC is formed on the ONO film 20. The drain 40 of each memory cell MC is connected to one bit line BL via one bit line contact BLC. The source 60 of each memory cell MC is connected to one source line SL via one source line contact SLC. The front word line WL functions as a gate of each memory cell MC.

Figure 16:
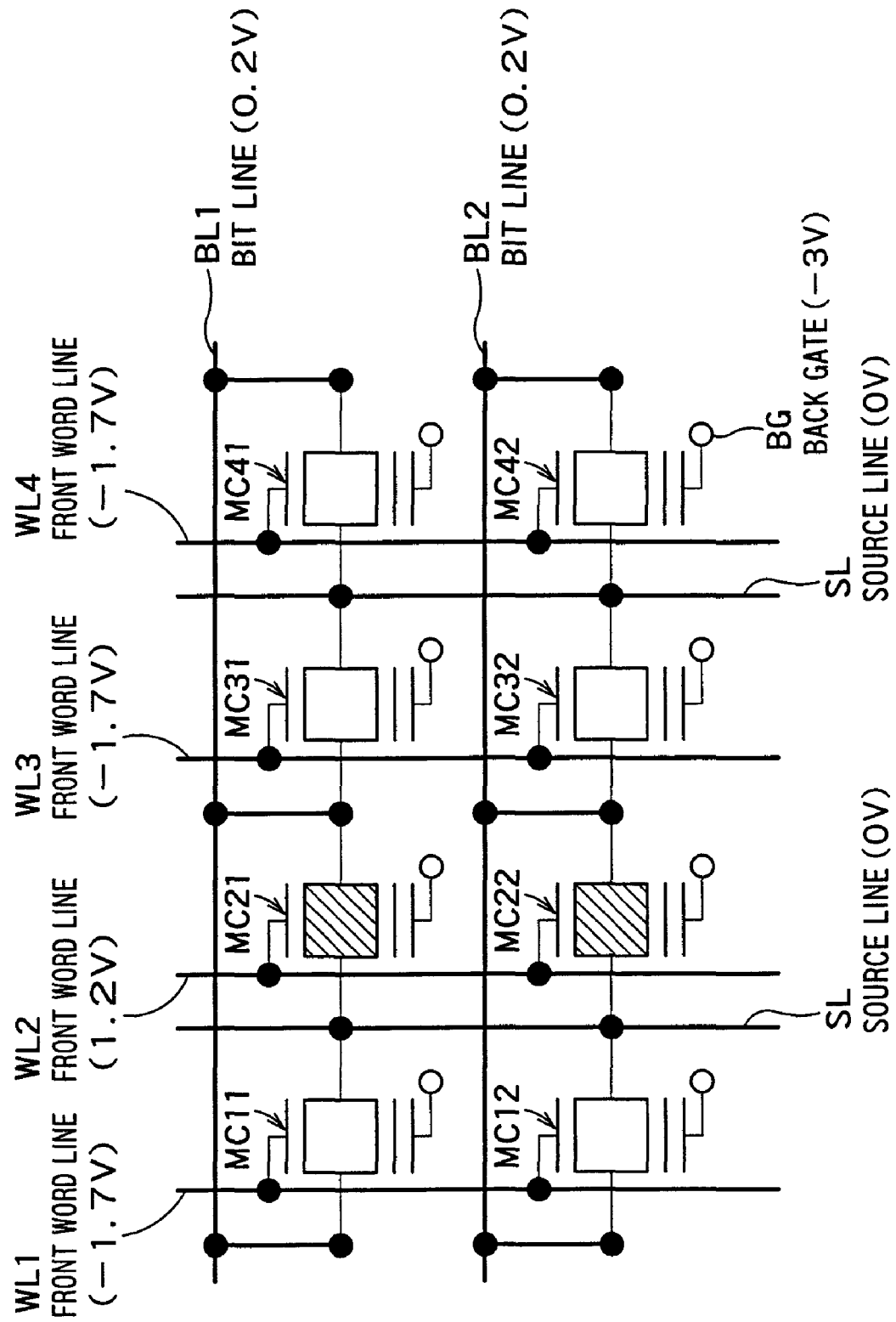
FIG. 16 is a schematic diagram showing the memory cell array MCA and a voltage state during the data read operation according to the first embodiment.

FIG. 16 is a schematic diagram showing the memory cell array MCA and a voltage state during the read operation according to the first embodiment. In the first embodiment, memory cells MC11 to MC42 are similar in structure to the memory cell MC shown in FIG. 2. The memory cells MC11 to MC42 (also, "MCij") are arranged in a matrix. Symbol i indicates a row number and symbol j indicates a column number in the MCij. In the first embodiment, the extension direction of the bit lines BLs is the column direction and that of the word lines WLs is the row direction.

Gate electrodes of the memory cells MCij arranged in the same row are connected to a common front word line WLi. For example, memory cells MC1j are connected to a word line WL1, memory cells MC2j are connected to a word line WL2, memory cells MC3j are connected to a word line WL3, and memory cells MC4j are connected to a word line WL4. The drains 40 of the memory cells MCij arranged in the same column are connected to a common bit line BLj. For example, memory cells MCi1 are connected to a bit line BL1 and memory cells MCi2 are connected to a bit line BL2. The source lines SLs are common to all the memory cells MC11 to MC42. The back gate BG is also common to all the memory cells MC11 to MC42.

In the first embodiment, the memory cells MCij connected to one bit line BLj are connected to different word lines WLs, respectively. Conversely, the memory cells MCij connected to one word line WLi are connected to different bit lines BLs, respectively. With this configuration, if a voltage is applied to a certain word line WLi and a certain bit line BLj, the memory cells MCij connected to the word line WLi and the bit line BLj can be selectively driven.

In FIG. 16, the memory cells MC21 and MC22 are selected memory cells whereas the other memory cells MCs are unselected memory cells. To read data states from the selected memory cells MC21 and MC22, a first voltage (e.g., 0 V) is applied to the source line SL common to the memory cells MC21 and MC22. A second voltage (e.g., −1.7 V) lower than the first voltage is applied to unselected front word lines WL1, WL3, and WL4. A third voltage (e.g., 1.2 V) higher than the second voltage is applied to a front word line (selected front word line) WL2 connected to the selected memory cells MC21 and MC22. A fourth voltage (e.g., −3 V) lower than the second voltage is applied to the back gate BG common to the memory cells MCs. Further, a fifth voltage (e.g., 0.2 V) different from the first voltage is applied to bit lines (selected bit lines) BL1 and BL2 connected to the selected memory cells MC21 and MC22, respectively. By doing so, the selected memory cells MC21 and MC22 are turned on in a linear region, and the corresponding sense amplifiers S/As detect signals of the data states according to the number of holes accumulated in the bodies 50 of the respective memory cells MC21 and MC22.

Figure 17:
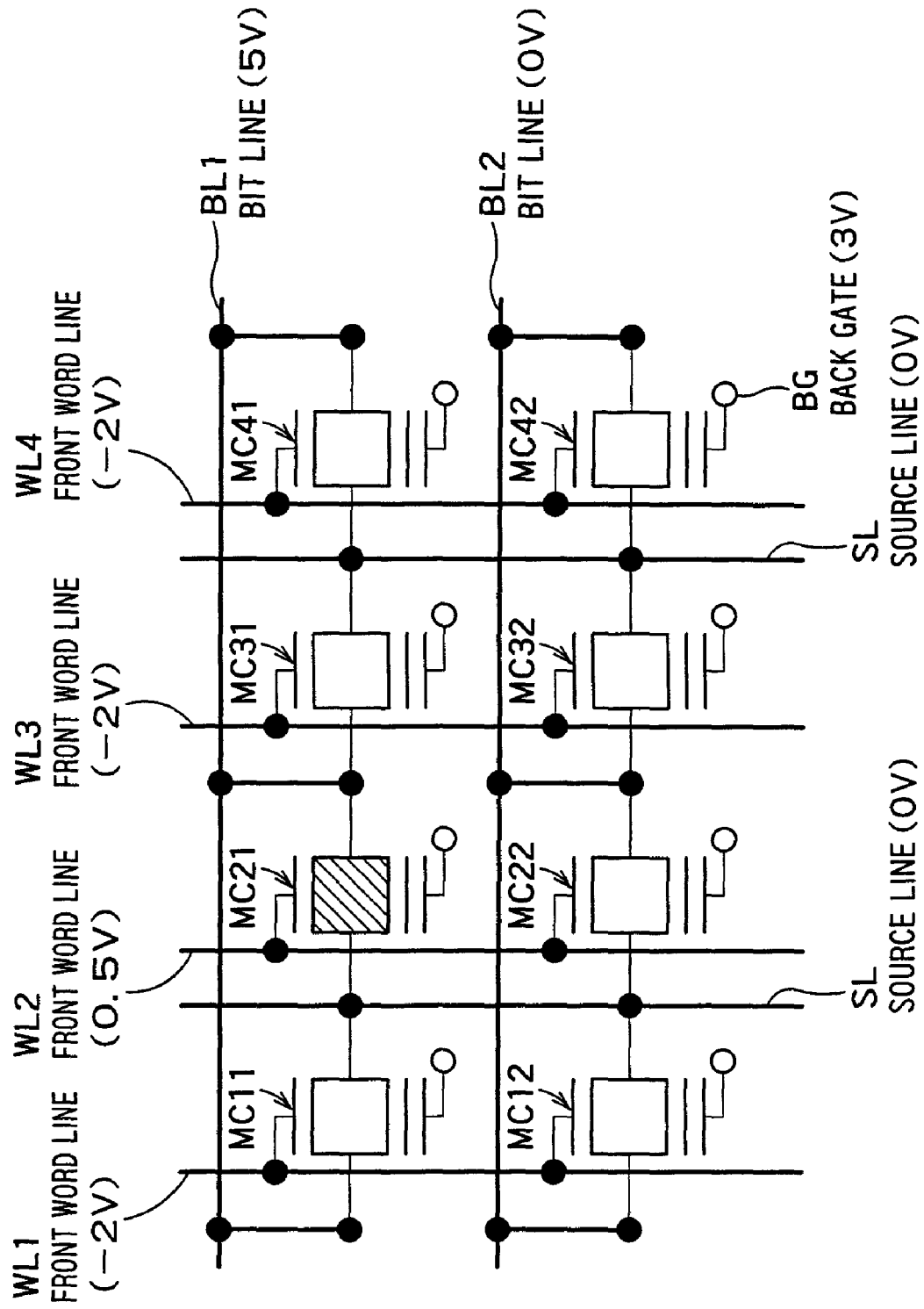
FIG. 17 is a schematic diagram showing another voltage state during trimming.

FIG. 17 is a schematic diagram showing another voltage state during trimming. FIG. 17 shows the voltage state in which electrons are injected. The memory cell MC21 is a selected memory cell whereas the remaining memory cells MCs are unselected memory cells. A first voltage (e.g., 0 V) is applied to the source lines SLs common to the memory cells MCs. A second voltage (e.g., −2 V) lower than the first voltage is applied to unselected front word lines. A third voltage (e.g., 0.5 V) higher than the second voltage is applied to the front word line (selected front word line) WL2 connected to the selected memory cell MC21. A fourth voltage (e.g., 3 V) higher than the third voltage is applied to the back gate BG common to the memory cells MCs. Further, a fifth voltage (e.g., 5 V) higher than the first voltage is applied to the bit line (selected bit line) BL1 connected to the selected memory cell MC21, and the first voltage is applied to the other unselected bit line BL2. By doing so, a current flows in a back channel (the first surface) of the selected memory cell MC21 and hot electrons generated as a result of the current in the back channel are injected into the ONO film 20 of the selected memory cell MC21.

Memory cells MC11, MC31, and MC41 are unselected memory cells connected to the bit line BL1 to which the selected memory cell MC21 is connected. A memory cell MC22 is an unselected memory cell connected to the front word line WL2 to which the selected memory cell MC21 is connected. Memory cells MC12, MC32, and MC42 are unselected memory cells connected to the other bit line BL2 in the different column and to the other front word lines WL1, WL3, and WL4 in different rows. A voltage of 5 V is applied between the drains 40 and the sources 60 of the respective memory cells MC11, MC21, MC31, and MC41, and a voltage of 3 V is applied between the back gate BG and the sources 60 thereof. However, a voltage of 0.5 V is applied only to the front word line WL2 to which the memory cell MC21 is connected whereas a voltage of −2 V is applied to the other front word lines. By so changing the front gate voltage, threshold voltages on back surfaces of the bodies 50 of the unselected memory cells MC11, MC31, and MC41 are higher than that of the selected memory cell MC21. Since a current flowing in the selected memory cell MC21 is high, electrons are injected into the ONO film 20 of the selected memory cell MC21. On the other hand, since a current flowing in the unselected memory cells MC11, MC31, and MC41 is lower, no electrons are injected into the ONO films 20 of the respective unselected memory cells MC11, MC31, and MC41. Since voltages between the drains 40 and the sources 60 of the unselected memory cells MC12, MC22, MC32, and MC42 are 0 V, no electrons are injected into the ONO films 20 of the respective unselected memory cells MC12, MC22, MC32, and MC42. "0" cells to be trimmed are sequentially selected and electrons are injected into the respective ONO films 20, thereby completing trimming the "0" cells.

As mentioned above with reference to FIG. 17, only the memory cell MC21 is the selected memory cell and one memory cell MC can be selected at one time. However, if a plurality of trimming target "0" cells are known among the memory cells MC2j connected to the front word line WL2, the plurality of trimming target "0" cells can be selected at the same time. A voltage of 5 V is applied to all the bit lines BLs to which the trimming target "0" cells are connected, and a voltage of 0 V is applied to the other "0" cells. By doing so, the trimming target "0" cells connected to the front word line WL2 can be simultaneously trimmed. This operation is sequentially repeated for all the front word lines BLs in the memory cell array MAC. By doing do, it is possible to trim the target "0" cells in the memory cell array MCA in a short time.

All the memory cells MCs connected to the front word line WL2 are connected to the same source line SL in common. As a result, a current flows in the trimming target memory cells MCs in the same direction. In the example of FIG. 17, the current flows from the drain 40 to the source 60 of each memory cell MC. Electrons are injected into the ONO film 20 of each memory cell MC near the drain 40 thereof. By making the same directions of the current during trimming, positions of injecting electrons are made uniform and a fluctuation in threshold voltage among the memory cells MCs after trimming is reduced.

In the first embodiment, the thickness of the silicon layer 30 is preferably small. If the silicon layer 30 is thinner, the body 50 is fully depleted and body effect can be enhanced. Alternatively, to turn the body 50 into the FD state, the impurity concentration of the body 50 can be reduced and the thickness of the gate insulating film 70 can be reduced. Moreover, if electrons are injected into the ONO film 20 of each selected memory cell MC, the threshold voltage of the back channel is modulated by the body effect produced by the selected front gate voltage. Accordingly, if the silicon layer 30 is thinner, the difference between the threshold voltage difference among the memory cells MCs connected to the selected word line WL and that among the memory cells MCs connected to the unselected word lines WLs is greater.

In each of the memory cells MCs for which the potential of the word line WL is low, the surface of the body 50 in contact with the gate is in an accumulated state and the body effect is weakened. Due to this, when electrons are injected from the back channel (first surface) of the body 50 into the ONO film 20 of each memory cell MC, a relatively high potential is applied to the selected front word line WL to turn the corresponding surface (second surface) of the body 50 into a depleted state. On the other hand, a relatively low potential is applied to unselected word lines WLs to turn corresponding surfaces (second surfaces) of the bodies 50 of the memory cells MCs into accumulated states.

Figure 18:
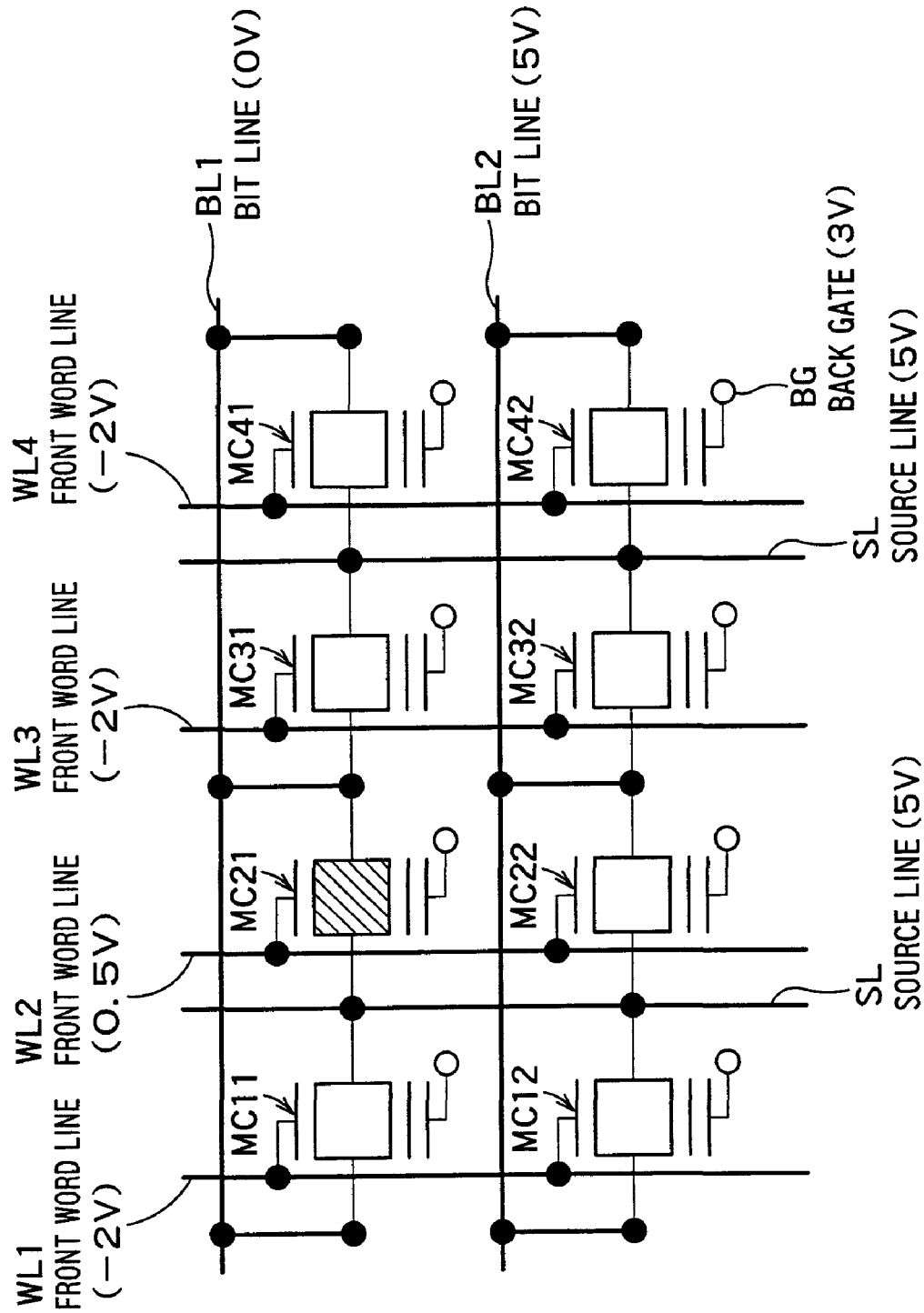
FIG. 18 is a schematic diagram showing yet another voltage state during trimming.

FIG. 18 is a schematic diagram showing yet another voltage state during trimming. FIG. 18 shows the voltage state if electrons are injected. In the voltage state shown in FIG. 18, the relationship between the source potential and the drain potential is opposite to that in the voltage state shown in FIG. 17. The other voltage relationships are similar to those shown in FIG. 17. A fifth voltage (e.g., 5 V) is applied to the source line SLs and a first voltage (e.g., 0 V) is applied to the selected bit line BL1. By doing so, the memory cell MC21 is selected and electrons are injected into the ONO film 20 of the memory cell MC21. In the voltage state shown in FIG. 17, the hot electrons are locally injected near the PN junction between the drain 40 and the body 50 of the selected memory cell MC21. In the voltage state shown in FIG. 18, electrons flow from the drain 40 to the source 60 of the memory cell MC21. Due to this, electrons are locally injected near the PN junction between the source 60 and the body 50 of the memory cell MC21. Either the trimming method shown in FIG. 17 or that shown in FIG. 18 can be selected depending on the threshold voltages of the memory cells MCs. Alternatively, both the trimming methods shown in FIGS. 17 and 18 can be adopted.

In FIG. 18, if a plurality of trimming target "0" cells are known among the memory cells MC2j connected to the front word line WL2, the plural "0" cells can be selected. A voltage of 0 V is applied to all the bit lines BLs to which the trimming target "0" cells are connected, and a voltage of 5 V is applied to the bit lines BLs to which the other "0" cells are connected. By doing so, the trimming target "0" cells connected to the front word line WL2 can be simultaneously trimmed. This operation is sequentially repeated for all the front word line WLs in the memory cell array MCA. It is thereby possible to trim the trimming target "0" cells in the memory cell MCA in a short time.

Figure 19:
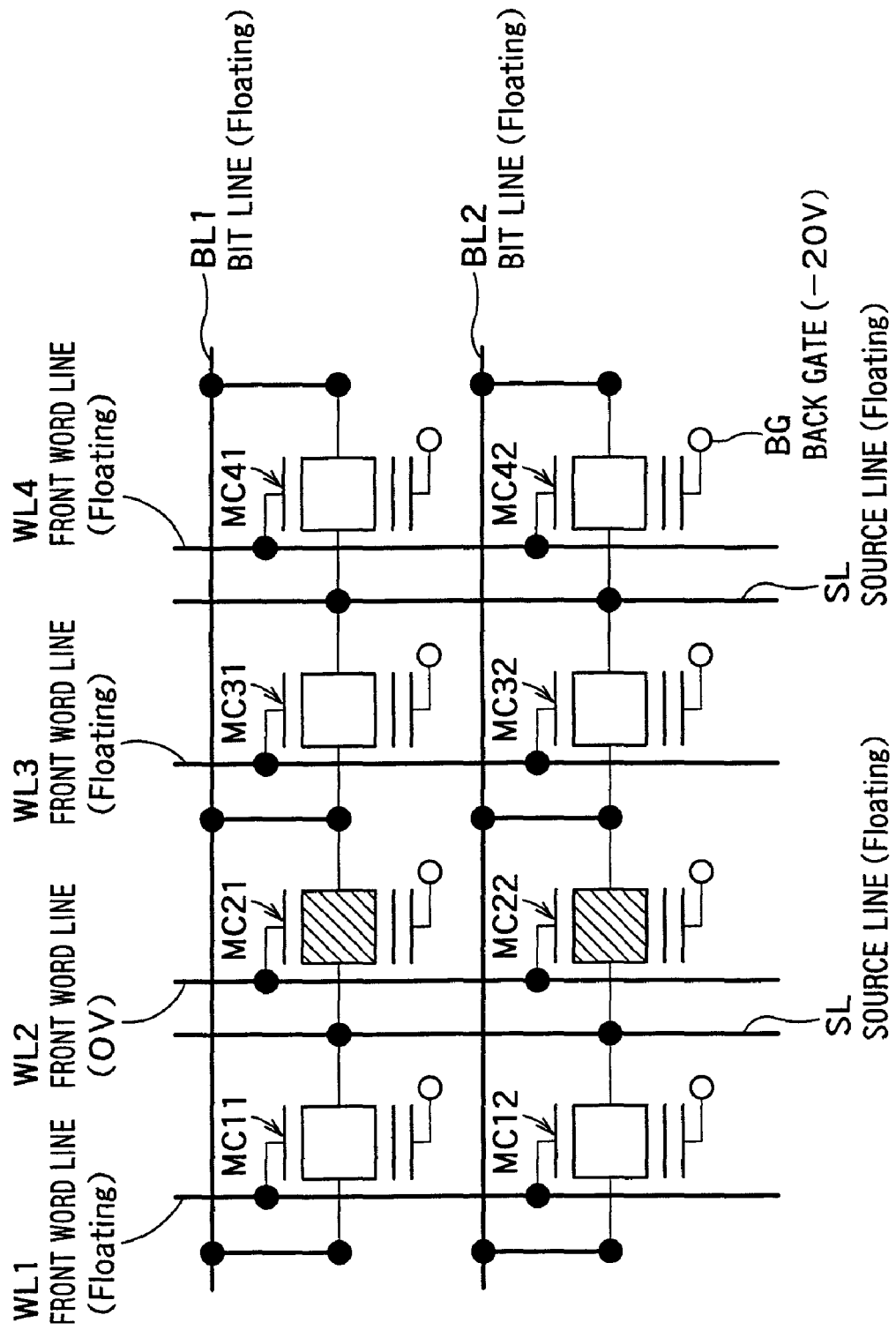
FIG. 19 is a schematic diagram showing still another voltage state during trimming.

FIG. 19 is a schematic diagram showing still another voltage state during trimming. FIG. 19 shows the voltage state if holes are injected. Holes are injected into the bodies 50 of the memory cells MCs necessary to trim. The injection of holes can be performed using either the impact ionization or the GIDL. By injecting holes, all the trimming target memory cells MCs are turned into states of storing therein data "1".

Next, as shown in FIG. 19, all the bit lines BL1 and BL2, the source lines SLs, and unselected word lines WL1, WL3, and WL4 are turned into floating states. Furthermore, a first voltage (e.g., 0 V) is applied to the selected word line WL2, and a second voltage (e.g., −20 V) lower than the first voltage is applied to the back gate BG. By doing so, holes accumulated in the bodies 50 of the "1" cells are injected into the respective ONO films 20 by the FN tunneling among the memory cells MCs connected to the front word line WL2. Since the number of holes accumulated in the body 50 of each "0" cell is small, no holes are injected into the ONO film 2 of each "0" cell. This operation is repeated for the other word lines WLs. As a result, it is possible to trim the threshold voltage of the trimming target "1" cells in the memory cell array MCA.

In this way, with the method of injecting holes shown in FIG. 19, majority carriers are accumulated in the body 50 of each of the trimming target memory cells MCs, thereby turning these memory cells MCs into "1" cells, and holes are selectively injected into the ONO films 20 of only the trimming target "1" cells. It is thereby possible to selectively trim the threshold voltage of the target "1" cells as stated above.

Second Embodiment

An FBC memory device according to a second embodiment of the present invention includes not a common back gate BG but back gate lines BWLs corresponding to respective front word lines WLs. Other configurations of the FBC memory device according to the second embodiment can be similar to those of the FBC memory device according to the first embodiment. Since a plan view of the FBC memory device according to the second embodiment is similar to that shown in FIG. 14, it will not be given.

Figure 20:
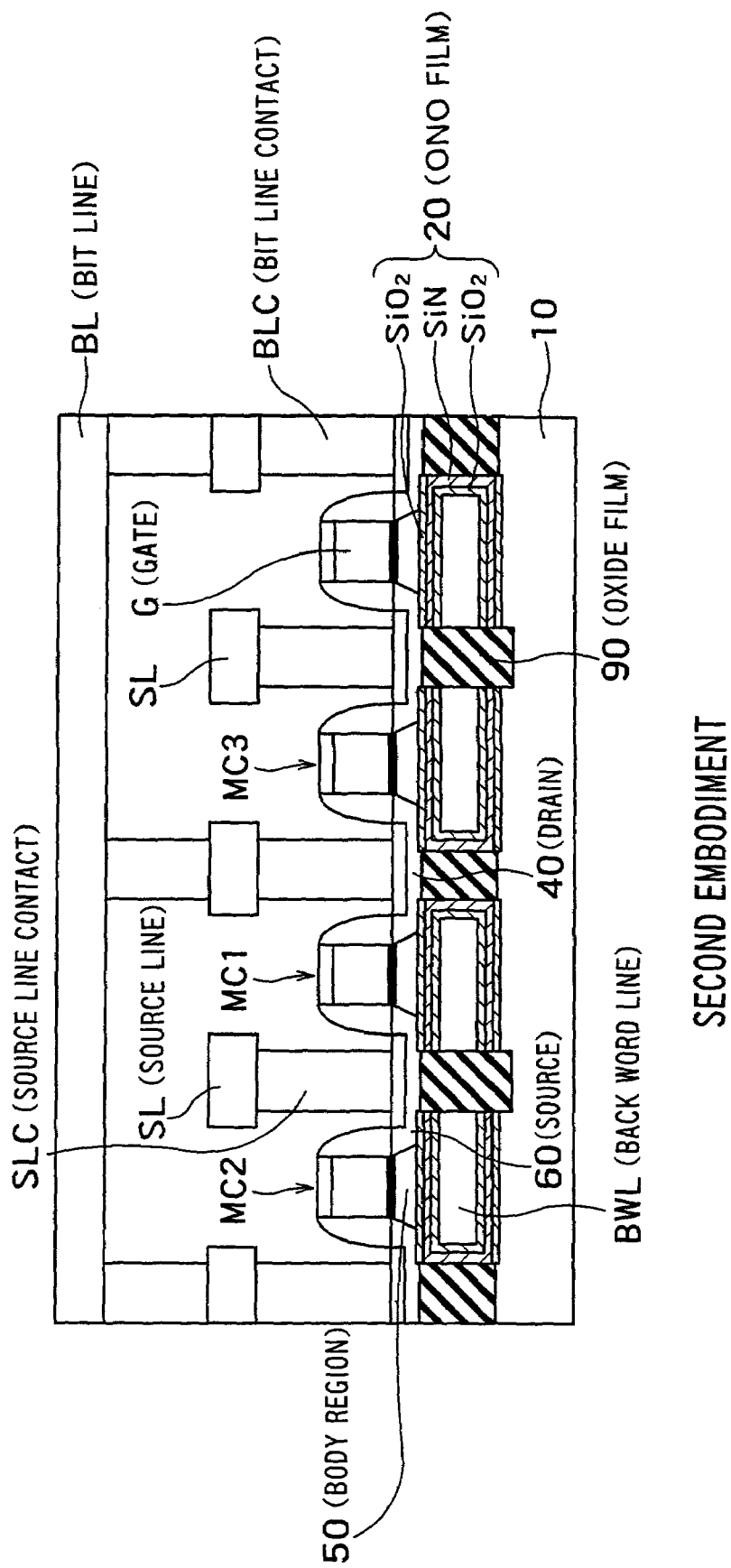
FIG. 20 is a cross-sectional view showing the FBC memory device according to the second embodiment.

FIG. 20 is a cross-sectional view of the FBC memory device according to the second embodiment. FIG. 20 corresponds to the cross section taken along the line 15-15 of FIG. 14. A silicon oxide film 90 is formed under the source 60 and the drain 40 of each of memory cells MCs. The silicon oxide film 90 separates a back word line BWL into a plurality of segments according to front word lines WLs. ONO films 20 are provided on a front surface and a back surface of the back word line BWL, respectively. The back word line BWL is thereby isolated from the body 50 of each memory cell MC and the silicon substrate 10.

A method of manufacturing the FBC memory device according to the second embodiment is described next.

Figure 21:
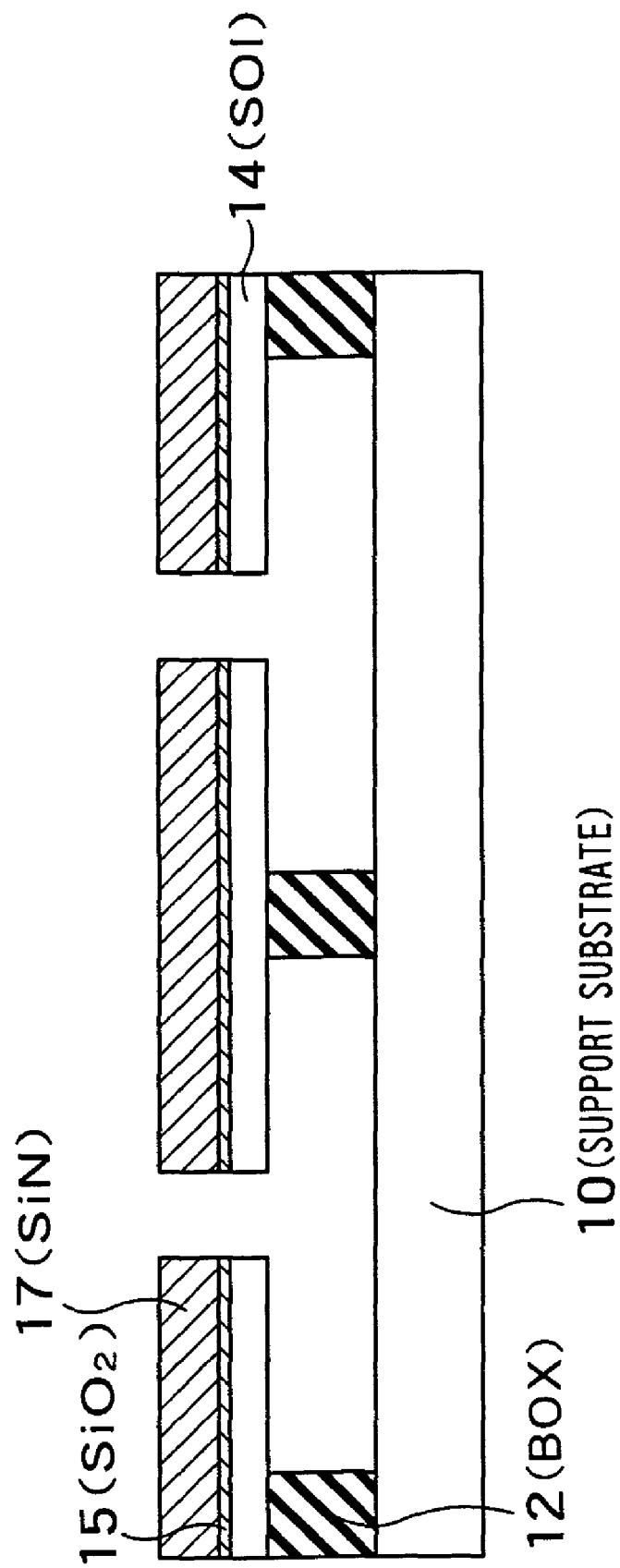
FIG. 21 is a cross-sectional view showing a manufacturing method of the FBC memory device according to the second embodiment.

First, an SOI substrate is prepared. A thickness of a BOX layer 12 on a supporting substrate (the silicon substrate) 10 is about 150 nm. A thickness of an SOI layer 14 on the BOX layer 20 is about 50 nm. Next, as shown in FIG. 21, a silicon oxide film 15 is formed on the SOI layer 14, and a silicon nitride film 17 is deposited on the silicon oxide film 15. A thickness of the silicon oxide film 15 is about 2 nm, and that of the silicon nitride film 17 is about 200 nm.

A resist pattern in which source line regions are opened is formed, and the silicon nitride film 17, the silicon oxide film 15, and the SOI layer 14 are etched by RIE. Using an NH$_4$F solution, the BOX layer 12 is wet etched. As a result, a cross-sectional structure shown in FIG. 21 is obtained. At this time, the BOX layer 12 is made to remain below drain regions. The BOX layer 12 functions as pillars that support the SOI layer 14.

Next, the SOI layer 14 is isotropically etched if it is necessary to do so. For example, the SOI layer 14 is etched by 25 nm to make the SOI layer 14 thinner. This is because memory cell characteristics (the threshold voltage difference between data "0" and "1" and the like) are improved if the silicon film of the body 50 is thinner. Further, a logic circuit region (not shown) is covered with a photoresist, and the thickness of the SOI layer 14 remains the original thickness (50 nm). It is, therefore, possible to make the thickness of the SOI layer 14 in a memory cell region different from that in the logic circuit region without adding a new lithography step. Moreover, in the second embodiment, the SOI layer 14 in the memory cell region is equal in surface height level to that in the logic circuit region. It is, therefore, possible to avoid deterioration in focus margin.

Figure 22:
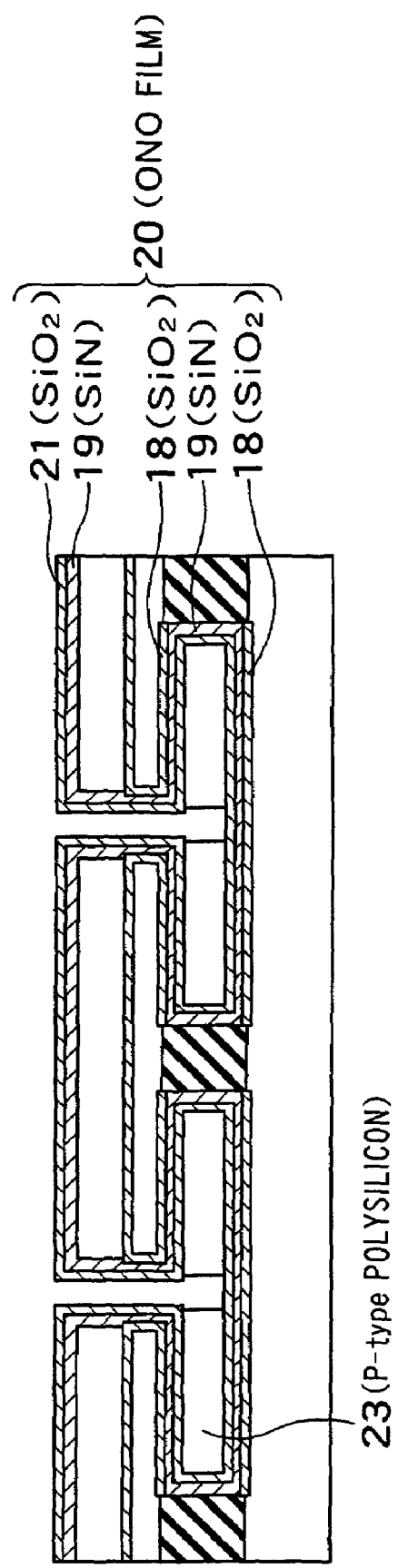
FIG. 22 is a cross-sectional view showing the manufacturing method of the FBC memory device following FIG. 21.

Next, as shown in FIG. 22, a silicon oxide film 18 is formed by thermal oxidation. A thickness of the silicon oxide film 18 is about 3 nm. A silicon nitride film 19 and a silicon oxide film 21 are sequentially deposited. A thickness of the silicon nitride film 19 is about 6 nm. A thickness of the silicon oxide film 21 is about 6 nm. Further, p-type polysilicon 23 is deposited. The p-type polysilicon 23 is etched back by the RIE. As a result, a cross-sectional structure shown in FIG. 22 is obtained. The silicon oxide film 18, the silicon nitride film 19, and the silicon oxide film 21 constitute the ONO film 20.

Figure 23:
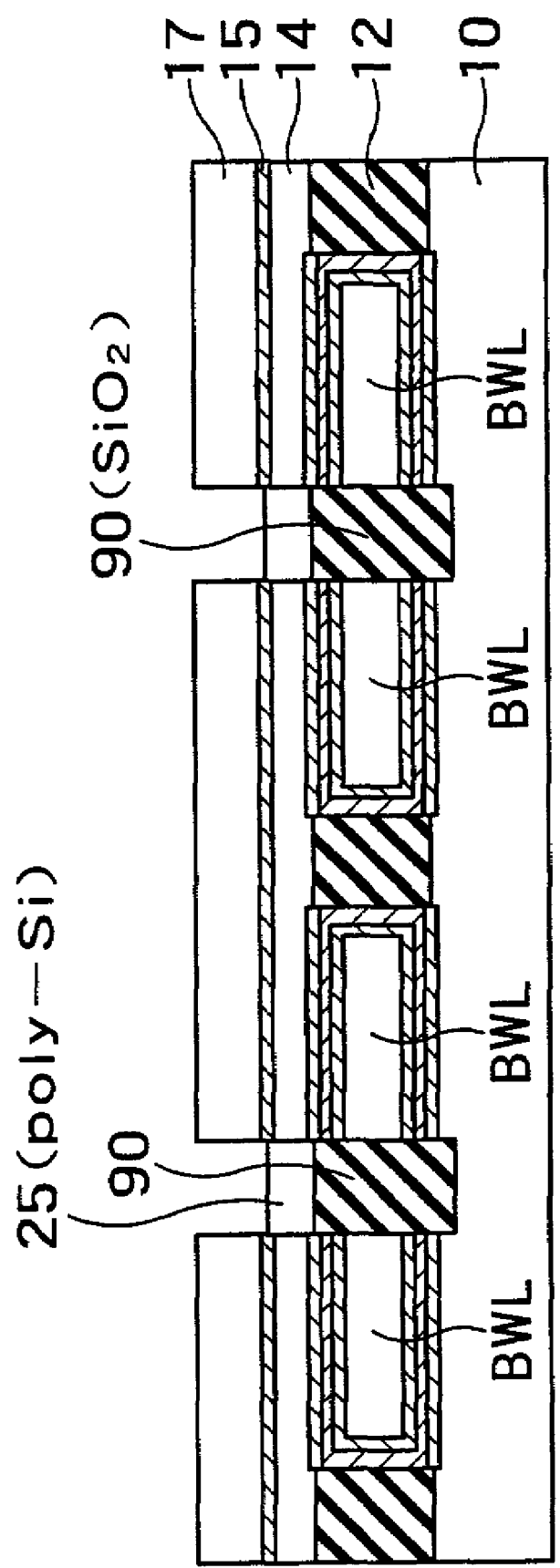
FIG. 23 is a cross-sectional view showing the manufacturing method of the FBC memory device following FIG. 22.

A silicon oxide film 90 is deposited and then etched back. Thereafter, polysilicon 25 is deposited and then etched back. As a result, a cross-sectional structure shown in FIG. 23 is obtained. The p-type polysilicon 23 is separated into back word lines BWLs.

An STI is formed, and p-type impurities are implanted into the bodies 50 and the supporting substrate 10. An impurity concentration of the bodies 50 is set to, for example, about $10^{17}$ cm$^{-3}$. P-type impurities such as boron impurities are appropriately implanted into the body regions of NMOS transistors constituting the logic circuit region.

Figure 24:
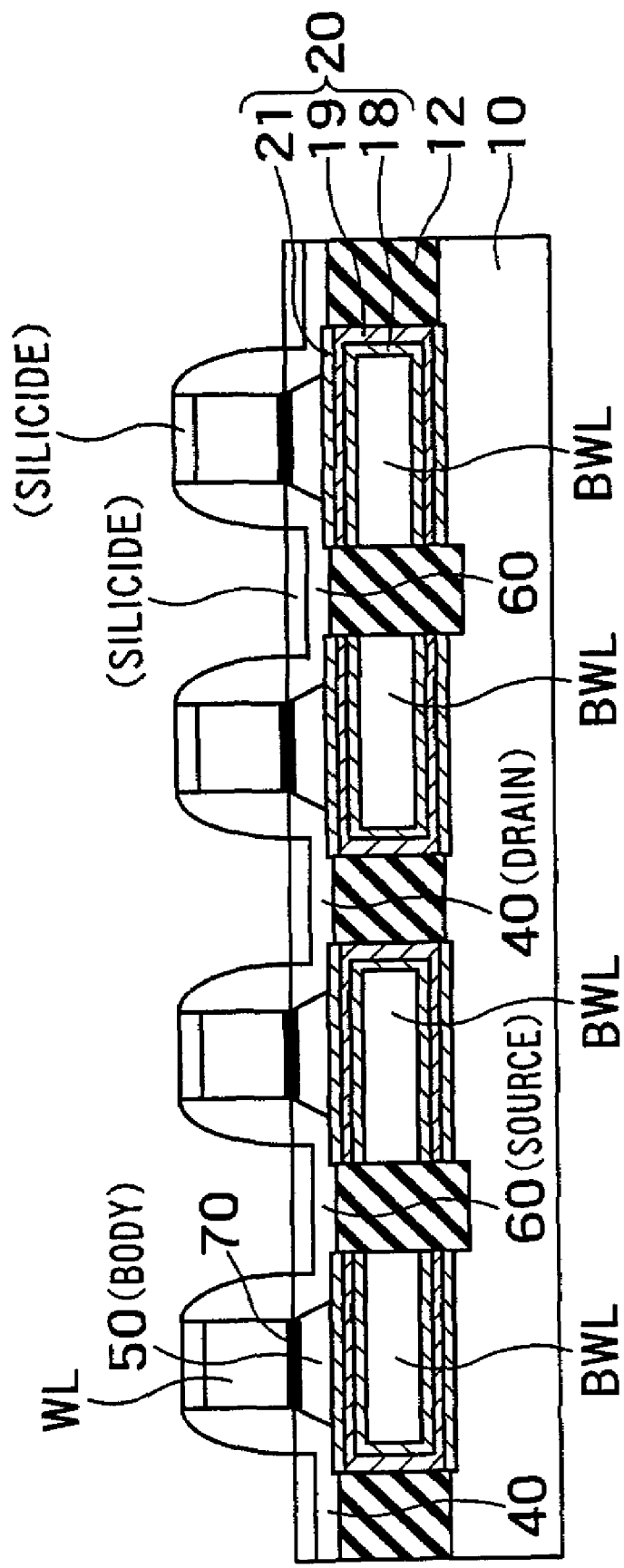
FIG. 24 is a cross-sectional view showing the manufacturing method of the FBC memory device following FIG. 23.

A gate insulating film 70 and a gate electrode (a word line WL) are formed on each of the bodies 50. N-type impurity ions are implanted into source and drain regions. Furthermore, a silicide layer is formed on a surface of each of the source and drain regions and the gate electrodes. As a result, a cross-sectional structure shown in FIG. 24 is obtained. Thereafter, conventional steps are executed, thereby forming an interlayer insulating film ILD, contacts SLCs and BLCs, wirings BLs and SLs. As a result, the FBC memory device shown in FIG. 20 is completed.

Figure 25:
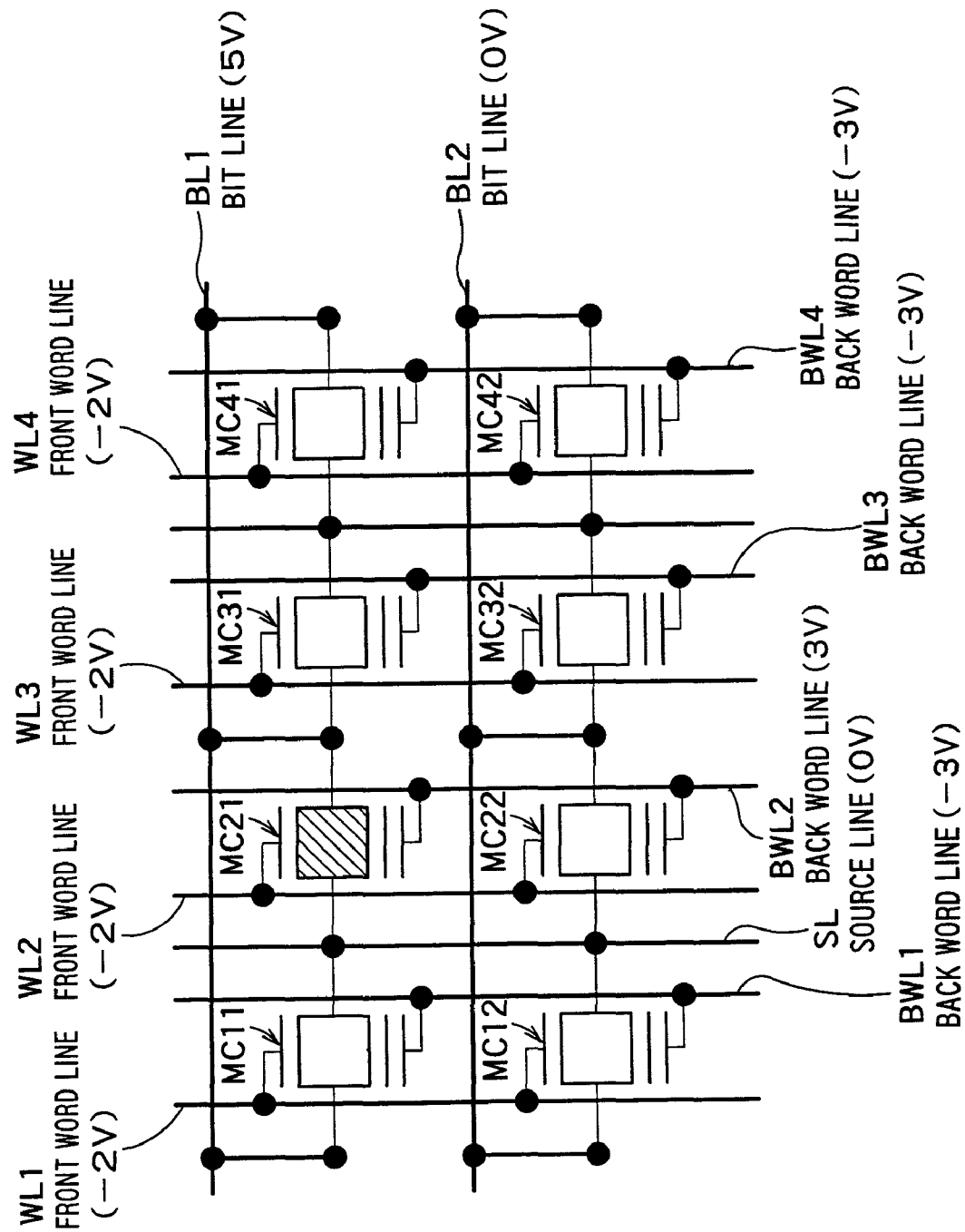
FIG. 25 is a schematic diagram showing a voltage state during trimming according to the second embodiment.

FIG. 25 is a schematic diagram showing a voltage state during trimming according to the second embodiment. FIG. 25 shows the voltage state if electrons are injected. In FIG. 25, the memory cell MC21 is a selected memory cell and the other memory cells MCs are unselected memory cells. A first voltage (e.g., 0 V) is applied to the source line SL common to the memory cells MCs. A second voltage (e.g., −2 V) is applied to all the front word lines WLs. A third voltage (e.g., −3 V) is applied to back word lines BWL1, BWL3, and BWL4 connected to the unselected memory cells MCs (unselected back word lines BWL1, BWL3, and BWL4). A fourth voltage (e.g., 3 V) higher than the third voltage is applied to a back word line BWL2 connected to the selected memory cell MC21 (a selected back word line BWL2). Further, a fifth voltage (e.g., 5 V) higher than the first voltage is applied to the bit line BL1 to which the selected memory cell MC21 is connected (selected bit line BL1), and the first voltage is applied to the other unselected bit line BL2. By selectively applying the relatively high fourth voltage to the selected back word line BWL2, a current flows in a back channel (first surface) of the memory cell MC21, and hot electrons generated by the current in the back channel are injected into the ONO film 20. This trimming operation is sequentially repeated for all the back word lines BWLs in each memory cell array. As a result, the memory cells MCs can be trimmed for all the back word lines BWLs.

If a plurality of trimming target memory cells MCs are known among memory cells MC2j connected to the front word line WL2 in FIG. 25, the plural memory cells MCs can be selected. A voltage of 5 V is applied to all the bit lines BLs to which the trimming target memory cells MCs are connected, and a voltage of 0 V is applied to the bit lines BLs to which the other memory cells MCs are connected. By doing so, it is possible to simultaneously trim the trimming target memory cells MCs connected to the front word line WL2. This operation is sequentially repeated for all the front word lines WLs. As a result, the trimming target memory cells MC in each memory cell array MCA can be trimmed in a short time.

In the second embodiment, the back word lines BWLs are provided to correspond to the respective front word lines WLs and can be independently controlled. It is thereby possible to select memory cells MCs in a certain row by the front word line WL or the back word line BWL, and to trim the selected memory cells MCs either individually or simultaneously.

Figure 26:
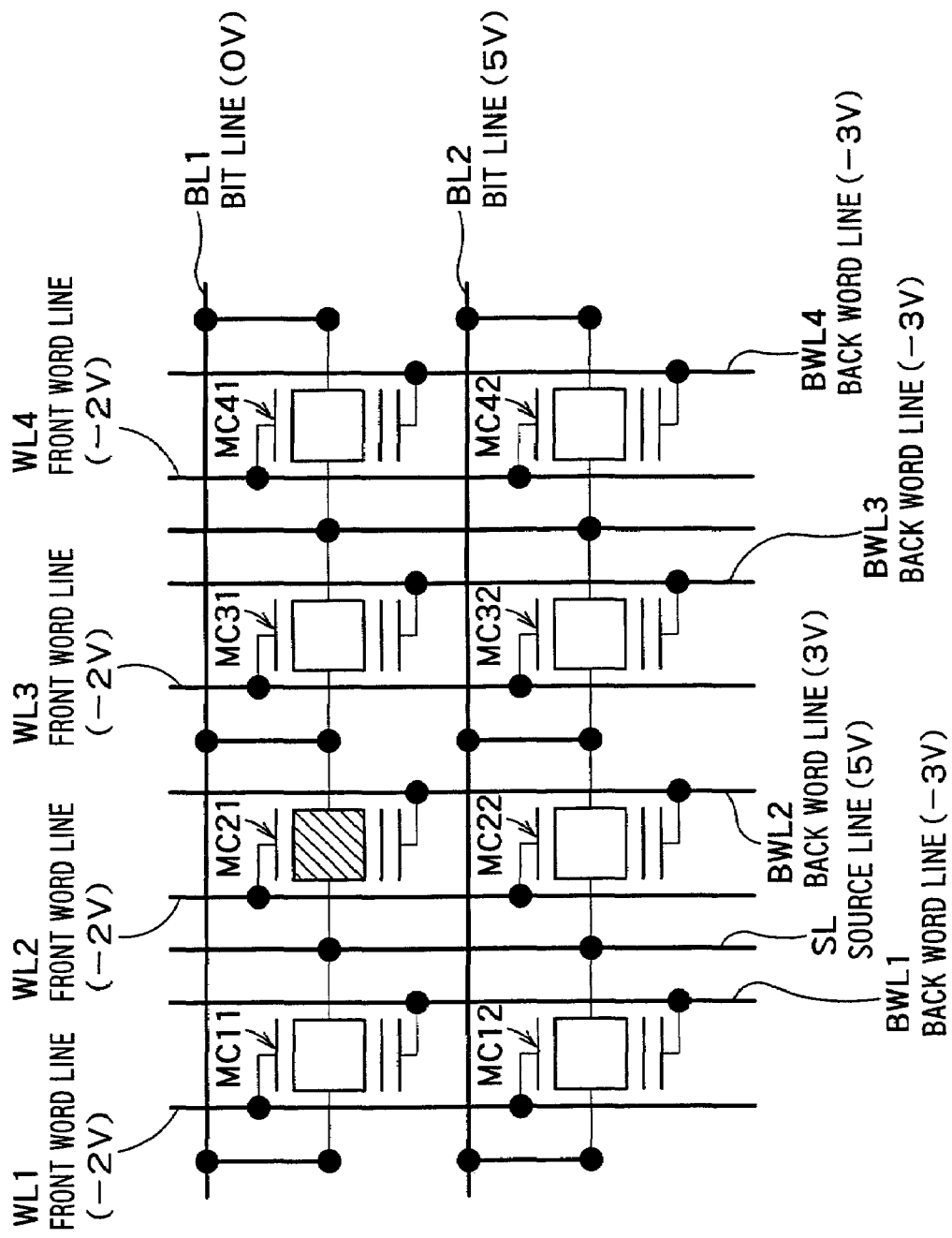
FIG. 26 is a schematic diagram showing another voltage state during trimming according to the second embodiment.

FIG. 26 is a schematic diagram showing another voltage state during trimming according to the second embodiment. FIG. 26 shows the voltage state if electrons are injected. In the voltage state shown in FIG. 26, the relationship between the source potential and the drain potential is opposite to that shown in FIG. 25. The other voltage relationships are similar to those shown in FIG. 25. A fifth voltage (e.g., 5 V) is applied to the source line SL, and a first voltage (e.g., 0 V) is applied to the selected bit line BL1. The memory cell MC21 is thereby selected, and electrons are injected into the ONO film 20 of the selected memory cell MC21. In the voltage state shown in FIG. 25, hot electrons are locally injected near the PN junction between the drain 40 and the body 50 of the selected memory cell MC21. However, in the voltage state shown in FIG. 26, hot electrons are locally injected near the PN junction between the source 60 and the body 50 of the selected memory cell MC21. Either the trimming method shown in FIG. 25 or that shown in FIG. 26 can be selected depending on the threshold voltages of the memory cells MCs. Alternatively, both the trimming methods shown in FIGS. 25 and 26 can be adopted.

In FIG. 26, if a plurality of trimming target memory cells MCs are known among the memory cells MC2j connected to the front word line WL2, the plural memory cells MCs can be selected. A voltage of 0 V is applied to all the bit lines BLs to which the trimming target memory cells MCs are connected and a voltage of 5 V is applied to the bit lines BLs to which the other memory cells MCs are connected, respectively. By doing so, the trimming target memory cells MCs connected to the front word line WL2 can be simultaneously trimmed. This operation is sequentially repeated for all the front word line WLs in each memory cell array. It is thereby possible to trim the trimming target memory cells MCs in the memory cell area MCA in a short time.

Figure 27:
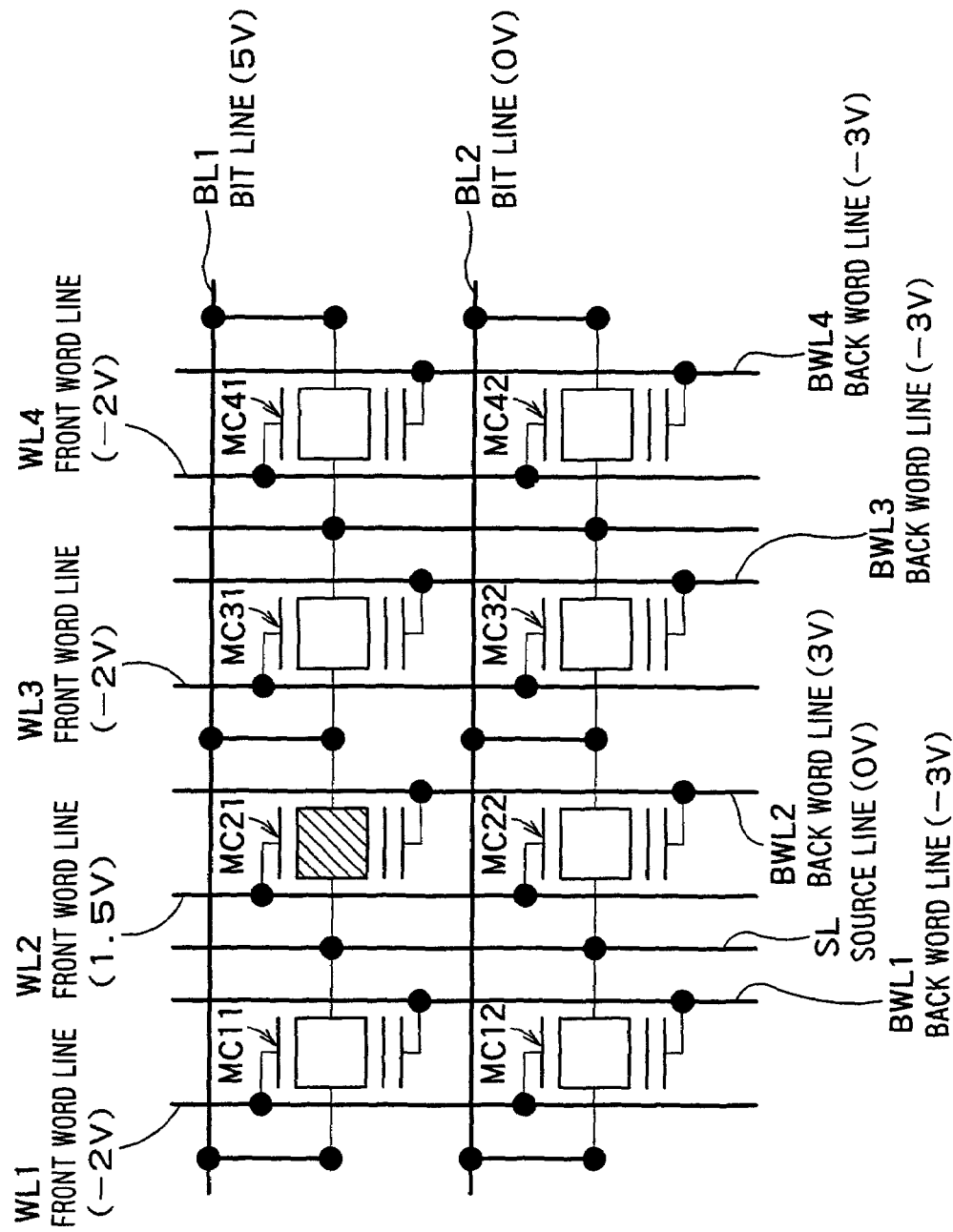
FIG. 27 is a schematic diagram showing still another voltage state during trimming according to the second embodiment.

FIG. 27 is a schematic diagram showing still another voltage state during trimming according to the second embodiment. FIG. 27 shows the voltage state if electrons are injected. The memory cell MC21 is a selected memory cell and the other memory cells MCs are unselected memory cells MCs. A first voltage (e.g., 0 V) is applied to the source line SL common to the memory cells MCs. A second voltage (e.g., −2 V) is applied to front word lines WL1, WL3, and WL4 connected to the unselected memory cells MCs (unselected word lines WL1, WL3, and WL4). A third voltage (e.g., 0.5 V) higher than the second voltage is applied to the front word line WL2 connected to the selected memory cell MC21 (the selected front word line WL2). A fourth voltage (e.g., −3 V) is applied to back word lines BWL1, BWL3, and BWL4 connected to the unselected memory cells MCs (unselected back word lines BWL1, BWL3, and BWL4). A fifth voltage (e.g., 3 V) higher than the third voltage is applied to the word line BWL2 connected to the selected memory cell MC21 (selected word line BWL2). Further, a sixth voltage (e.g., 5 V) higher than the first voltage is applied to the bit line BL1 to which the selected memory cell MC21 is connected (selected bit line BL1). By doing so, a current flows in the back channel (first surface) of the selected memory cell MC2, and electrons generated as a result of the current in the back channel are injected into the ONO film 20.

By making the voltage of the selected front word line WL2 different from those of the other front word lines WLs, the threshold voltage on the back surface of the body 50 of each of the unselected memory cells MCs is higher than that of the selected memory cell MC21. Therefore, in the voltage state shown in FIG. 27, a ratio of the drain current of the unselected memory cells MCs to that of the selected memory cell MC21 is low and selectivity is improved, as compared with the voltage state shown in FIG. 16 or 25. In other words, in the example shown in FIG. 27, the trimming can be completed at a low drain voltage in a short time, as compared with that shown in FIG. 16 or 25.

Figure 28:
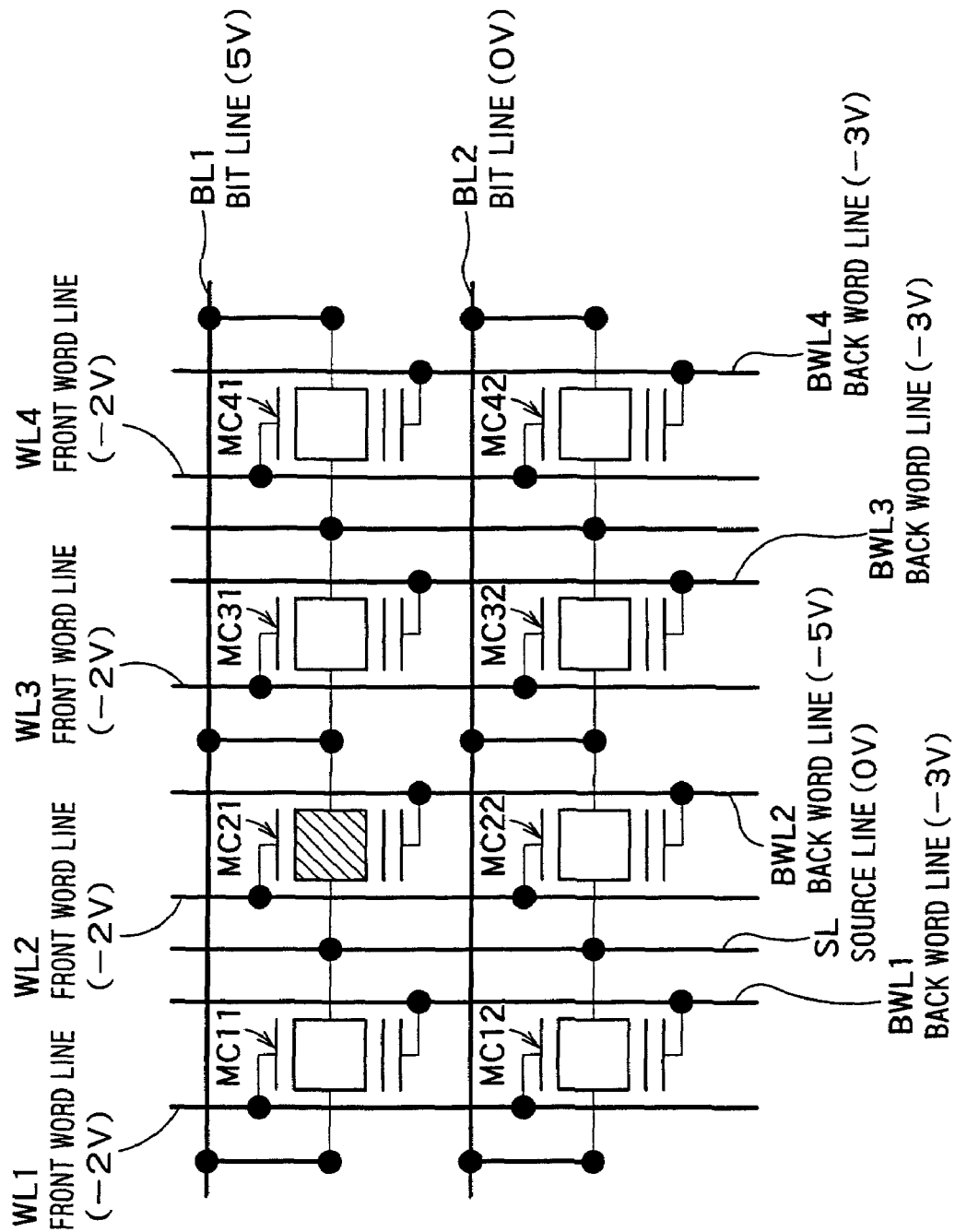
FIG. 28 is a schematic diagram showing still another voltage state during trimming according to the second embodiment.

FIG. 28 is a schematic diagram showing still another voltage state during trimming according to the second embodiment. FIG. 28 shows the voltage state if holes are injected. The memory cell MC21 is a selected memory cell and the other memory cells MCs are unselected memory cells MCs. A first voltage (e.g., 0 V) is applied to the source line SL common to the memory cells MCs. A second voltage (e.g., −2 V) is applied to all the front word lines WLs. A third voltage (e.g., −3 V) is applied to the unselected back word lines BWL1, BWL3, and BWL4. A fourth voltage (e.g., −5 V) is applied to the back word line BWL2 connected to the selected memory cell MC21 (selected back word line BWL2). A fifth voltage (e.g., 5 V) higher than the first voltage is applied to the word line BWL1 to which the selected memory cell MC21 is connected (selected word line BWL1), and the first voltage is applied to the other unselected bit line BL2. By doing so, holes are generated near the drain 40 by the band-to-band tunneling. The holes are given energy by the electric field between the drain 40 and the body 50 of the selected memory cell MC21, transformed into hot holes, and injected into the ONO film 20 of the selected memory cell MC21. This trimming operation is sequentially repeated for all the back word lines BWLs in each memory cell array MCA. It is thereby possible to trim the memory cells MCs for all the back word lines BWLs.

In FIG. 28, if a plurality of trimming target memory cells MCs are known among the memory cells MC2j connected to the back word line BWL2, the plural memory cells MCs can be selected. A voltage of 5 V is applied to all the bit lines BLs to which the trimming target memory cells MCs are connected and a voltage of 0 V is applied to the bit lines BLs to which the other memory cells MCs are connected, respectively. By doing so, the trimming target memory cells MCs connected to the back word line BWL2 can be simultaneously trimmed. This operation is sequentially repeated for all the front word line in each memory cell array MCA. It is thereby possible to trim the trimming target memory cells MCs in each memory cell array MCA in a short time.

Figure 29:
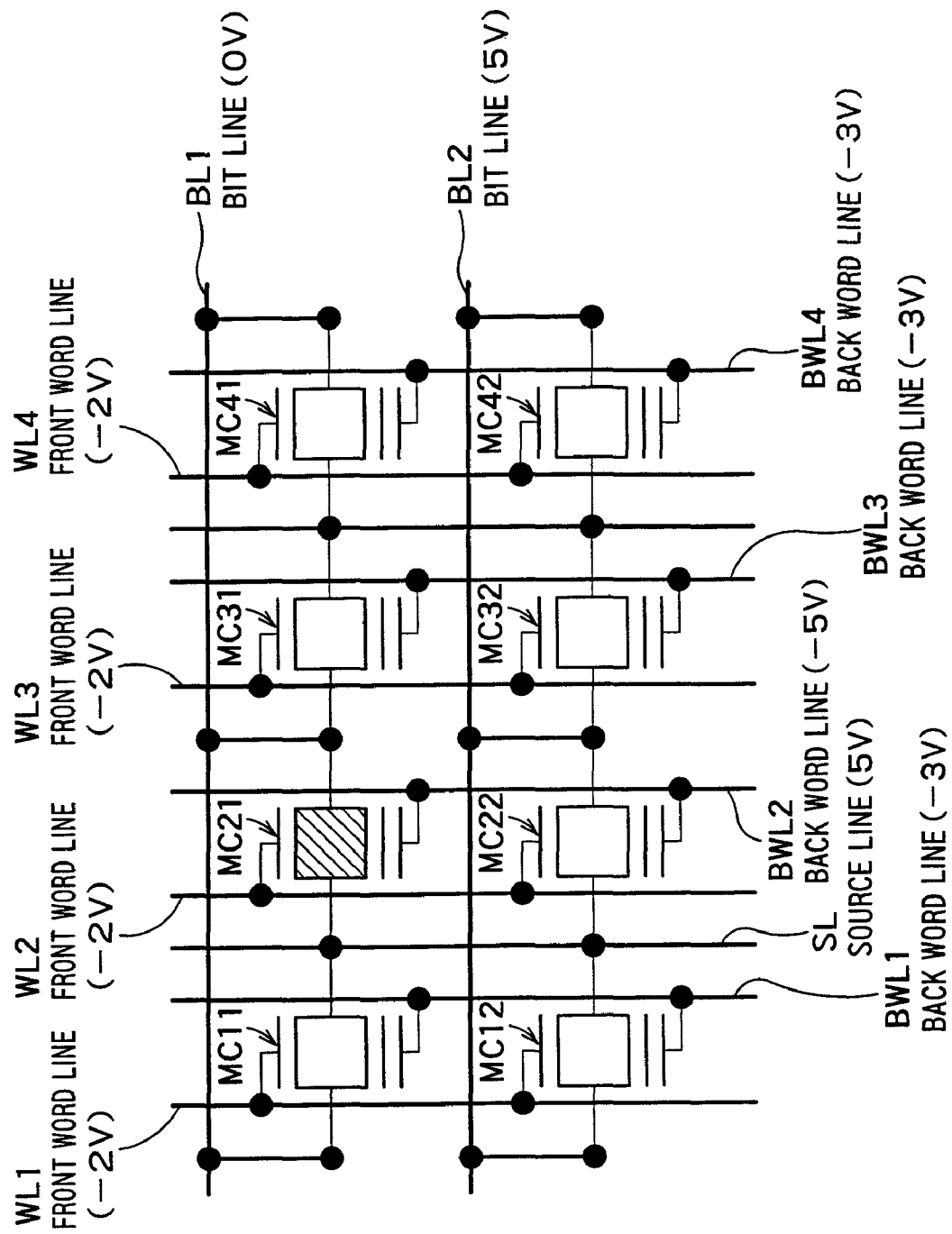
FIG. 29 is a schematic diagram showing still another voltage state during trimming according to the second embodiment.

FIG. 29 is a schematic diagram showing still another voltage state during trimming according to the second embodiment. FIG. 29 shows the voltage state if holes are injected. In the voltage state shown in FIG. 29, the relationship between the source potential and the drain potential is opposite to that shown in FIG. 28. The other voltage relationships are similar to those shown in FIG. 28. A fifth voltage (e.g., 5 V) is applied to the source line SL, and a first voltage (e.g., 0 V) is applied to the selected bit line BL1. The memory cell MC21 is thereby selected, and holes are injected into the ONO film 20 of the selected memory cell MC21. In the voltage state shown in FIG. 28, hot holes are locally injected near the PN junction between the drain 40 and the body 50 of the selected memory cell MC21. However, in the voltage state shown in FIG. 29, hot holes are locally injected near the PN junction between the source 60 and the body 50 of the selected memory cell MC21. Either the trimming method shown in FIG. 28 or that shown in FIG. 29 can be selected depending on the threshold voltages of the memory cells MCs. Alternatively, both the trimming methods shown in FIGS. 28 and 29 can be adopted.

In FIG. 29, if a plurality of trimming target memory cells MCs are known among the memory cells MC2j connected to the back word line BWL2, the plural memory cells MCs can be selected. A voltage of 0 V is applied to all the bit lines BLs to which the trimming target memory cells MCs are connected, and a voltage of 5 V is applied to the bit lines BLs to which the other memory cells MCs are connected, respectively. By doing so, the trimming target memory cells MCs connected to the back word line BWL2 can be simultaneously trimmed. This operation is sequentially repeated for all the front word line in each memory cell array. It is thereby possible to trim the trimming target memory cells MCs in the memory cell MCA in a short time.

Next, a result of a simulation for verifying the advantages of the first and second embodiments will be described.

Figure 30:
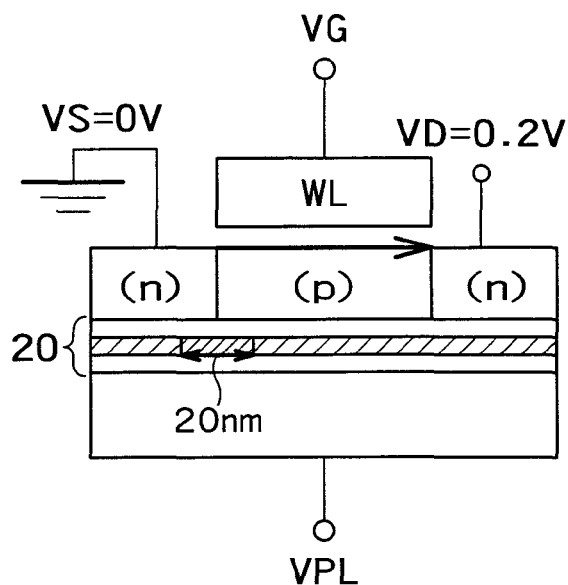
FIG. 30 is a cross-sectional view showing a manner of reading data from the memory cell MC after trimming according to the first or second embodiment.

FIG. 30 is a cross-sectional view showing a manner of reading data from the memory cell MC after trimming according to the first or second embodiment. The threshold voltage is largely influenced near a position at which the trapped charges are held. In FIG. 30, the charges are trapped in the ONO film 20 near the junction between the source 60 and the drain 40. The charges are trapped in the silicon nitride film having a width of 20 nm in the ONO film 20, and an area density of charges is about $1 \times 10^{13}$ cm$^{-2}$. If the charges are electrons, the voltages are set so that electrons flow in a direction of an arrow shown in FIG. 30 (a direction from the source to the drain), and as a result, a larger threshold voltage difference ΔVt is obtained in reading the data "1" and "0" according to the number of majority carriers accumulated in the respective bodies 50.

Figure 31:
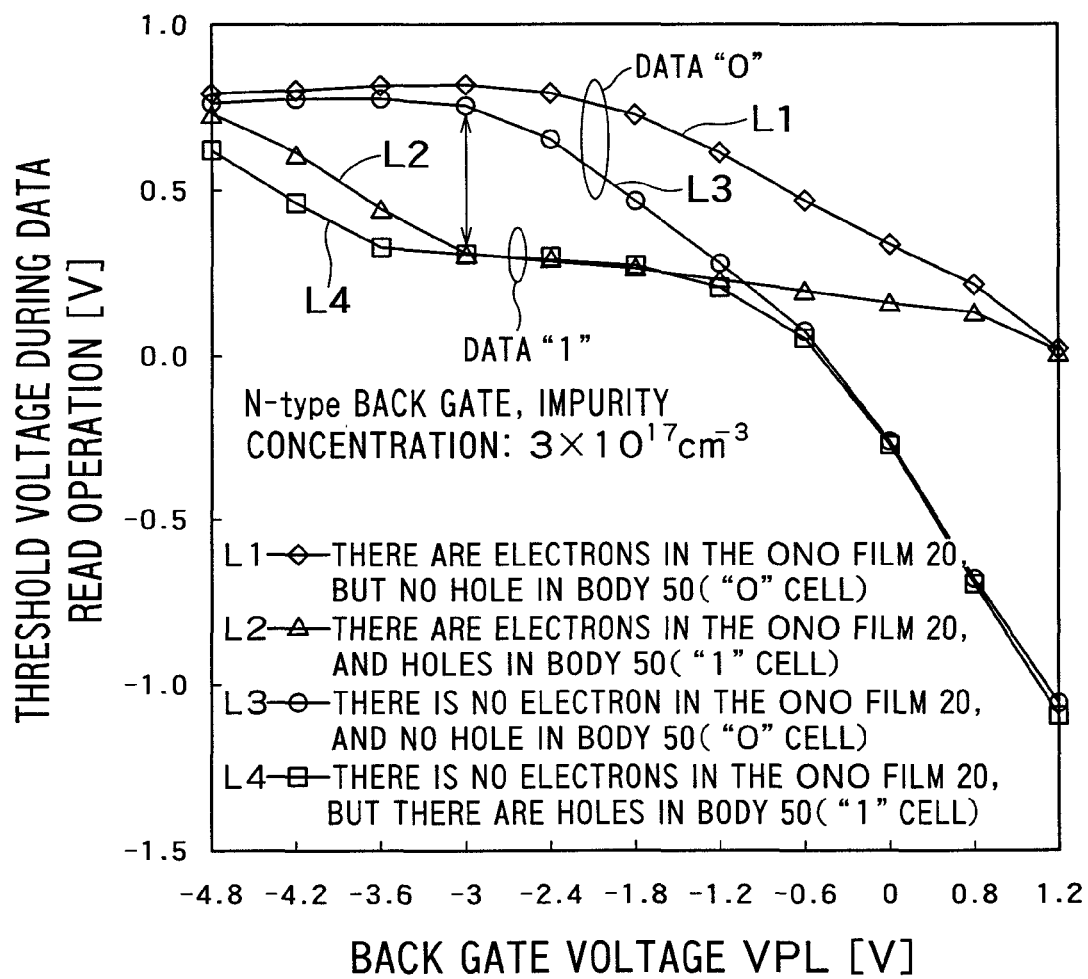
FIG. 31 is a graph showing the threshold voltage difference ΔVt when data is read using the state shown in FIG. 30.

FIG. 31 is a graph showing the threshold voltage difference ΔVt when data is read using the state shown in FIG. 30. The gate length, the thickness of the SOI layer 14, the thickness of the ONO film 20 and the like are identical to those described with reference to FIG. 3. In FIG. 31, a horizontal axis indicates the back gate voltage and a vertical axis indicates the threshold voltage during the read operation. The back gate is an N-type semiconductor and an impurity concentration thereof is about $3 \times 10^{17}$ cm$^{-3}$.

Lines L1 and L2 are those of the memory cells MCs in each of which trapped electrons are present in the ONO film 20. Lines L3 and L4 are those of the memory cells MCs in each of which no trapped electrons are present in the ONO film 20. Furthermore, the lines L1 and L3 are those of "0" cells and the lines L2 and L4 are those of "1" cells.

If the back gate voltage is −3 V and no trapped electrons are present in the ONO film 20, the threshold voltage of the "0" cells is about 0.749 V and that of the "1" cells is about 0.299 V. If the back gate voltage is −3 V and trapped electrons are present in the ONO film 20, the threshold voltage of the "0" cells is about 0.811 V and that of the "1" cells is about 0.310 V. In this way, the simulation indicates that the threshold voltage of "0" cell is increased by 60 mV by the trimming. The threshold voltage of "1" cell is increased a little. Accordingly, the threshold voltage difference ΔVth between the data "1" and "0" is increased.

Figure 32:
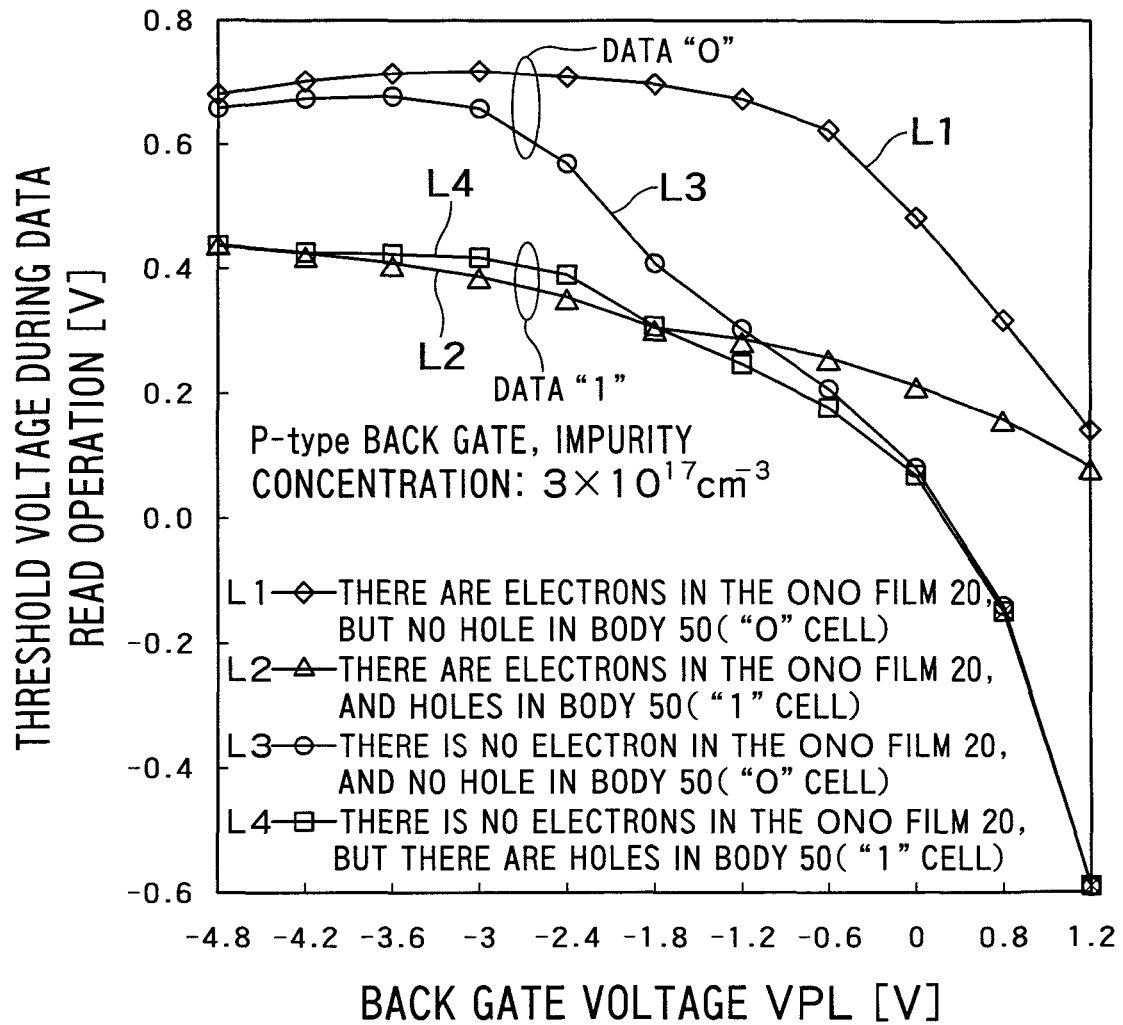
FIG. 32 is a graph showing the threshold voltage difference ΔVth when data is read using the state shown in FIG. 30.

FIG. 32 is a graph showing the threshold voltage difference ΔVth when data is read using the state shown in FIG. 30. The gate length, the thickness of the SOI layer 14, the thickness of the ONO film 20 and the like are identical to those described with reference to FIG. 3. The back gate is a P-type semiconductor and an impurity concentration thereof is about $3 \times 10^{17}$ cm$^{-3}$.

If the back gate voltage is −3 V and no trapped electrons are present in the ONO film 20, the threshold voltage of the "0" cells is about 0.654 V and that of the "1" cells is about 0.414 V. If the back gate voltage is −3 V and trapped electrons are present in the ONO film 20, the threshold voltage of the "0" cells is about 0.718 V and that of the "1" cells is about 0.385 V. In this way, the simulation indicates that the threshold voltage of "0" cell is increased by 64 mV by the trimming. The threshold voltage of "1" cell is increased a little. Accordingly, the threshold voltage difference ΔVth between the data "1" and "0" is increased.

Figure 33:
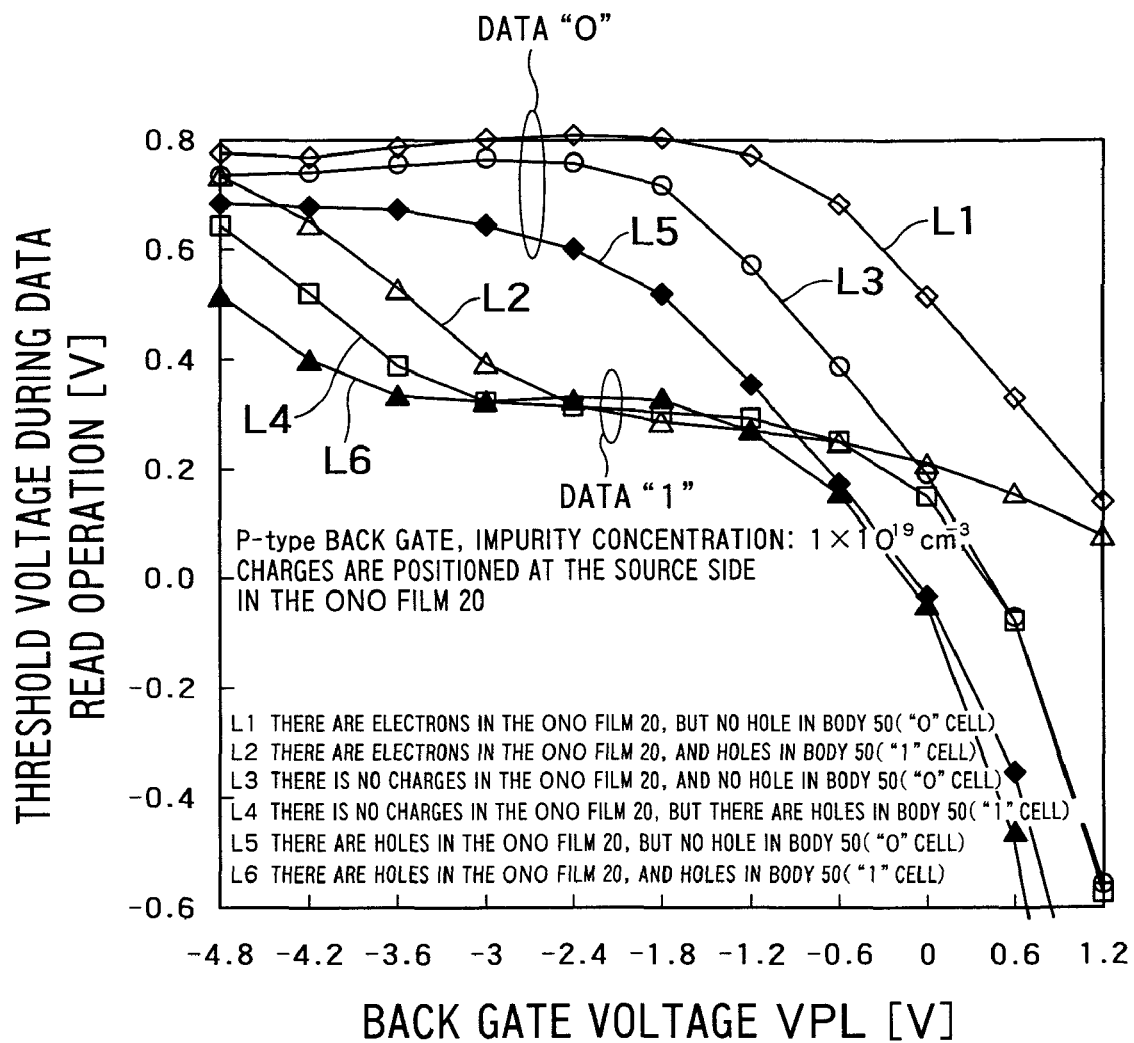
FIG. 33 is a graph showing the threshold voltage difference ΔVt when data is read using the state shown in FIG. 30.

FIG. 33 is a graph showing the threshold voltage difference ΔVt when data is read using the state shown in FIG. 30. The gate length, the thickness of the SOI layer 14, the thickness of the ONO film 20 and the like are identical to those described with reference to FIG. 3. The back gate is a P-type semiconductor and an impurity concentration thereof is about $1 \times 10^{19}$ cm$^{-3}$.

If the back gate voltage is −2.4 V and no trapped electrons are present in the ONO film 20, the threshold voltage of the "0" cells is about 0.751 V and that of the "1" cells is about 0.305 V. If the back gate voltage is −2.4 V and trapped electrons are present in the ONO film 20, the threshold voltage of the "0" cells is about 0.806 V and that of the "1" cells is about 0.314 V. In this way, the simulation indicates that the threshold voltage of "0" cell is increased by 55 mV by the trimming. Accordingly, the threshold voltage difference ΔVt between the data "1" and "0" is increased.

As stated so far, if the trapped electrons are present in the ONO film 20 near the PN junction between the source 60 and the body 50 of the "0" cell, the threshold voltage of the "0" cell rises and the threshold voltage difference ΔVt is increased, accordingly, irrespectively of the conduction type of the back gate.

Lines L5 and L6 in FIG. 33 indicate results of injecting holes into the ONO film 20 near the junction between the source 60 and the body 50 of each memory cell MC. In this case, the threshold voltage of each "1" cell has no change.

Figure 34:
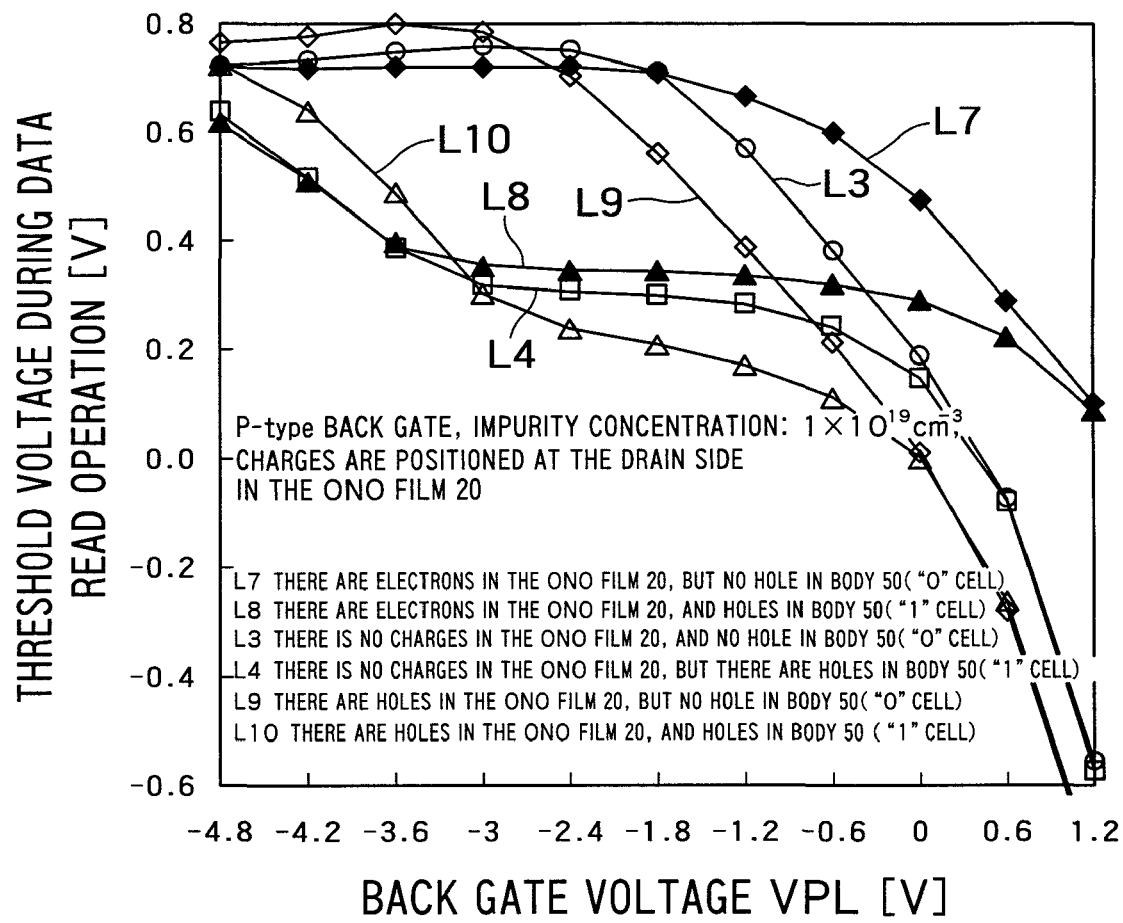
FIG. 34 is a graph showing the threshold voltage difference ΔVth when data is read using the state shown in FIG. 30.

FIG. 34 is a graph showing the threshold voltage difference ΔVth when data is read using the state shown in FIG. 30. The gate length, the thickness of the SOI layer 14, the thickness of the ONO film 20 and the like are identical to those described with reference to FIG. 3. The back gate is a P-type semiconductor and an impurity concentration thereof is about $1 \times 10^{19}$ cm$^{-3}$. FIG. 34 is a graph if charges are held in the ONO film 20 proximate to the PN junction between the drain 40 and the body 50 of each memory cell MC. Lines L7 and L8 indicate results of injecting electrons. To read data from each memory cell MC, the back gate voltage is set to, for example, −2.4 V. In this case, the threshold voltage difference ΔVth between the data "0" and "1" is about 0.374 V. Further, if trapped electrons are present on the source side as described with reference to FIG. 33, the threshold voltage difference ΔVth is 0.492 V. Therefore, the trapped electrons are preferably present on the source side.

Lines L9 and L10 indicate results of injecting holes into the ONO film 20 near the junction between the drain 40 and the body 50 of each memory cell MC. By injecting holes into the ONO film 20, the threshold voltage of each "1" cell is reduced when the back gate voltage is equal to or lower than −2.4 V. As evident from FIGS. 33 and 34, the holes are preferably injected into the ONO film 20 near the junction between the drain 40 and the body 50 of each "1" cell so as to trim the "1" cells.

It is known that the drain current difference is hardly generated according to the position of holding electrons according to the conventional technique, i.e., if the transistor is operated in the linear region (e.g., operate at low voltage such as the drain voltage of 0.2 V relative to the gate voltage of 1.5 V) in each nonvolatile memory cell holding data according to charges in the ONO film 20. In other words, the threshold voltage difference ΔVth is hardly generated between the case of holding charges near the source of each memory cell MC and the case of holding charges near the drain thereof. However, if each of the memory cells MCs of the FBC memory device according to the second embodiment dynamically holds data ("1" or "0") according to the number of holes accumulated in the body 50 of each of the memory cells MCs and if electrons are held in the ONO film 20 proximate to the source 60 or held in the ONO film 20 proximate to the drain 40, a change of "1" cell threshold voltage is different from that of "0" cell threshold voltage, and as a result, the threshold voltage difference ΔVth changes due to the trapped electrons as shown in FIGS. 31 to 34. By using the changed threshold voltage difference ΔVth for the trimming function, the defective bit counts of the FBC memory device decreases.

Third Embodiment

Figure 35:
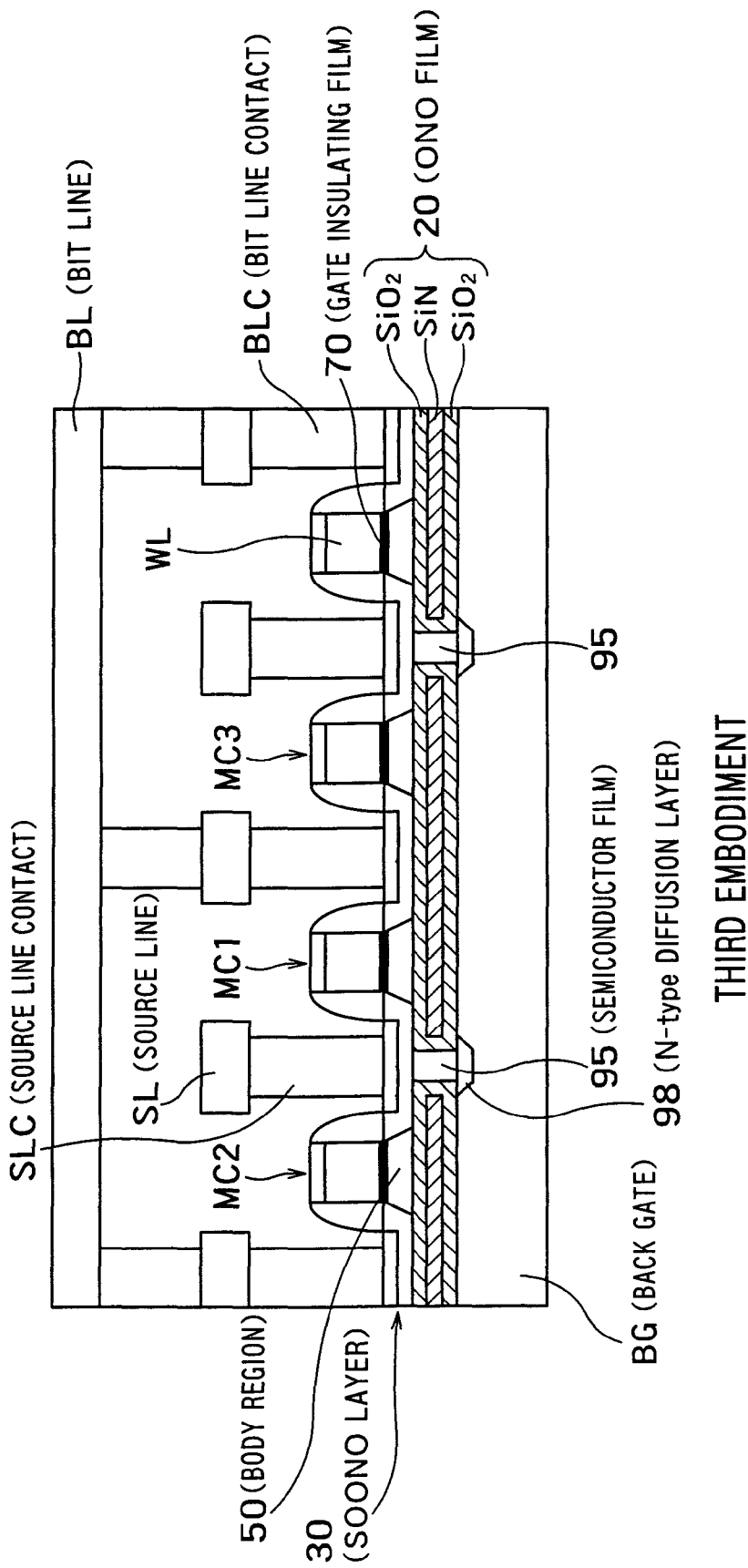
FIG. 35 is a cross-sectional view of an FBC memory device according to a third embodiment of the present invention.

FIG. 35 is a cross-sectional view of an FBC memory device according to a third embodiment of the present invention. The cross-section shown in FIG. 35 corresponds to that taken along the line 15-15 of FIG. 14. In the third embodiment, the ONO film 20 is not provided under each source 60, and each source 60 is electrically connected to the silicon substrate 10 via a semiconductor film 95. The semiconductor film 95 is made of an N-type semiconductor. An N-type diffusion layer 98 diffused from the semiconductor film 95 is provided under the semiconductor film 95. The silicon layer 30, the ONO film 20, the N-type diffusion layer 98, and the back gate (silicon substrate 10) constitute a gated diode. The gated diode is structured to include a PN junction between a P-type semiconductor and the N-type diffusion layer formed on a surface of the P-type semiconductor, a gate insulating film formed on the N-type diffusion layer, and a gate electrode. Other configurations of each of the memory cells MCs of the FBC memory device according to the third embodiment can be similar to those shown in FIG. 15.

Figure 36:
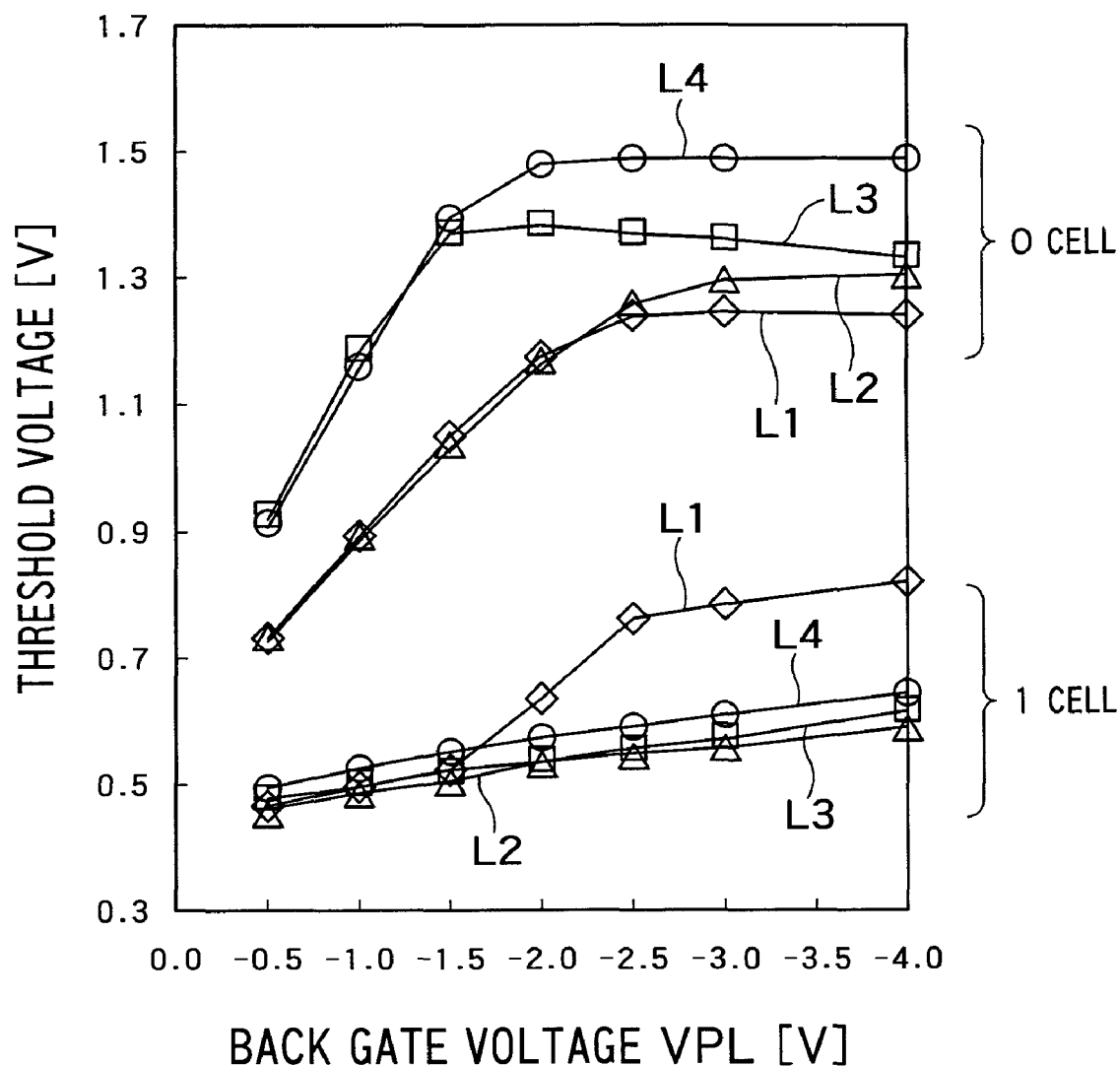
FIG. 36 is a graph showing a result of a simulation made to the FBC memory device according to the third embodiment.

FIG. 36 is a graph showing a result of a simulation made to the FBC memory device according to the third embodiment. The thickness of the silicon layer 30 of each of the memory cells MCs used in this simulation is about 15 nm. The thickness of the ONO film 20 thereof is about 8 nm. The thickness of the gate insulating film 70 thereof is about 6 nm. The gate length is about 0.12 μm. An impurity concentration of a channel is about $1\times10^{17}$ $cm^{-3}$.

Lines L1 and L2 indicate results of the memory cells MCs if the back gate is a P-type semiconductor and the impurity concentration of the back gate is about $1\times10^{18}$ $cm^{-3}$. Lines L3 and L4 indicate results of the memory cells MCs if the back gate is a P-type semiconductor and the impurity concentration of the back gate is about $1\times10^{19}$ $cm^{-3}$. The lines L1 and L3 indicate results if the source 60 is not connected to the silicon substrate 10. The lines L2 and L4 indicate results if the source 60 is connected to the silicon substrate 10. Namely, the lines L2 and L4 indicate results of the FBC memory device according to the third embodiment.

In case of the line L1, the threshold voltage of "1" cell rises and nears that of "0" cell. As a result, the threshold voltage difference ΔVth is reduced for the following reason. If the back gate voltage is lower than −1.5 V, then the surface of the back gate turns into an inversion state, and the capacitance between the body 50 and the back gate decreases.

In case of the line L2, the source 60 is connected to the silicon substrate 10. The gated diode described with reference to FIG. 35 is formed on the surface of the back gate. If the surface of the back gate is inverted, electrons are supplied from the N-type diffusion layer 98 of the gated diode to the inversion layer. Due to this, a width of the depletion layer formed on the surface of the back gate becomes smaller and the capacitance between the body 50 and the back gate increases. As a result, it is possible to suppress the threshold voltage of "1" cell from rising.

In a region in which the back gate voltage is low, the threshold voltage of "0" cell indicated by the line L2 is higher than that indicated by the line L1 for the following reason. Since the source 60 is connected to the silicon substrate 10, the potential of the body 50 storing therein data "0" is reduced. The same thing is true for the lines L3 and L4. Namely, in a region in which the back gate voltage is low, the threshold voltage of "0" cell indicated by the line L4 is higher than that indicated by the line L3. In this manner, to raise the threshold voltage difference ΔVth, the source 60 is preferably connected to the silicon substrate 10.

In case of the line L3 indicating the memory cells MCs in each of which the impurity concentration of the back gate BG is high, the threshold voltage of each "1" cell in a region in which the back gate voltage is low does not rise. This is because the surface of the back gate BG becomes difficult to invert. In this manner, to maintain the threshold voltage difference ΔVth, the impurity concentration of the back gate BG is preferably high.

Fourth Embodiment

Figure 37:
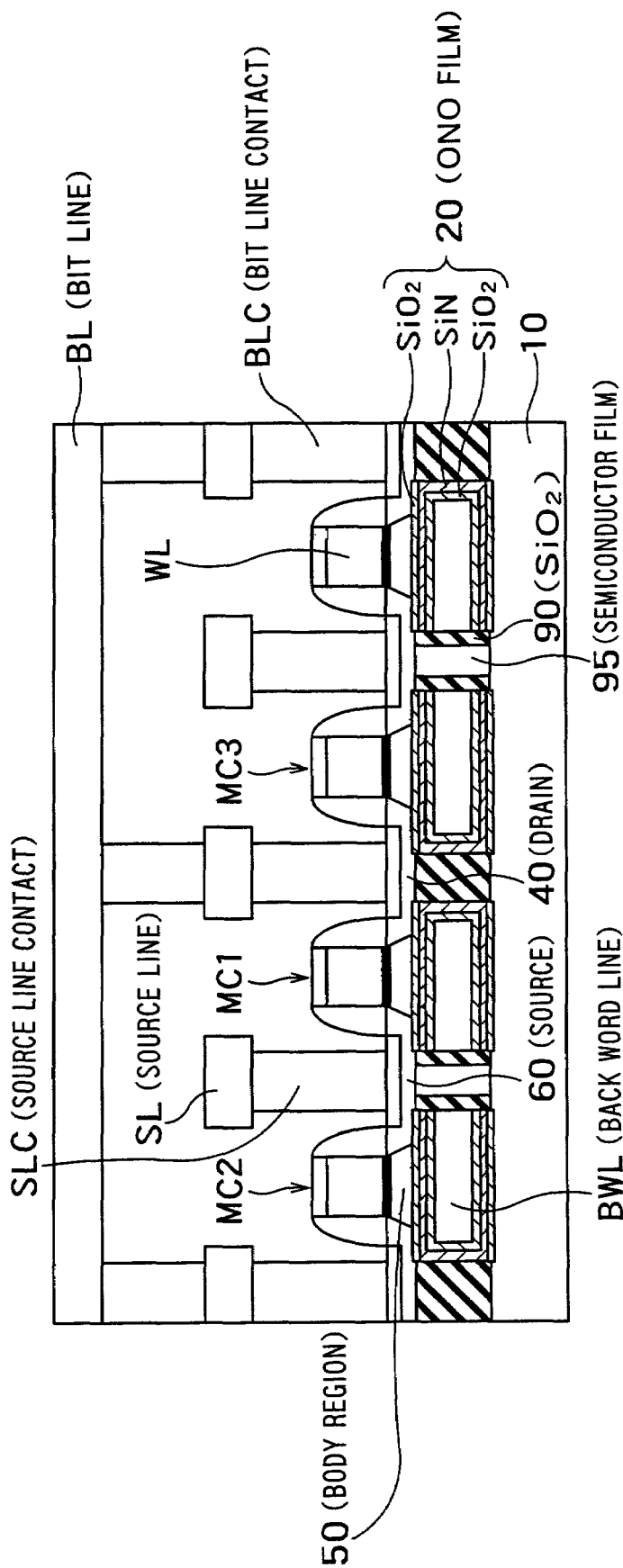
FIG. 37 is a cross-sectional view showing a structure of a memory cell array of an FBC memory device according to a fourth embodiment of the present invention.

FIG. 37 is a cross-sectional view showing a structure of a memory cell array of an FBC memory device according to a fourth embodiment of the present invention. In the fourth embodiment, the source 40 of each memory cell MC is electrically connected to the silicon substrate 10 via a semiconductor film 95. Side surfaces of the semiconductor film 95 are covered with silicon oxide films 90, respectively, and the semiconductor film 95 is thereby isolated from back word lines BWLs. Other configurations of the FBC memory device according to the fourth embodiment can be similar to those according to the second embodiment shown in FIG. 20. In the fourth embodiment, the source 40 of each memory cell MC is connected to the silicon substrate 10 similarly to the third embodiment, and the back word lines BWLs are provided to correspond to the respective front word lines WLs similarly to the second embodiment. The FBC memory device according to the fourth embodiment can, therefore, control the back word lines BWLs independently and increase the threshold voltage difference (signal difference) ΔVth.

Fifth Embodiment

The preceding embodiments have been described while taking planar transistors easy to manufacture as an example. Alternatively, a charge trap film can be used in an FBC memory device using fin-type transistors (each of which includes a side channel and in which current flows in a horizontal direction) or vertical transistors (each of which includes a side channel and in which current flows in a perpendicular direction).

Figure 38:
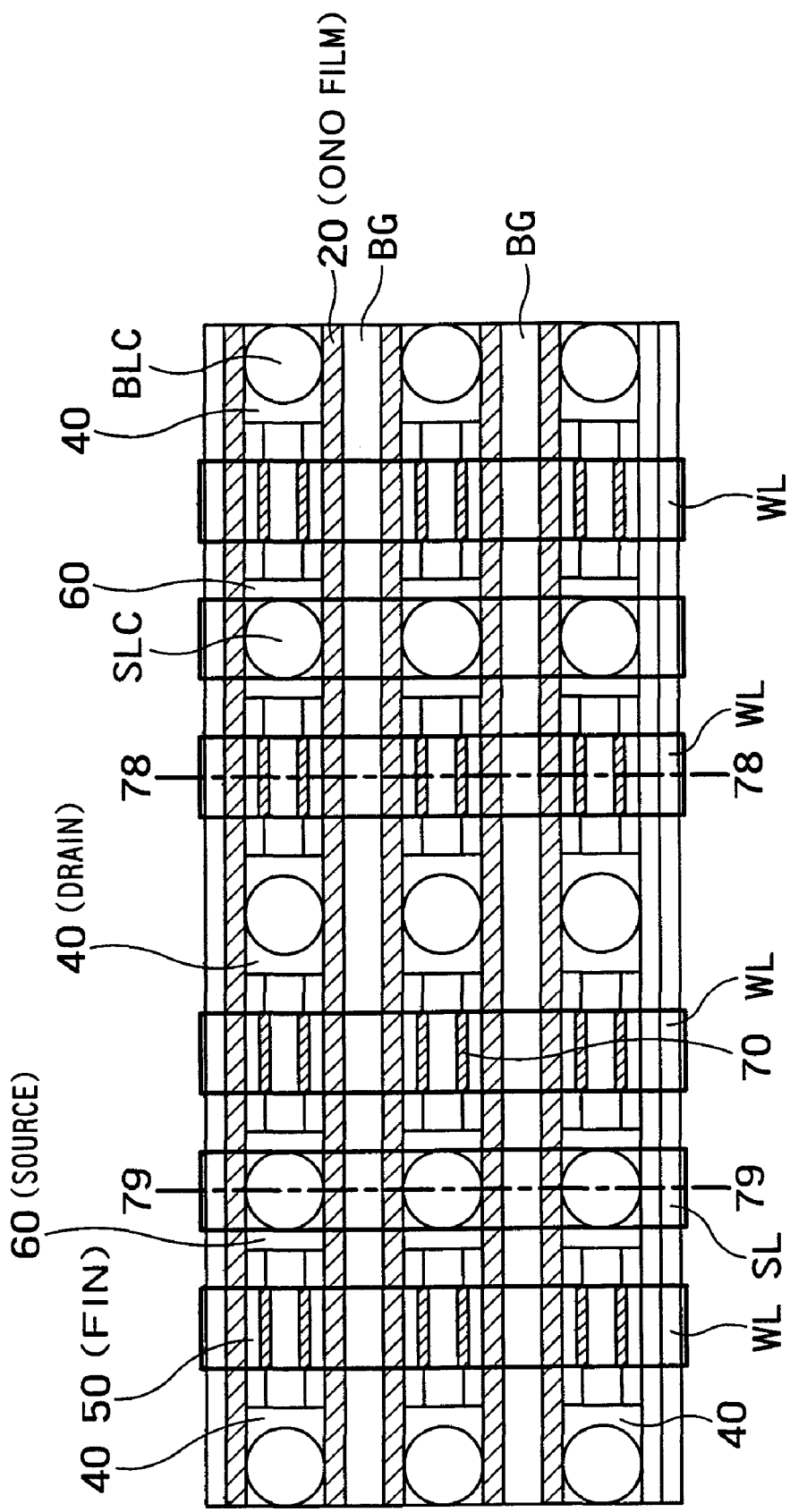
FIG. 38 is a plan view of an FBC memory device using fin-type transistors.
Figure 39:
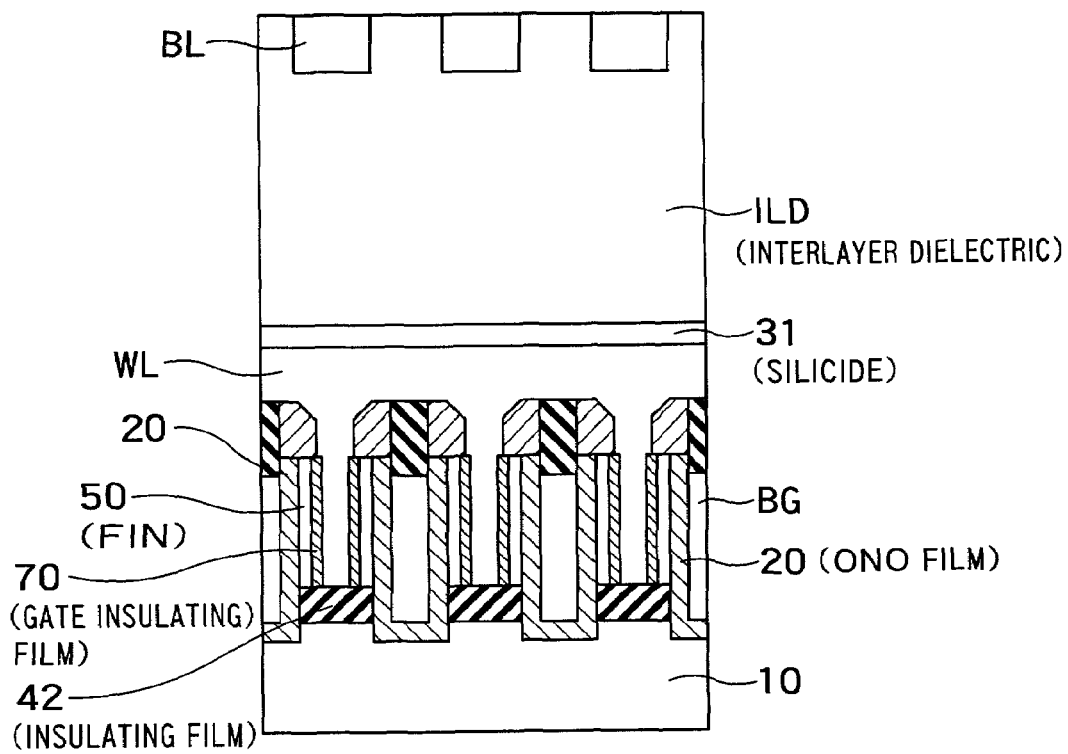
FIGS. 39 and 40 are cross-sectional views taken along lines 38-38 and 39-39 of FIG. 38, respectively.
Figure 40:
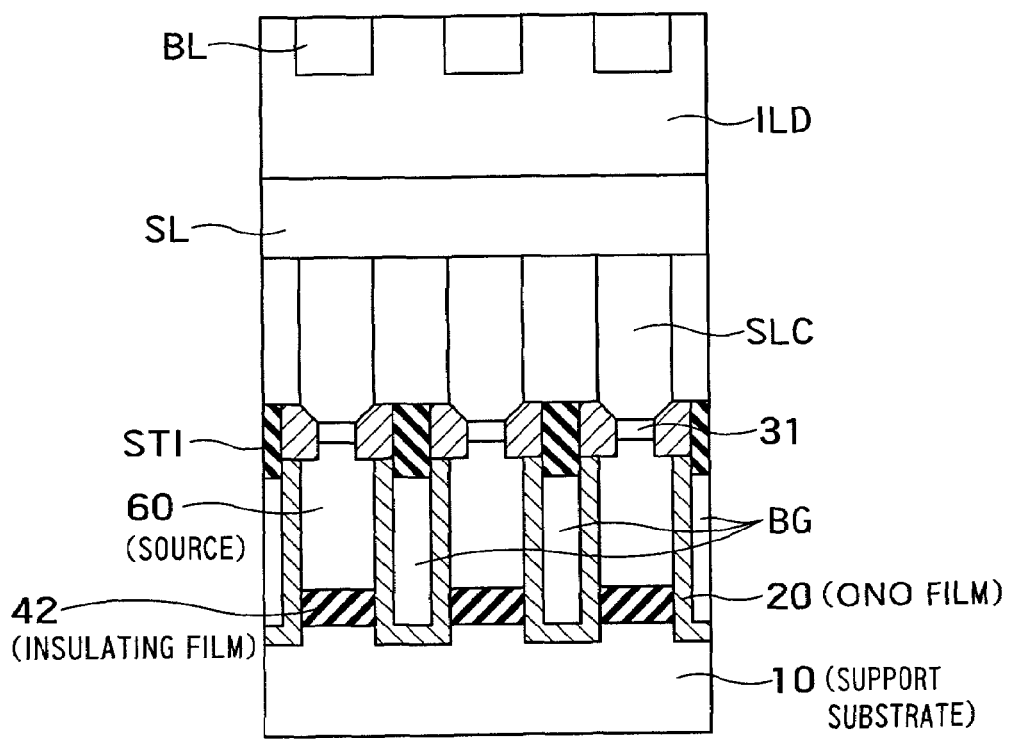

FIG. 38 is a plan view of an FBC memory device using fin-type transistors. FIGS. 39 and 40 are cross-sectional views taken along lines 38-38 and 39-39 of FIG. 38, respectively.

Each of the fin-type transistors includes a semiconductor substrate 10, a fin-type body 50 provided on the semiconductor substrate 10, an ONO film 20 in contact with a first surface of the fin-type body 50 and serving as a charge trap film, a gate insulating film 70 in contact with a second surface of the fin-type body 50, a back gate BG in contact with the ONO film 20, a word line WL in contact with the gate insulating film 70, and a source 60 and a drain 40 formed in the fin-type body 50. The fin-type body 50 is provided between the drain 40 and the source 60 and in an electrically floating state. An insulating film 42 is, for example, a BOX layer on the SOI substrate.

Since the FBC memory device shown in FIG. 38 includes the common back gate BG, the operation described in, for example, the first embodiment can be realized. Needless to say, back gates can be provided to correspond to the respective front word lines or can be provided at intervals of a plurality of front word lines. By so configuring, each of the preceding embodiments can be realized by the fin-type FBCs.

In the fin-type FBC memory device according to the fifth embodiment, charges can be trapped into the ONO film 20 of each memory cell MC by trimming. The fifth embodiment can, therefore, exhibit the same advantages as those of the preceding embodiments.

What is claimed is:

1. A semiconductor memory device comprising:
   a semiconductor layer;
   a charge trap film in contact with a first surface of the semiconductor layer;
   a gate insulating film in contact with a second surface of the semiconductor layer, the second surface being opposite to the first surface;
   a back gate electrode in contact with the charge trap film;
   a gate electrode in contact with the gate insulating film;
   a source and a drain formed in the semiconductor layer; and
   a body region provided between the drain and the source, the body region being in an electrically floating state, wherein
   a threshold voltage or a drain current of a memory cell including the source, the drain, and the gate electrode is adjusted by changing the number of majority carriers accumulated in the body region and the quantity of charges trapped into the charge trap film.

2. The semiconductor memory device according to claim 1, wherein
   the memory cell stores therein data according to the number of majority carriers accumulated in the body region, and
   when the threshold voltage or the drain current of the memory cell is out of a scope of a specification, the charges are trapped into the charge trap film to adjust the threshold voltage or the drain current.

3. The semiconductor memory device according to claim 1, wherein
   the memory cell has a first data state in which the majority carriers are accumulated in the body region and a second data state in which the majority carriers are released from the body region, and the quantity of the charges in the charge trap film of the memory cell in the first data state is equal to that in the second data state.

4. The semiconductor memory device according to claim 1, wherein the charges are held in the charge trap film proximate to a junction between the body region and the source or the charge trap film proximate to a junction between the body region and the drain.

5. The semiconductor memory device according to claim 1, further comprising:
   a plurality of the memory cells;
   a plurality of word lines connected to the gates electrodes of the memory cells;
   a plurality of bit lines connected to the drains of the memory cells; and
   a plurality of source lines connected to the sources of the memory cells, wherein
   a plurality of back gate electrodes are provided to correspond to the plurality of word lines,
   the charges are trapped into the charge trap film by selectively applying a voltage to a certain back gate electrode of the plurality of back gate electrodes.

6. The semiconductor memory device according to claim 5, wherein
   when charges are trapped into the charge trap film of a memory cell connected to a first back gate electrode of the plurality of back gate electrodes and a first bit line of the plurality of bit lines and a first source line of the plurality of source lines, a reference voltage is applied to one of the first source line and the first bit line, a first voltage higher than the reference voltage is applied to other one of the first source line or the first bit line, a second voltage is selectively applied to the first back gate electrode, a polarity of the second voltage being opposite to a polarity of the charges to be trapped.

7. The semiconductor memory device according to claim 1, further comprising:
   a semiconductor substrate provided under the semiconductor layer;
   a plurality of the memory cells;
   a plurality of word lines connected to the gate electrodes of the memory cells;
   a plurality of bit lines connected to the drains of the memory cells;
   a plurality of source lines connected to the sources of the memory cells; and
   a conductor electrically connecting the source to the semiconductor substrate.

8. The semiconductor memory device according to claim 7, wherein
   the conductor is isolated from the back gate electrodes.

9. The semiconductor memory device according to claim 1, wherein
   the charge trap film, the gate insulating film, the gate electrode and the back gate electrode are provided on side surfaces of the body region.

10. The semiconductor memory device according to claim 1, wherein
    the charges are trapped into the charge trap film by applying a voltage to the back gate, the voltage having a reversed polarity with respect to a polarity of the charges to be trapped.

11. The semiconductor memory device according to claim 1, further comprising:
    a semiconductor substrate provided under the semiconductor layer;
    a plurality of the memory cells;
    a plurality of the word lines connected to the gate electrodes of the memory cells;
    a plurality of the bit lines connected to the drains of the memory cells; and
    a plurality of the source lines connected to the sources of the memory cells, wherein
    the semiconductor substrate supplies a common voltage to the back gate electrodes of the memory cells.

12. The semiconductor memory device according to claim 11, wherein electrons are trapped into the charge trap film of a memory cell connected to a first word line of the plurality of word lines and a first bit line of the plurality of bit lines and a first source line of the plurality of source lines by selectively applying a first voltage to the first word line and a second voltage between the first bit line and the first source line.

13. A method of driving a semiconductor memory device comprising a plurality of memory cells, each memory cell including a semiconductor layer; a charge trap film in contact with a first surface of the semiconductor layer; a gate insulating film in contact with a second surface of the semiconductor layer, the second surface being opposite to the first surface; a back gate electrode in contact with the charge trap film; a gate electrode in contact with the gate insulating film; a source and a drain formed in the semiconductor layer; and a body region provided between the drain and the source, the body region being in an electrically floating state, the method comprising:
    trapping charges into the charge trap film of a memory cell by applying a voltage to the back gate electrode so that a signal of data depending on the number of majority carriers in the body is adjusted.

14. The method of driving a semiconductor memory device according to claim 13, further comprising:
    writing first logical data to the memory cell, the first logical data depending on the number of majority carriers in the body;
    reading a first signal of the memory cell storing the first logical data; and
    trapping charges into the charge trap film of the memory cell by applying a voltage to the back gate electrode, when the first signal is out of the scope of the specification.

15. The method of driving a semiconductor memory device according to claim 13, further comprising;
    writing first logical data to the memory cell, the first logical data depending on the number of majority carriers in the body;
    reading a first signal of the memory cell storing the first logical data;
    writing second logical data to the memory cell, when the first signal is in the scope of the specification, the second logical data also depending on the number of majority carriers in the body;
    reading a second signal of the memory cell storing the second logical data;
    trapping charges into the charge trap film of the memory cell by applying a voltage to the back gate electrode, when the second signal is out of the scope of the specification.

16. The method of driving a semiconductor memory device according to claim 13, wherein
    when charges are trapped into the charge trap film,
    a reference voltage is applied to the source or the drain, and the gate electrode are turned into floating states, and
    a polarity of the voltage applied to the back gate electrode is opposite to a polarity of the charges to be trapped.

17. The method of driving a semiconductor memory device according to claim 13, wherein
    when holes are trapped into the charge trap film,
    a reference voltage is applied to one of the source and the drain,
    a voltage higher than the reference voltage is applied to the other one of the source or the drain, and
    a voltage lower than the reference voltage is applied to the back gate electrode.

18. The method of driving a semiconductor memory device according to claim 13, wherein
    when electrons are trapped into the charge trap film,
    a reference voltage is applied to one of the source and the drain, a voltage higher than the reference voltage is applied to the other one of the source or the drain,
    a voltage higher than the reference voltage is applied to the back gate electrode.

19. The method of driving a semiconductor memory device according to claim 13, further comprising:
    trapping electrons into the charge trap film proximate to a junction between the body region and the source of a memory cell;
    writing data to the memory cell, the data depending on the number of majority carriers in the body; and
    reading a signal of the memory cell storing the data by applying reference voltage to the source and a voltage higher than the reference voltage to the drain, and a voltage higher than the reference voltage to the gate electrode.

20. The method of driving a semiconductor memory device according to claim 13, further comprising:
    trapping holes into the charge trap film proximate to a junction between the body region and the drain of a memory cell;
    writing data to the memory cell, the data depending on the number of majority carriers in the body; and
    reading a signal of the memory cell storing the data by applying reference voltage to the source and a voltage higher than the reference voltage to the drain, and a voltage higher than the reference voltage to the gate electrode.

* * * * *